(12) United States Patent
Zeng et al.

(10) Patent No.: US 9,455,412 B2
(45) Date of Patent: Sep. 27, 2016

(54) ORGANIC ELECTROLUMINESCENT MATERIALS AND DEVICES

(71) Applicant: Universal Display Corporation, Ewing, NJ (US)

(72) Inventors: Lichang Zeng, Lawrenceville, NJ (US); Walter Yeager, Yardley, PA (US); Suman Layek, Lawrenceville, NJ (US); Chuanjun Xia, Lawrenceville, NJ (US); Kwang-Ohk Cheon, Holland, PA (US)

(73) Assignee: Universal Display Corporation, Ewing, NJ (US)

(*) Notice: Subject to any disclaimer, the term of this patent is extended or adjusted under 35 U.S.C. 154(b) by 393 days.

(21) Appl. No.: 14/138,948

(22) Filed: Dec. 23, 2013

(65) Prior Publication Data

US 2015/0179948 A1     Jun. 25, 2015

(51) Int. Cl.
*H01L 51/50* (2006.01)
*H01L 51/00* (2006.01)

(52) U.S. Cl.
CPC ....... *H01L 51/0072* (2013.01); *H01L 51/0085* (2013.01); *H01L 51/5016* (2013.01)

(58) Field of Classification Search
None
See application file for complete search history.

(56) References Cited

U.S. PATENT DOCUMENTS 8,828,561 B2 * 9/2014 Kim ............... C09K 11/06
257/40

FOREIGN PATENT DOCUMENTS

CN     1702066 A * 6/2005 .......... C07D 209/86

* cited by examiner

*Primary Examiner* — Gregory Clark
(74) *Attorney, Agent, or Firm* — Duane Morris LLP

(57) ABSTRACT

The present invention relates to novel organic compounds containing oligocarbazoles. The compounds are useful for organic light-emitting diodes. The compounds are also useful for charge-transport and charge-blocking layers, and as hosts in the light-emissive layer for organic light emitting devices (OLEDs).

18 Claims, 4 Drawing Sheets

Formula I-A

Formula I-B

ORGANIC ELECTROLUMINESCENT MATERIALS AND DEVICES

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to novel organic compounds containing oligocarbazoles. Ile compounds are useful for organic light-emitting diodes. The compounds are also useful for charge-transport and charge-blocking layers, and as hosts in the light-emissive layer for organic light emitting devices (OLEDs).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices, in addition, the inherent properties of organic materials, such as their flexibility, may make them well suited for particular applications such as fabrication on a flexible substrate. Examples of organic opto-electronic devices include organic light emitting devices, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting, Several OLED materials and configurations are described in U.S. Pat. Nos. 5,844,363, 6,303,238, and 5,707,745, which are incorporated herein by reference in their entirety.

One application for phosphorescent emissive molecules is a fall color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

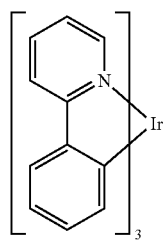

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details, on OLEDs, and the definitions described above, can be found in U.S. Pat. No. 7,279,704, which is incorporated herein by reference in its entirety.

BRIEF SUMMARY OF THE INVENTION

A new class of compounds containing oligocarbazoles is provided.

The present invention provides compounds of having formula I;

A-L-B            (I).

In the compound of formula I, A has the formula:

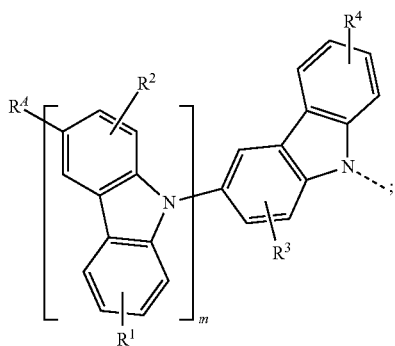

B is selected from the group consisting of

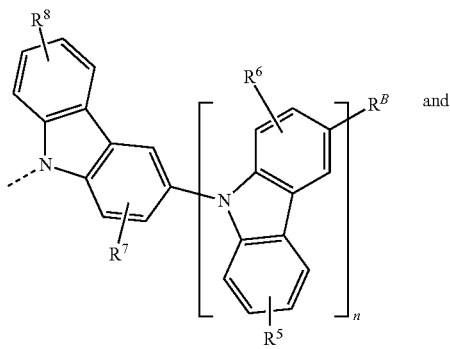

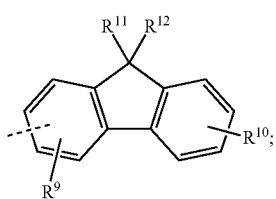

L is a phenyl, which is optionally substituted with 1, 2, 3, or 4 deuterium; $R^1$, $R^4$, $R^5$, $R^8$, and $R^{10}$ each independently represent mono, di, tri, tetra substitutions, or no substitution; $R^2$, $R^3$, $R^6$, $R^7$, and $R^9$ each independently represent mono, di, tri substitutions, or no substitution; $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof; $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; $R^A$ and $R^B$ are each independently selected from the group consisting of hydrogen, deuterium, aryl, and combinations thereof; $R^{11}$ and $R^{12}$ are optionally joined to form a ring; m is an integer selected from 1 to 10; n is an integer selected from 0 to 9; and if B is formula (III), then m is greater than n.

In some embodiments, $R^1$, $R^2$, $R^3$, $R^4$, $R^5$, $R^6$, $R^7$, $R^8$, $R^9$, and $R^{10}$ are each independently selected from the group consisting of hydrogen, deuterium, aryl, and combinations thereof.

In some embodiments, $R^1$, $R^2$, $R^3$, $R^4$, $R^5$, $R^6$, $R^7$, $R^8$, $R^9$, and $R^{10}$ are each independently selected from the group consisting of hydrogen, deuterium, phenyl, and combinations thereof.

In some embodiments, $R^A$ and $R^B$ are hydrogen.

In some embodiments, $R^1$, $R^2$, $R^3$, $R^4$, $R^5$, $R^6$, $R^7$, $R^8$, $R^9$, and $R^{10}$ are hydrogen.

In some embodiments, $R^{11}$ and $R^{12}$ are alkyl.

In some embodiments, m is 1 and n is 0.

In some embodiments, m is 2, and n is 0 or 1.

In some embodiments, B is:

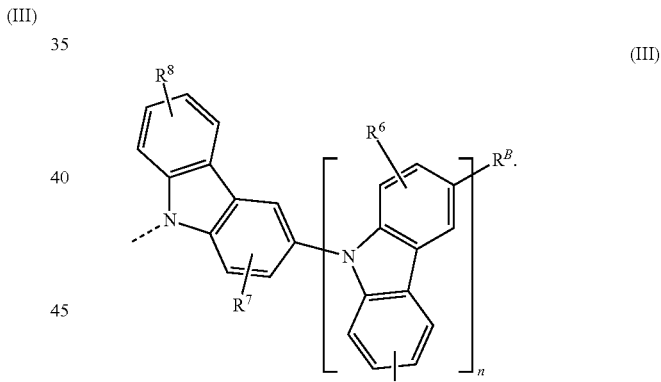

In some embodiments, B is:

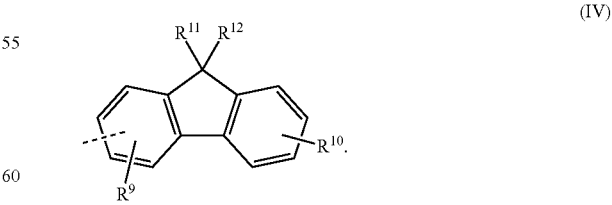

In some embodiments, A is in the 1-position and B is in the 4-position of the phenyl ring.

In some embodiments, A is in the 1-position and B is in the 3-position of the phenyl ring.

In some embodiments, A is selected from the group consisting of:
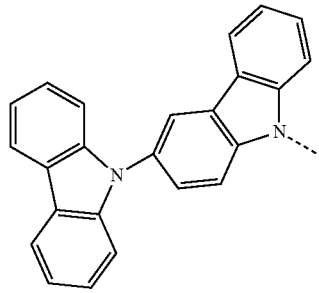
A1
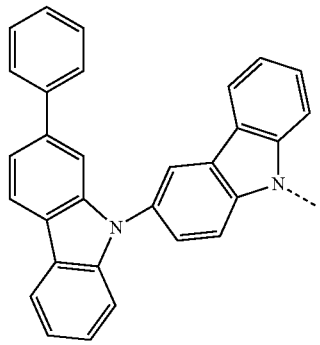
A5
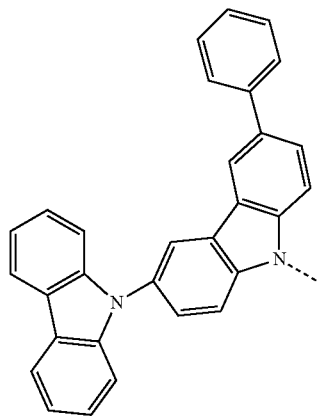
A2
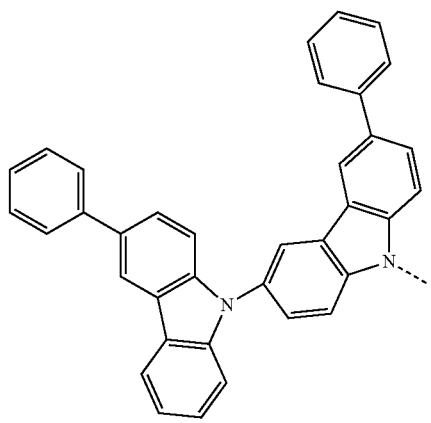
A6
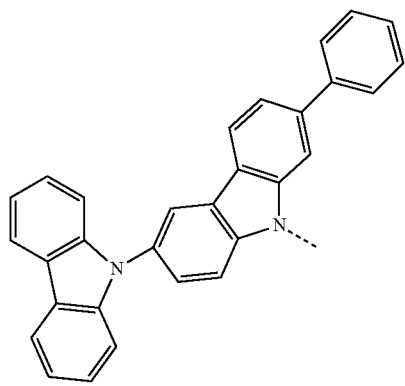
A3
A7
A4
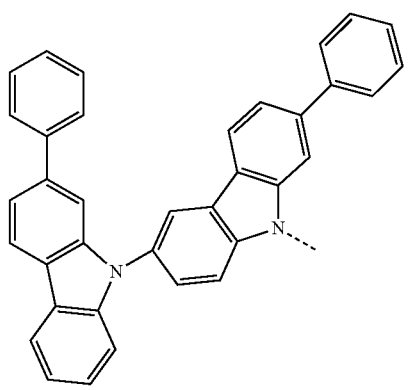
A8

-continued
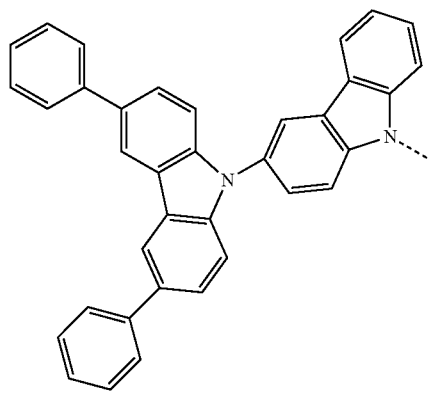
A9
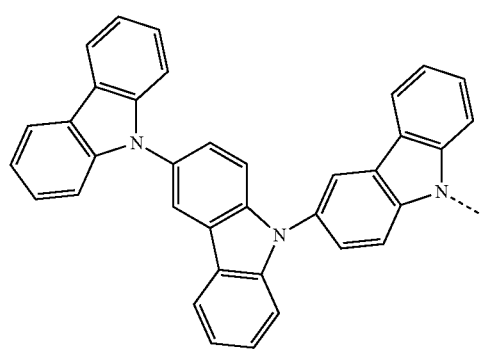
A10
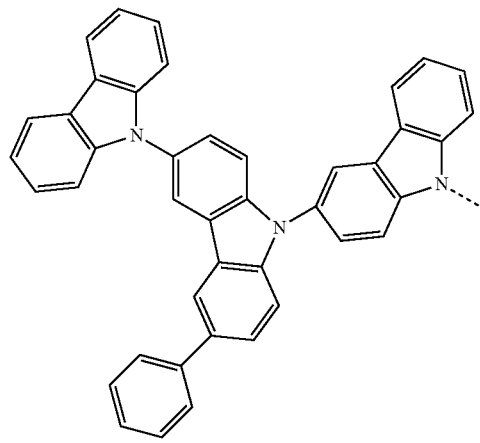
A11
and
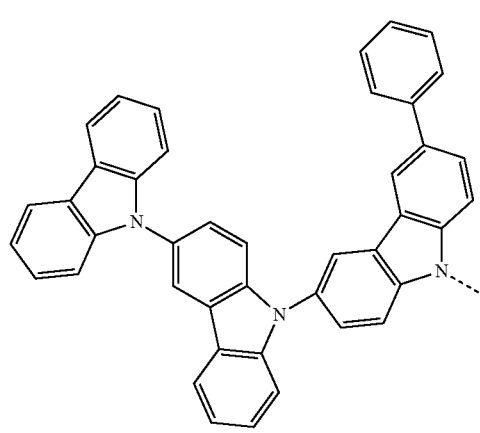
A12
In some embodiments, L is selected from the group consisting of
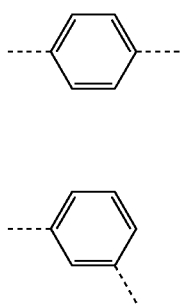
L1
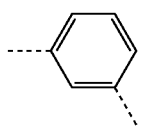
L2
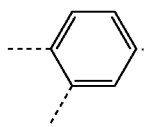
L3
In some embodiments, B is selected from the group consisting of
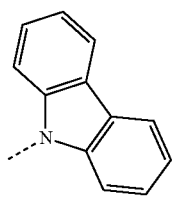
B1
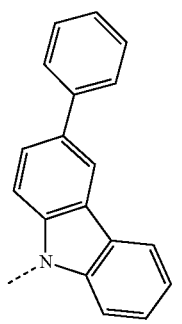
B2
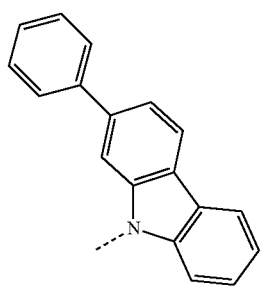
B3

-continued
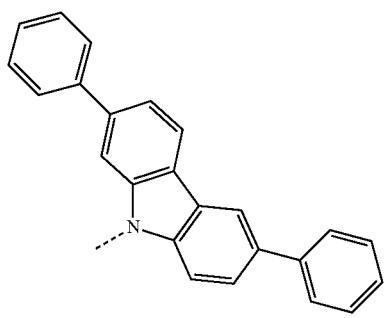
B4
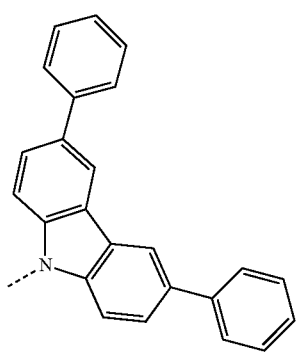
B5
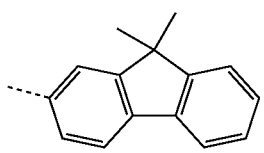
B6
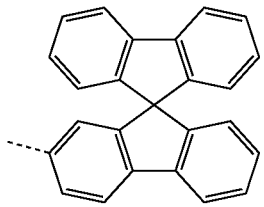
B7
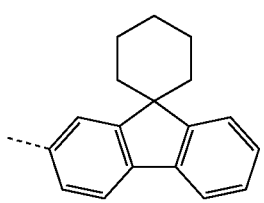
B8
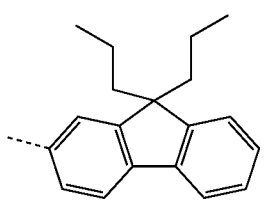
B9
-continued
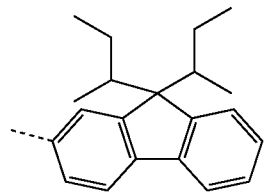
B10
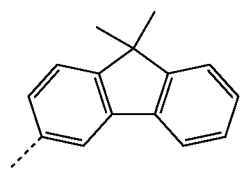
B11
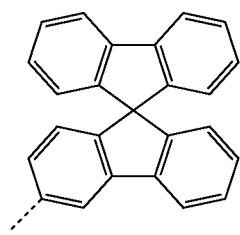
B12
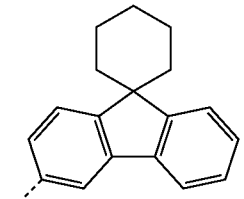
B13
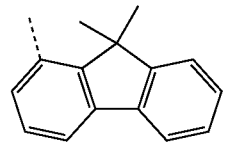
B14
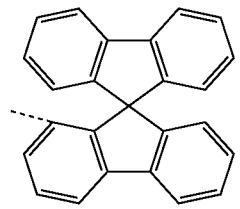
B15
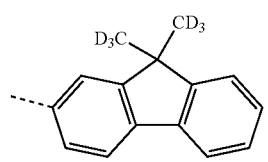
B16

B17
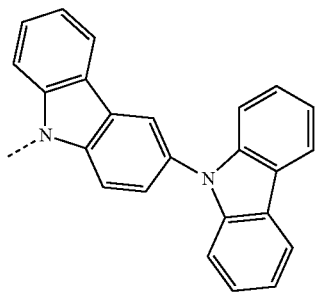

B18
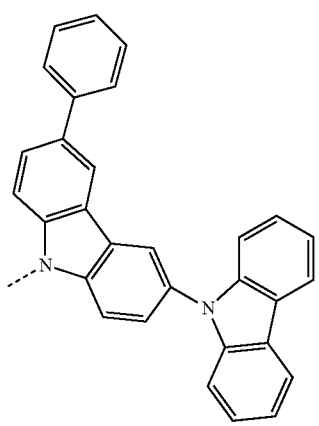

B19
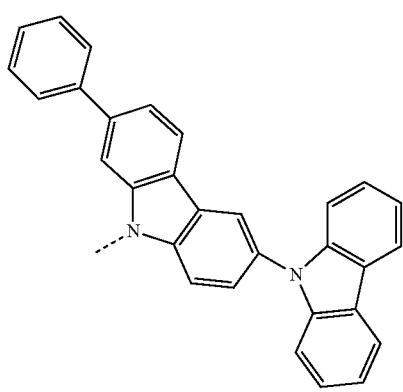

B20
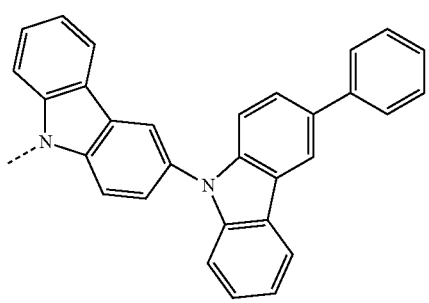

B21
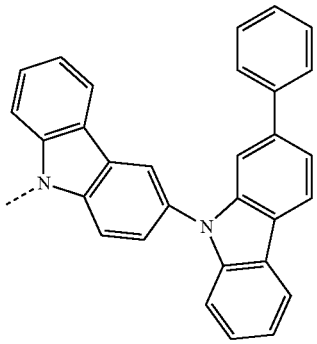

B22
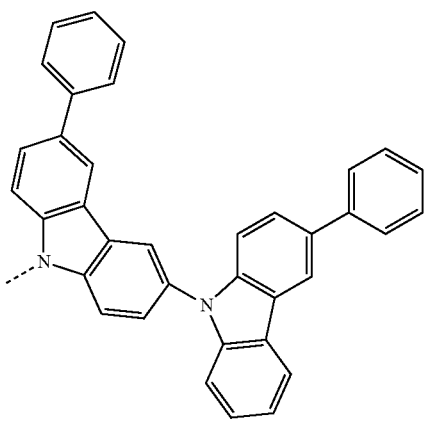

and

B23
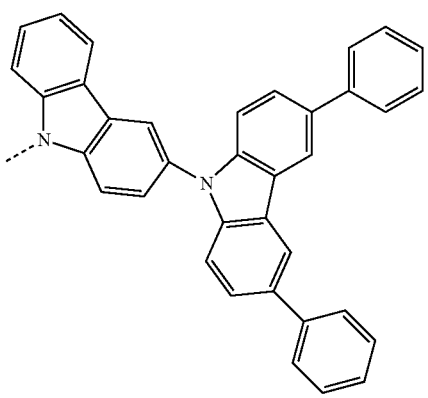

In some embodiments, A is A1, L is L1 or L2, and B is B1.

In some embodiments, the compound is selected from the group consisting of Comp 1 to Comp 639 listed in TABLE 1.

In some embodiments, the compound is selected from the group listed in TABLE 2.

In some embodiments a first device is provided. The first device comprises an anode, a cathode, and an organic layer, disposed between the anode and the cathode, comprising a compound having the formula:

A-L-B                    (I).

In the compound of formula I, A has the formula:

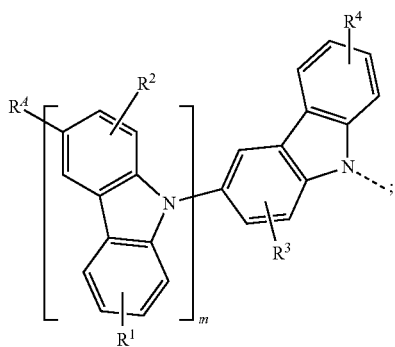

(II)

B is selected from the group consisting of:

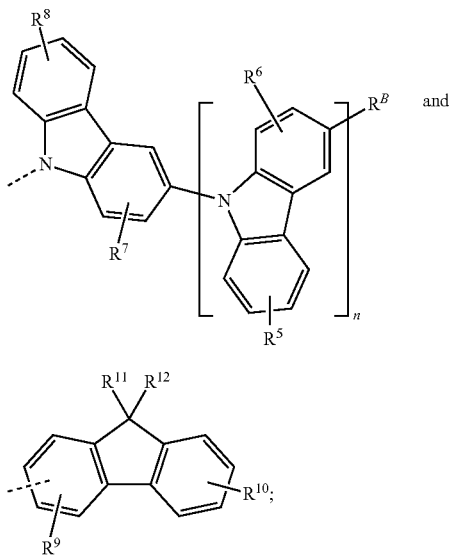

(III)

(IV)

L is a phenyl, which is optionally substituted with 1, 2, 3, or 4 deuterium; $R^1$, $R^4$, $R^5$, $R^8$, and $R^{10}$ each independently represent mono, di, tri, tetra substitutions, or no substitution; $R^2$, $R^3$, $R^6$, $R^7$, and $R^9$ each independently represent mono, di, tri substitutions, or no substitution; $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof; $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; $R^A$ and $R^B$ are each independently selected from the group consisting of hydrogen, deuterium, aryl, and combinations thereof; $R^{11}$ and $R^{12}$ are optionally joined to form a ring; m is an integer selected from 1 to 10; n is an integer selected from 0 to 9; and if B is formula (IL), then m is greater than n.

In some embodiments, the organic layer of the device is an emissive layer and the compound of formula I is a host.

In some embodiments, the organic layer of the device further comprises a phosphorescent emissive dopant.

In some embodiments, the phosphorescent emissive dopant of the device is a transition metal complex having at least one ligand, or part of the ligand if the ligand is more than bidentate, selected from the group consisting of:

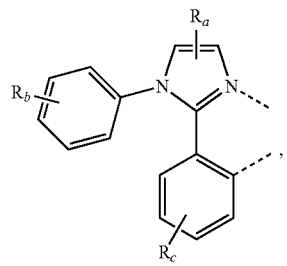

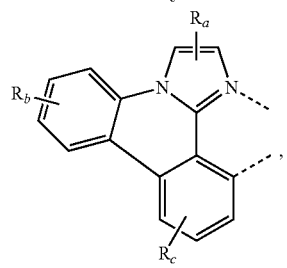

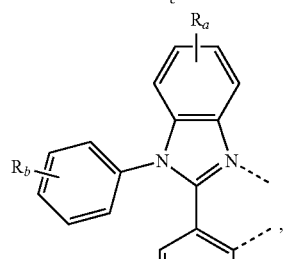

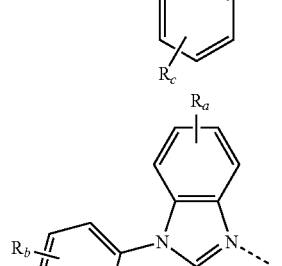

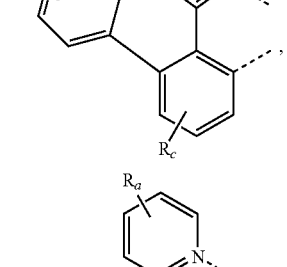

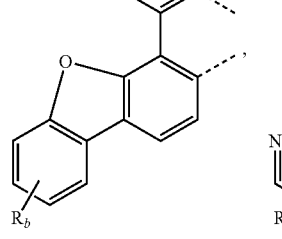

-continued

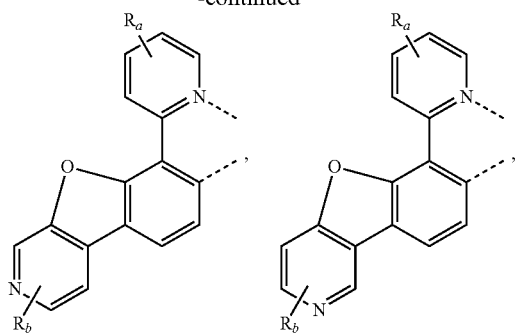

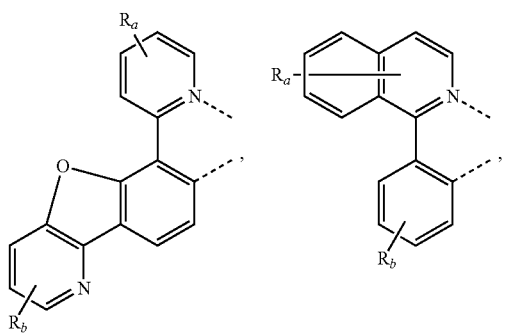

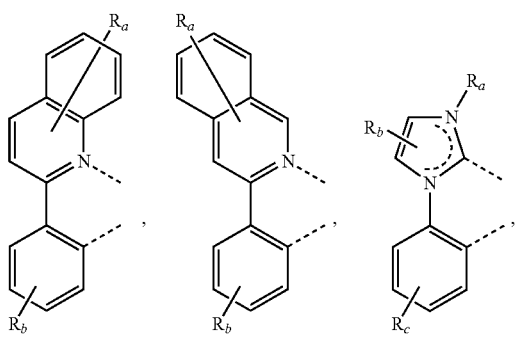

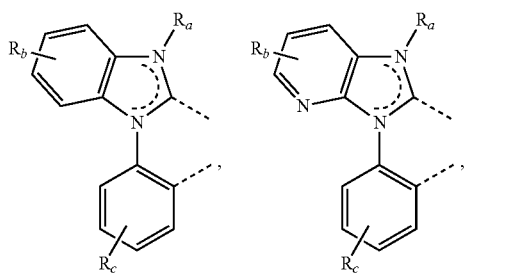

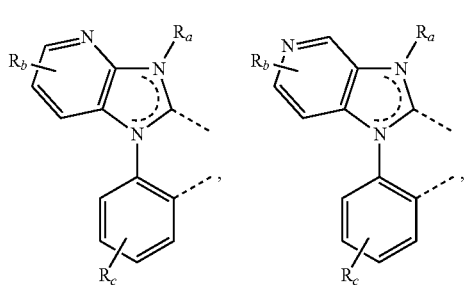

-continued

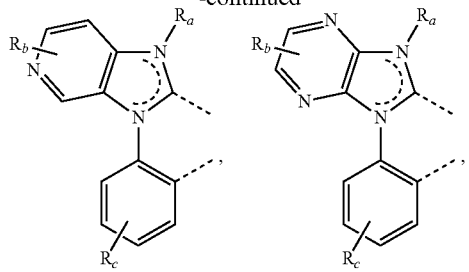

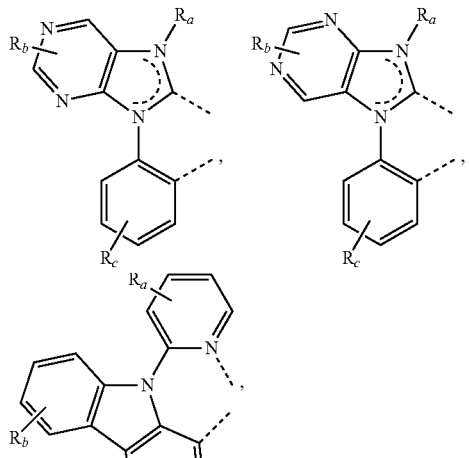

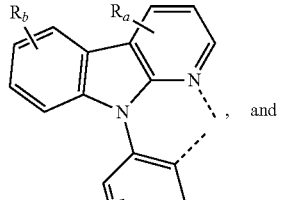

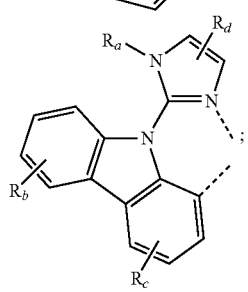

wherein $R_a$, $R_b$, $R_c$, and $R_d$ may represent mono, di, tri, or tetra substitution, or no substitution; and wherein $R_a$, $R_b$, $R_c$, and $R_d$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

In some embodiments, the organic layer of the device is a blocking layer and the compound is a blocking material in the organic layer.

In some embodiments, the device is a consumer product.

In some embodiments, the device is an organic light-emitting device.

In some embodiments, the device comprises a lighting panel.

In some embodiments, B is

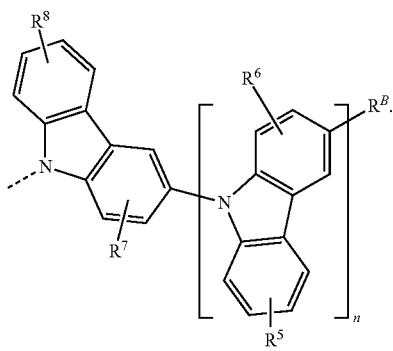

(III)

In some embodiments, B is

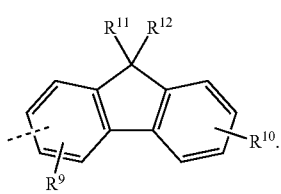

(IV)

In some embodiments, A is in the 1-position and B is in the 4-position of the phenyl ring.

In some embodiments, A is in the 1-position and B is in the 3-position of the phenyl ring.

In some embodiments, the compound of formula I is selected from the group consisting of

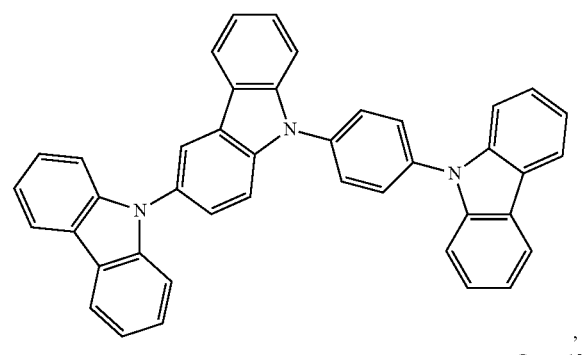

Comp 1

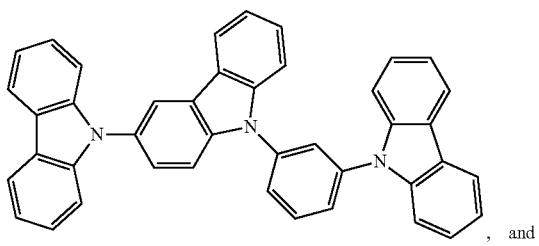

Comp 13

, and

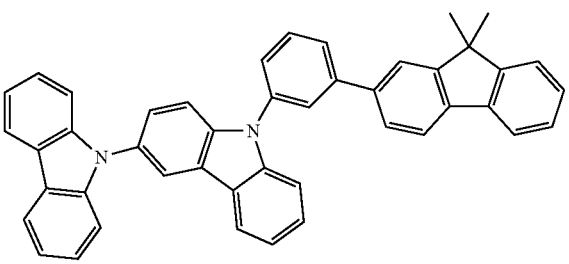

Comp 193

In some embodiments, a formulation is provided. The formulation comprises a compound having formula (I).

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
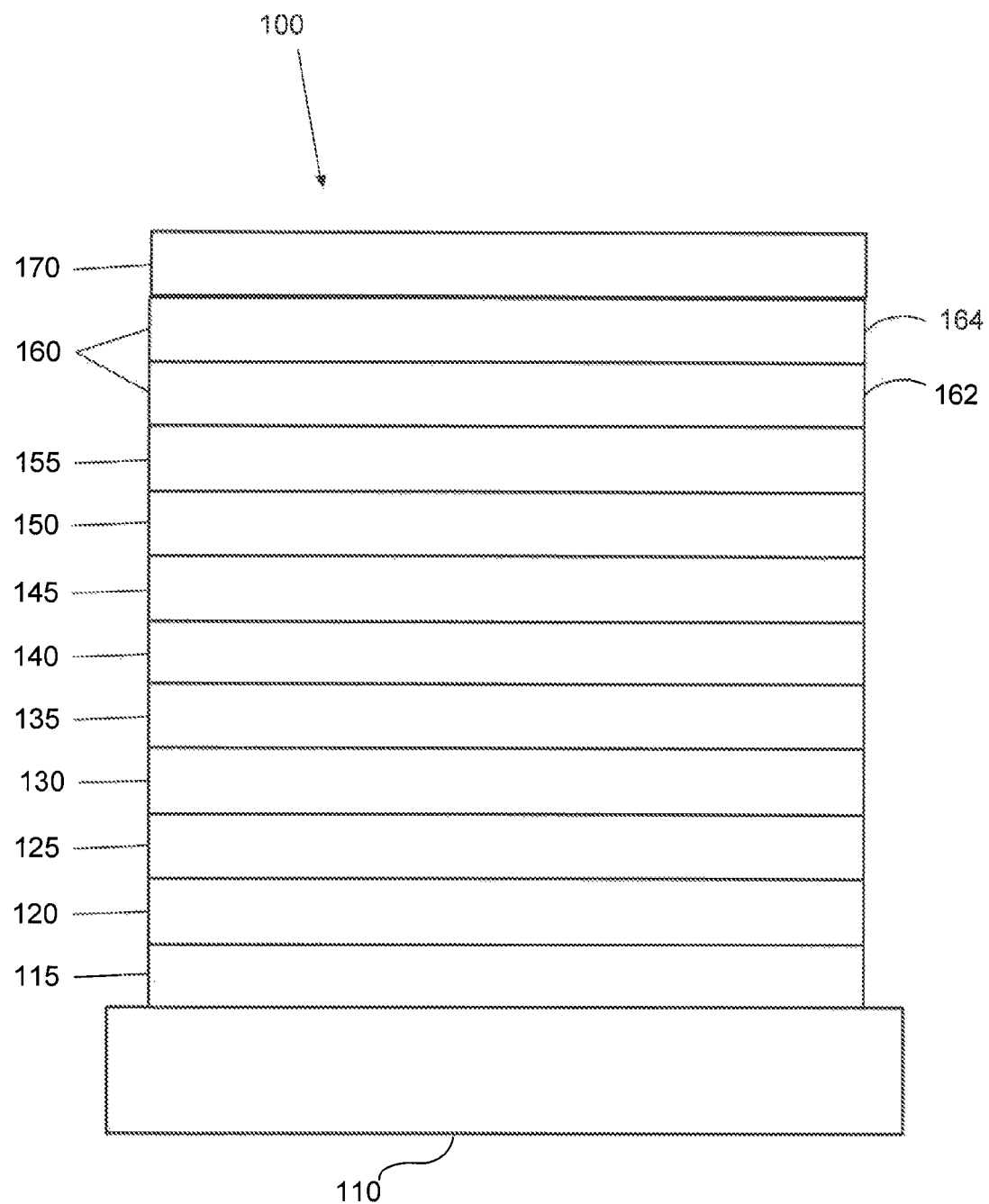
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
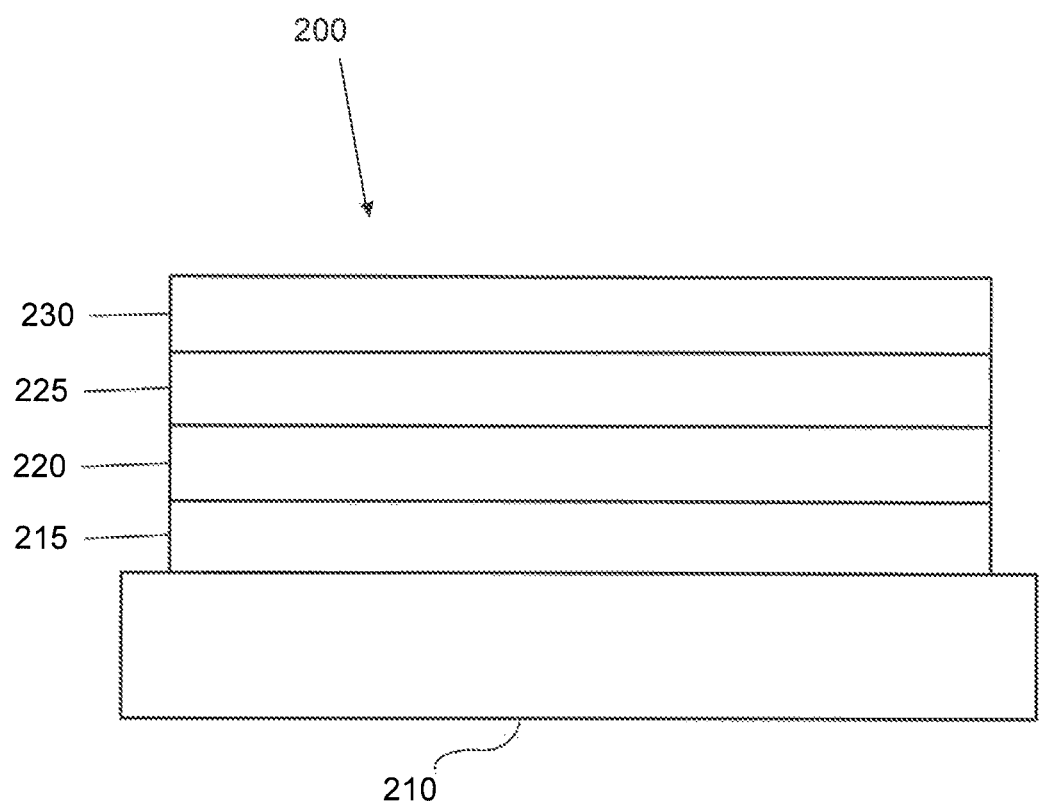
FIG. 2 shows an inverted organic light emitting device that does not have a separate electron transport layer.
Figure 3:
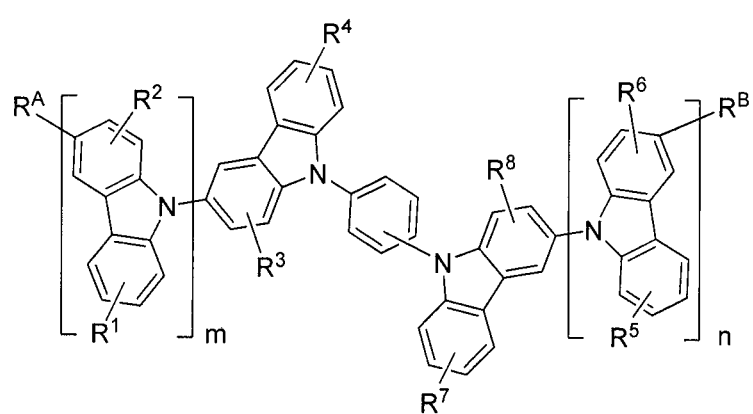
FIG. 3 shows a compound of Formula I-A.
Figure 4:
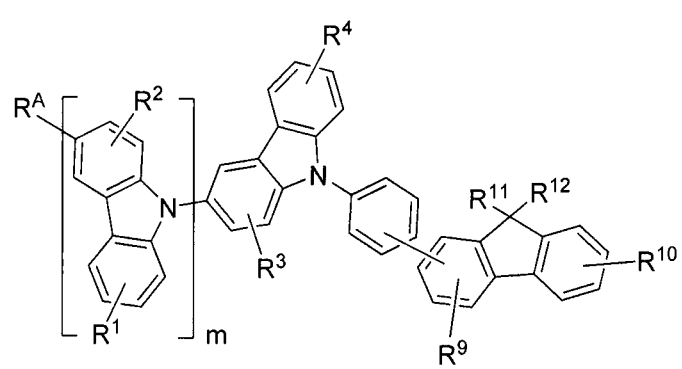
FIG. 4 shows a compound of Formula I-B.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In some embodiments, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degrees C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkyl groups are those containing two to fifteen carbon atoms. Additionally, the alkynyl group may be optionally substituted.

The terms "aralkyl" or "arylalkyl" as used herein contemplates an alkyl group that has as a substituent an aromatic group. Additionally, the aralkyl group may be optionally substituted.

The term "heterocyclic group" as used herein contemplates non-aromatic cyclic radicals. Preferred heterocyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common by two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

As used herein, the term "substituted" indicates that a substituent other than hydrogen is bonded to the relevant carbon or nitrogen atom. Thus, where $R^1$ is mono-substituted, then one $R^1$ must be other than hydrogen. Similarly, where $R^1$ is di-substituted, then two of $R^1$ must be other than hydrogen. Similarly, where $R^1$ "represents no substitution," $R^1$ is hydrogen for all available positions.

A wide variety of carbazole-containing compounds have been developed as organic electroluminescent materials. Depending on the unique ways building blocks are connected, these compounds have different energy levels, molecular packing, and charge-transport properties, all of which heavily influence device performance. This invention discloses a new class of asymmetric compounds where two oligomers are connected through a phenyl linkage. Unexpectedly, phosphorescent OLED devices using the compounds of the invention as host materials demonstrate superior stability compared to the compounds reported in the literature.

In some embodiments, a compound having the formula:

$$A\text{-}L\text{-}B \tag{I}$$

is provided. In the compound of formula I, A is

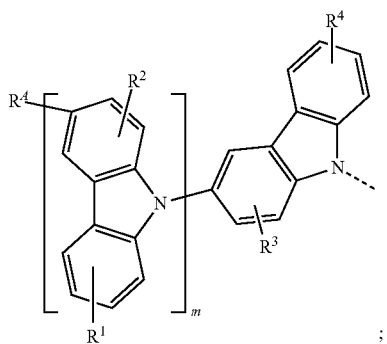
(II)

B is selected from the group consisting of

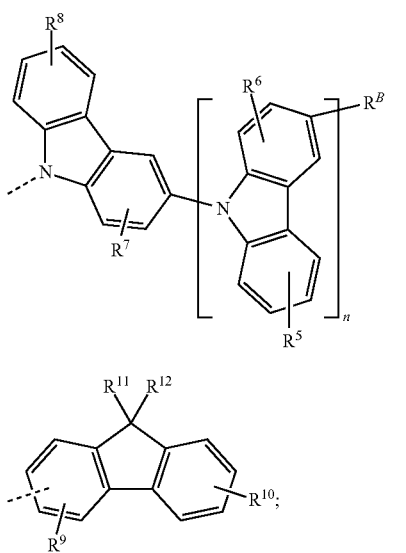
(III)
and
(IV)

L is a phenyl, which is optionally substituted with 1, 2, 3, or 4 deuterium;

$R^1$, $R^4$, $R^5$, $R^8$, and $R^{10}$ each independently represent mono, di, tri, tetra substitutions, or no substitution;

$R^2$, $R^3$, $R^6$, $R^7$, and $R^9$ each independently represent mono, di, tri substitutions, or no substitution;

$R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof;

$R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

$R^A$ and $R^B$ are each independently selected from the group consisting of hydrogen, deuterium, aryl, and combinations thereof;

$R^{11}$ and $R^{12}$ are optionally joined to form a ring;

m is an integer selected from 1 to 10;

n is an integer selected from 0 to 9; and if B is formula (III), then m is greater than n.

In some embodiments, A is in the 1-position and B is in the 4-position of the phenyl ring. In some embodiments, A is in the 1-position and B is in the 3-position of the phenyl ring.

In some embodiments, A is selected from the group consisting of:

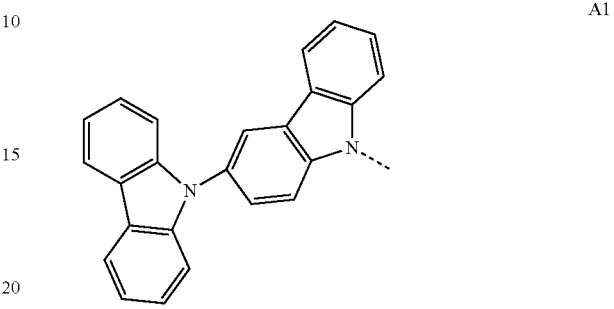
A1

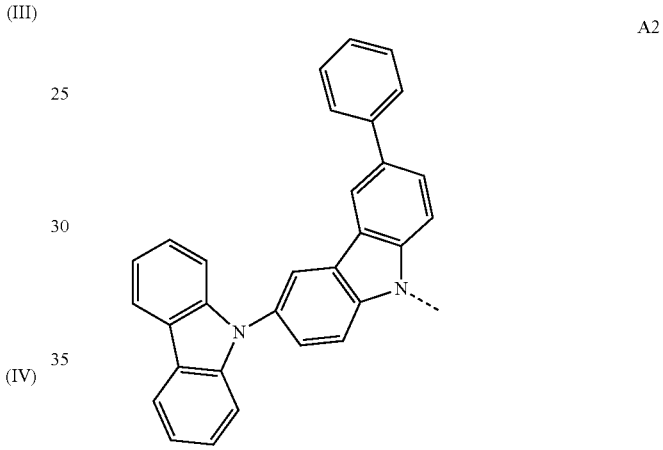
A2

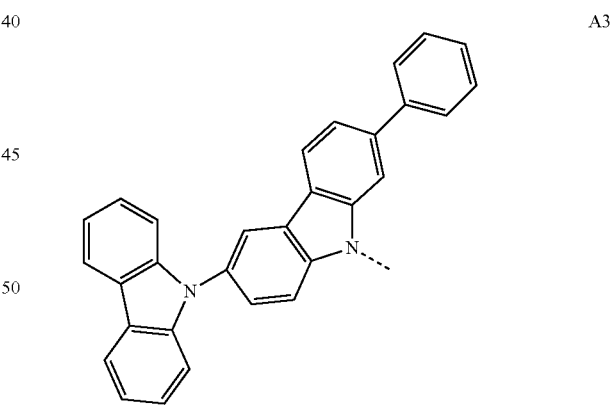
A3

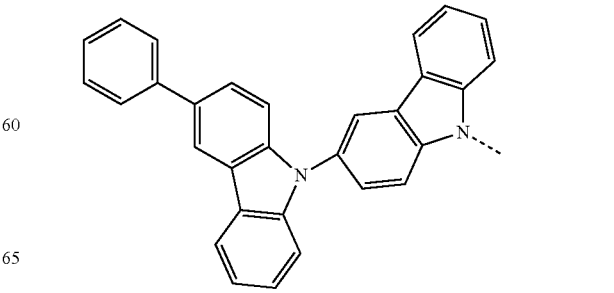
A4

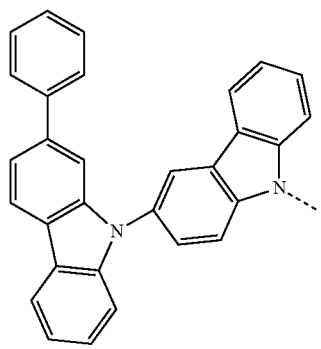
A5
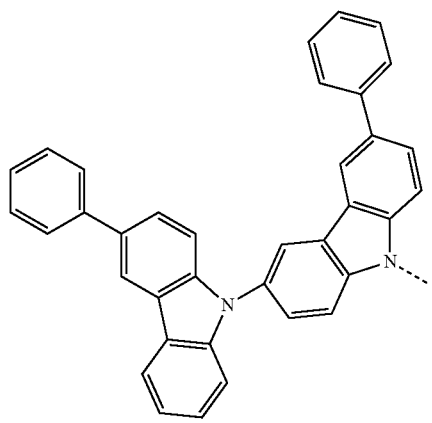
A6
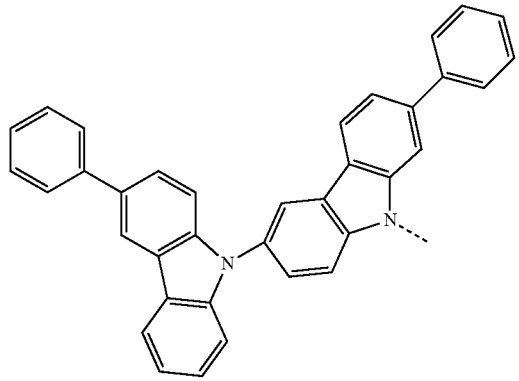
A7
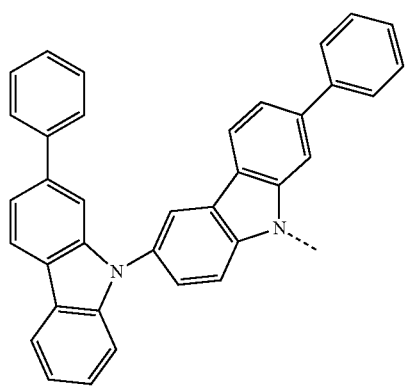
A8
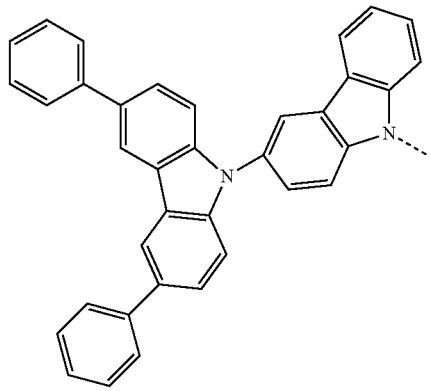
A9
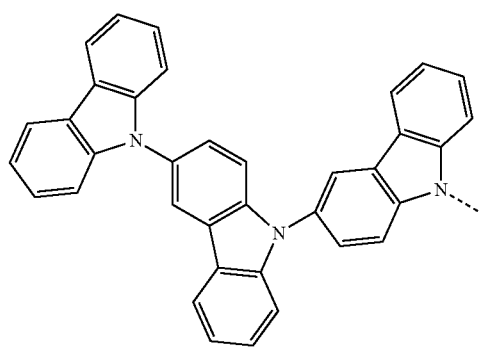
A10
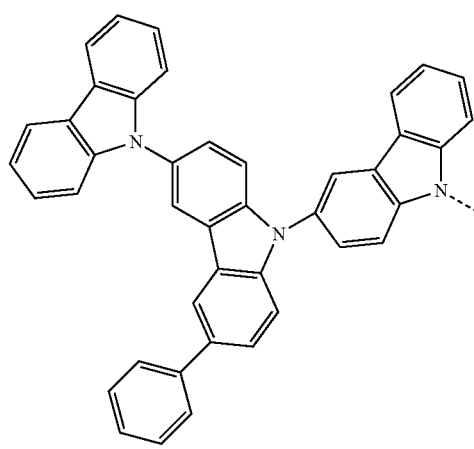
A11
and
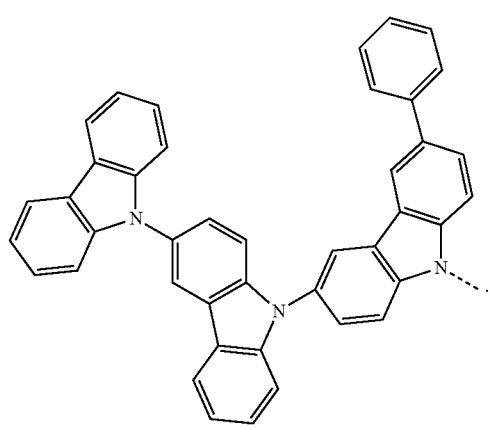
A12

In some embodiments, L is selected from the group consisting of
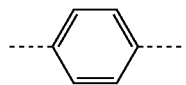
L1
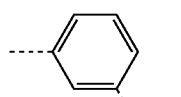
L2
and
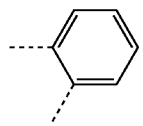
L3
.
In some embodiments, B is selected from the group consisting of
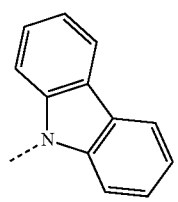
B1
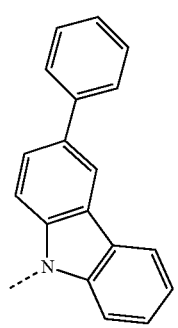
B2
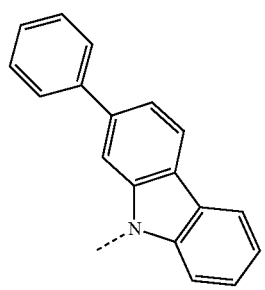
B3
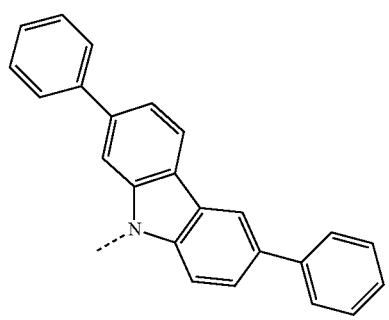
B4
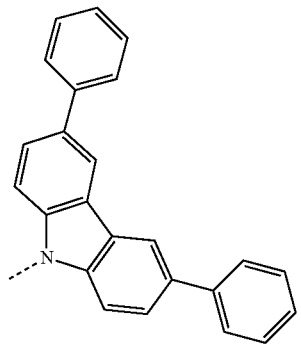
B5
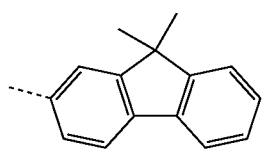
B6
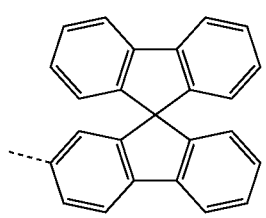
B7

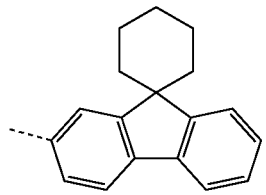 B7
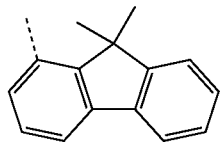 B8
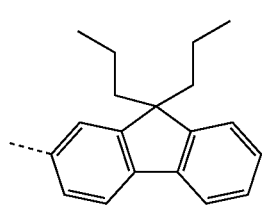 B9
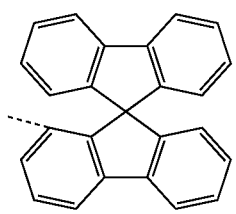 B9
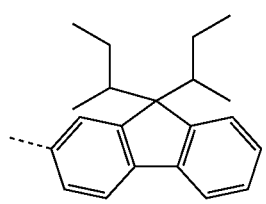 B10
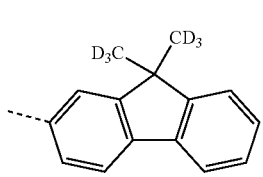 B15
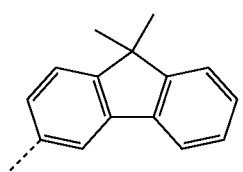 B11
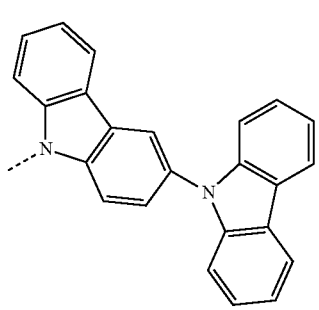 B16
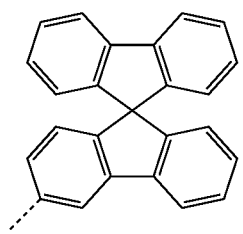 B12
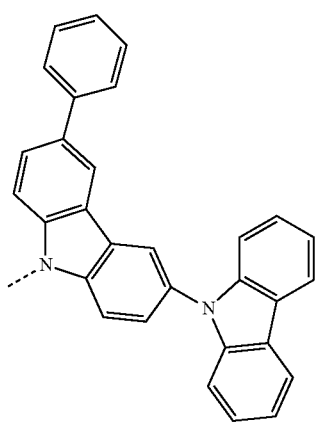 B17
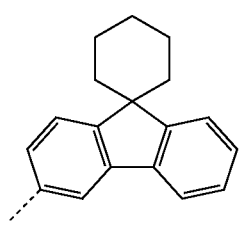 B13
B18

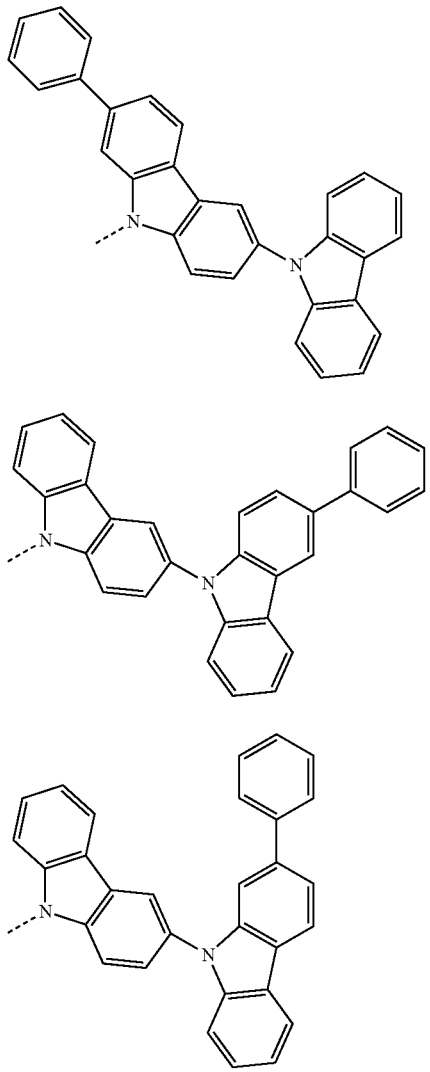

B19

B20

B21

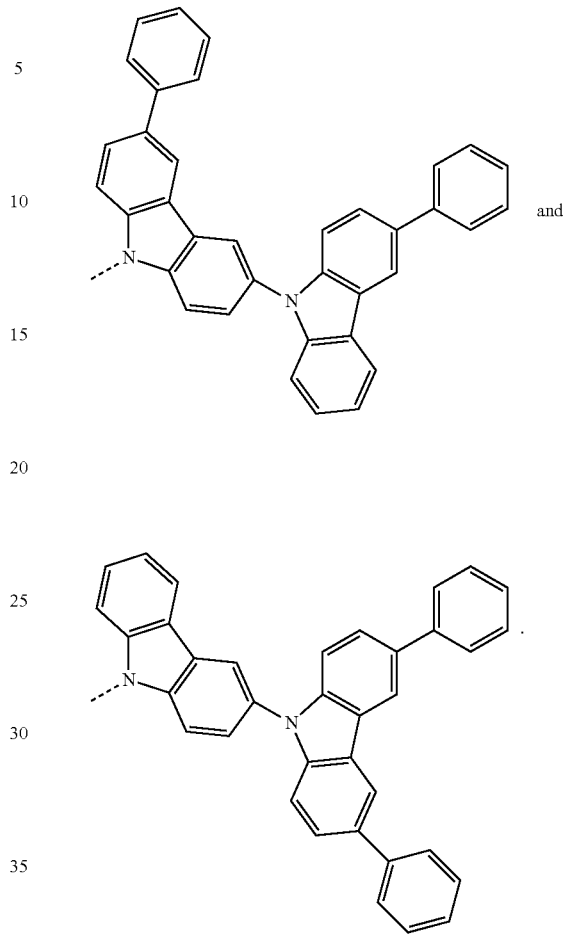

B22 and

B23

In some embodiments, A is A1, L is L1 or L2, and B is B1.

In some embodiments, the compound is selected from the group consisting of Comp 1 to Comp 639 listed below in TABLE 1.

TABLE 1

| ID | A | L | B | ID | A | L | B | ID | A | L | B |
|---|---|---|---|---|---|---|---|---|---|---|---|
| Comp 1 | A1 | L1 | B1 | Comp 2 | A2 | L1 | B1 | Comp 3 | A3 | L1 | B1 |
| Comp 4 | A4 | L1 | B1 | Comp 5 | A5 | L1 | B1 | Comp 6 | A6 | L1 | B1 |
| Comp 7 | A7 | L1 | B1 | Comp 8 | A8 | L1 | B1 | Comp 9 | A9 | L1 | B1 |
| Comp 10 | A10 | L1 | B1 | Comp 11 | A11 | L1 | B1 | Comp 12 | A12 | L1 | B1 |
| Comp 13 | A1 | L2 | B1 | Comp 14 | A2 | L2 | B1 | Comp 15 | A3 | L2 | B1 |
| Comp 16 | A4 | L2 | B1 | Comp 17 | A5 | L2 | B1 | Comp 18 | A6 | L2 | B1 |
| Comp 19 | A7 | L2 | B1 | Comp 20 | A8 | L2 | B1 | Comp 21 | A9 | L2 | B1 |
| Comp 22 | A10 | L2 | B1 | Comp 23 | A11 | L2 | B1 | Comp 24 | A12 | L2 | B1 |
| Comp 25 | A1 | L3 | B1 | Comp 26 | A2 | L3 | B1 | Comp 27 | A3 | L3 | B1 |
| Comp 28 | A4 | L3 | B1 | Comp 29 | A5 | L3 | B1 | Comp 30 | A6 | L3 | B1 |
| Comp 31 | A7 | L3 | B1 | Comp 32 | A8 | L3 | B1 | Comp 33 | A9 | L3 | B1 |
| Comp 34 | A10 | L3 | B1 | Comp 35 | A11 | L3 | B1 | Comp 36 | A12 | L3 | B1 |
| Comp 37 | A1 | L1 | B2 | Comp 38 | A2 | L1 | B2 | Comp 39 | A3 | L1 | B2 |
| Comp 40 | A4 | L1 | B2 | Comp 41 | A5 | L1 | B2 | Comp 42 | A6 | L1 | B2 |
| Comp 43 | A7 | L1 | B2 | Comp 44 | A8 | L1 | B2 | Comp 45 | A9 | L1 | B2 |
| Comp 46 | A10 | L1 | B2 | Comp 47 | A11 | L1 | B2 | Comp 48 | A12 | L1 | B2 |
| Comp 49 | A1 | L2 | B2 | Comp 50 | A2 | L2 | B2 | Comp 51 | A3 | L2 | B2 |
| Comp 52 | A4 | L2 | B2 | Comp 53 | A5 | L2 | B2 | Comp 54 | A6 | L2 | B2 |
| Comp 55 | A7 | L2 | B2 | Comp 56 | A8 | L2 | B2 | Comp 57 | A9 | L2 | B2 |
| Comp 58 | A10 | L2 | B2 | Comp 59 | A11 | L2 | B2 | Comp 60 | A12 | L2 | B2 |
| Comp 61 | A1 | L3 | B2 | Comp 62 | A2 | L3 | B2 | Comp 63 | A3 | L3 | B2 |
| Comp 64 | A4 | L3 | B2 | Comp 65 | A5 | L3 | B2 | Comp 66 | A6 | L3 | B2 |
| Comp 67 | A7 | L3 | B2 | Comp 68 | A8 | L3 | B2 | Comp 69 | A9 | L3 | B2 |

TABLE 1-continued

| ID | A | L | B | ID | A | L | B | ID | A | L | B |
|---|---|---|---|---|---|---|---|---|---|---|---|
| Comp 70 | A10 | L3 | B2 | Comp 71 | A11 | L3 | B2 | Comp 72 | A12 | L3 | B2 |
| Comp 73 | A1 | L1 | B3 | Comp 74 | A2 | L1 | B3 | Comp 75 | A3 | L1 | B3 |
| Comp 76 | A4 | L1 | B3 | Comp 77 | A5 | L1 | B3 | Comp 78 | A6 | L1 | B3 |
| Comp 79 | A7 | L1 | B3 | Comp 80 | A8 | L1 | B3 | Comp 81 | A9 | L1 | B3 |
| Comp 82 | A10 | L1 | B3 | Comp 83 | A11 | L1 | B3 | Comp 84 | A12 | L1 | B3 |
| Comp 85 | A1 | L2 | B3 | Comp 86 | A2 | L2 | B3 | Comp 87 | A3 | L2 | B3 |
| Comp 88 | A4 | L2 | B3 | Comp 89 | A5 | L2 | B3 | Comp 90 | A6 | L2 | B3 |
| Comp 91 | A7 | L2 | B3 | Comp 92 | A8 | L2 | B3 | Comp 93 | A9 | L2 | B3 |
| Comp 94 | A10 | L2 | B3 | Comp 95 | A11 | L2 | B3 | Comp 96 | A12 | L2 | B3 |
| Comp 97 | A1 | L3 | B3 | Comp 98 | A2 | L3 | B3 | Comp 99 | A3 | L3 | B3 |
| Comp 100 | A4 | L3 | B3 | Comp 101 | A5 | L3 | B3 | Comp 102 | A6 | L3 | B3 |
| Comp 103 | A7 | L3 | B3 | Comp 104 | A8 | L3 | B3 | Comp 105 | A9 | L3 | B3 |
| Comp 106 | A10 | L3 | B3 | Comp 107 | A11 | L3 | B3 | Comp 108 | A12 | L3 | B3 |
| Comp 109 | A1 | L1 | B4 | Comp 110 | A2 | L1 | B4 | Comp 111 | A3 | L1 | B4 |
| Comp 112 | A4 | L1 | B4 | Comp 113 | A5 | L1 | B4 | Comp 114 | A6 | L1 | B4 |
| Comp 115 | A7 | L1 | B4 | Comp 116 | A8 | L1 | B4 | Comp 117 | A9 | L1 | B4 |
| Comp 118 | A10 | L1 | B4 | Comp 119 | A11 | L1 | B4 | Comp 120 | A12 | L1 | B4 |
| Comp 121 | A1 | L2 | B4 | Comp 122 | A2 | L2 | B4 | Comp 123 | A3 | L2 | B4 |
| Comp 124 | A4 | L2 | B4 | Comp 125 | A5 | L2 | B4 | Comp 126 | A6 | L2 | B4 |
| Comp 127 | A7 | L2 | B4 | Comp 128 | A8 | L2 | B4 | Comp 129 | A9 | L2 | B4 |
| Comp 130 | A10 | L2 | B4 | Comp 131 | A11 | L2 | B4 | Comp 132 | A12 | L2 | B4 |
| Comp 133 | A1 | L3 | B4 | Comp 134 | A2 | L3 | B4 | Comp 135 | A3 | L3 | B4 |
| Comp 136 | A4 | L3 | B4 | Comp 137 | A5 | L3 | B4 | Comp 138 | A6 | L3 | B4 |
| Comp 139 | A7 | L3 | B4 | Comp 140 | A8 | L3 | B4 | Comp 141 | A9 | L3 | B4 |
| Comp 142 | A10 | L3 | B4 | Comp 143 | A11 | L3 | B4 | Comp 144 | A12 | L3 | B4 |
| Comp 145 | A1 | L1 | B5 | Comp 146 | A2 | L1 | B5 | Comp 147 | A3 | L1 | B5 |
| Comp 148 | A4 | L1 | B5 | Comp 149 | A5 | L1 | B5 | Comp 150 | A6 | L1 | B5 |
| Comp 151 | A7 | L1 | B5 | Comp 152 | A8 | L1 | B5 | Comp 153 | A9 | L1 | B5 |
| Comp 154 | A10 | L1 | B5 | Comp 155 | A11 | L1 | B5 | Comp 156 | A12 | L1 | B5 |
| Comp 157 | A1 | L2 | B5 | Comp 158 | A2 | L2 | B5 | Comp 159 | A3 | L2 | B5 |
| Comp 160 | A4 | L2 | B5 | Comp 161 | A5 | L2 | B5 | Comp 162 | A6 | L2 | B5 |
| Comp 163 | A7 | L2 | B5 | Comp 164 | A8 | L2 | B5 | Comp 165 | A9 | L2 | B5 |
| Comp 166 | A10 | L2 | B5 | Comp 167 | A11 | L2 | B5 | Comp 168 | A12 | L2 | B5 |
| Comp 169 | A1 | L3 | B5 | Comp 170 | A2 | L3 | B5 | Comp 171 | A3 | L3 | B5 |
| Comp 172 | A4 | L3 | B5 | Comp 173 | A5 | L3 | B5 | Comp 174 | A6 | L3 | B5 |
| Comp 175 | A7 | L3 | B5 | Comp 176 | A8 | L3 | B5 | Comp 177 | A9 | L3 | B5 |
| Comp 178 | A10 | L3 | B5 | Comp 179 | A11 | L3 | B5 | Comp 180 | A12 | L3 | B5 |
| Comp 181 | A1 | L1 | B6 | Comp 182 | A2 | L1 | B6 | Comp 183 | A3 | L1 | B6 |
| Comp 184 | A4 | L1 | B6 | Comp 185 | A5 | L1 | B6 | Comp 186 | A6 | L1 | B6 |
| Comp 187 | A7 | L1 | B6 | Comp 188 | A8 | L1 | B6 | Comp 189 | A9 | L1 | B6 |
| Comp 190 | A10 | L1 | B6 | Comp 191 | A11 | L1 | B6 | Comp 192 | A12 | L1 | B6 |
| Comp 193 | A1 | L2 | B6 | Comp 194 | A2 | L2 | B6 | Comp 195 | A3 | L2 | B6 |
| Comp 196 | A4 | L2 | B6 | Comp 197 | A5 | L2 | B6 | Comp 198 | A6 | L2 | B6 |
| Comp 199 | A7 | L2 | B6 | Comp 200 | A8 | L2 | B6 | Comp 201 | A9 | L2 | B6 |
| Comp 202 | A10 | L2 | B6 | Comp 203 | A11 | L2 | B6 | Comp 204 | A12 | L2 | B6 |
| Comp 205 | A1 | L3 | B6 | Comp 206 | A2 | L3 | B6 | Comp 207 | A3 | L3 | B6 |
| Comp 208 | A4 | L3 | B6 | Comp 209 | A5 | L3 | B6 | Comp 210 | A6 | L3 | B6 |
| Comp 211 | A7 | L3 | B6 | Comp 212 | A8 | L3 | B6 | Comp 213 | A9 | L3 | B6 |
| Comp 214 | A10 | L3 | B6 | Comp 215 | A11 | L3 | B6 | Comp 216 | A12 | L3 | B6 |
| Comp 217 | A1 | L1 | B7 | Comp 218 | A2 | L1 | B7 | Comp 219 | A3 | L1 | B7 |
| Comp 220 | A4 | L1 | B7 | Comp 221 | A5 | L1 | B7 | Comp 222 | A6 | L1 | B7 |
| Comp 223 | A7 | L1 | B7 | Comp 224 | A8 | L1 | B7 | Comp 225 | A9 | L1 | B7 |
| Comp 226 | A10 | L1 | B7 | Comp 227 | A11 | L1 | B7 | Comp 228 | A12 | L1 | B7 |
| Comp 229 | A1 | L2 | B7 | Comp 230 | A2 | L2 | B7 | Comp 231 | A3 | L2 | B7 |
| Comp 232 | A4 | L2 | B7 | Comp 233 | A5 | L2 | B7 | Comp 234 | A6 | L2 | B7 |
| Comp 235 | A7 | L2 | B7 | Comp 236 | A8 | L2 | B7 | Comp 237 | A9 | L2 | B7 |
| Comp 238 | A10 | L2 | B7 | Comp 239 | A11 | L2 | B7 | Comp 240 | A12 | L2 | B7 |
| Comp 241 | A1 | L3 | B7 | Comp 242 | A2 | L3 | B7 | Comp 243 | A3 | L3 | B7 |
| Comp 244 | A4 | L3 | B7 | Comp 245 | A5 | L3 | B7 | Comp 246 | A6 | L3 | B7 |
| Comp 247 | A7 | L3 | B7 | Comp 248 | A8 | L3 | B7 | Comp 249 | A9 | L3 | B7 |
| Comp 250 | A10 | L3 | B7 | Comp 251 | A11 | L3 | B7 | Comp 252 | A12 | L3 | B7 |
| Comp 253 | A1 | L1 | B8 | Comp 254 | A2 | L1 | B8 | Comp 255 | A3 | L1 | B8 |
| Comp 256 | A4 | L1 | B8 | Comp 257 | A5 | L1 | B8 | Comp 258 | A6 | L1 | B8 |
| Comp 259 | A7 | L1 | B8 | Comp 260 | A8 | L1 | B8 | Comp 261 | A9 | L1 | B8 |
| Comp 262 | A10 | L1 | B8 | Comp 263 | A11 | L1 | B8 | Comp 264 | A12 | L1 | B8 |
| Comp 265 | A1 | L2 | B8 | Comp 266 | A2 | L2 | B8 | Comp 267 | A3 | L2 | B8 |
| Comp 268 | A4 | L2 | B8 | Comp 269 | A5 | L2 | B8 | Comp 270 | A6 | L2 | B8 |
| Comp 271 | A7 | L2 | B8 | Comp 272 | A8 | L2 | B8 | Comp 273 | A9 | L2 | B8 |
| Comp 274 | A10 | L2 | B8 | Comp 275 | A11 | L2 | B8 | Comp 276 | A12 | L2 | B8 |
| Comp 277 | A1 | L3 | B8 | Comp 278 | A2 | L3 | B8 | Comp 279 | A3 | L3 | B8 |
| Comp 280 | A4 | L3 | B8 | Comp 281 | A5 | L3 | B8 | Comp 282 | A6 | L3 | B8 |
| Comp 283 | A7 | L3 | B8 | Comp 284 | A8 | L3 | B8 | Comp 285 | A9 | L3 | B8 |
| Comp 286 | A10 | L3 | B8 | Comp 287 | A11 | L3 | B8 | Comp 288 | A12 | L3 | B8 |
| Comp 289 | A1 | L1 | B9 | Comp 290 | A2 | L1 | B9 | Comp 291 | A3 | L1 | B9 |
| Comp 292 | A4 | L1 | B9 | Comp 293 | A5 | L1 | B9 | Comp 294 | A6 | L1 | B9 |
| Comp 295 | A7 | L1 | B9 | Comp 296 | A8 | L1 | B9 | Comp 297 | A9 | L1 | B9 |
| Comp 298 | A10 | L1 | B9 | Comp 299 | A11 | L1 | B9 | Comp 300 | A12 | L1 | B9 |
| Comp 301 | A1 | L2 | B9 | Comp 302 | A2 | L2 | B9 | Comp 303 | A3 | L2 | B9 |

TABLE 1-continued

| ID | A | L | B | ID | A | L | B | ID | A | L | B |
|---|---|---|---|---|---|---|---|---|---|---|---|
| Comp 304 | A4 | L2 | B9 | Comp 305 | A5 | L2 | B9 | Comp 306 | A6 | L2 | B9 |
| Comp 307 | A7 | L2 | B9 | Comp 308 | A8 | L2 | B9 | Comp 309 | A9 | L2 | B9 |
| Comp 310 | A10 | L2 | B9 | Comp 311 | A11 | L2 | B9 | Comp 312 | A12 | L2 | B9 |
| Comp 313 | A1 | L3 | B9 | Comp 314 | A2 | L3 | B9 | Comp 315 | A3 | L3 | B9 |
| Comp 316 | A4 | L3 | B9 | Comp 317 | A5 | L3 | B9 | Comp 318 | A6 | L3 | B9 |
| Comp 319 | A7 | L3 | B9 | Comp 320 | A8 | L3 | B9 | Comp 321 | A9 | L3 | B9 |
| Comp 322 | A10 | L3 | B9 | Comp 323 | A11 | L3 | B9 | Comp 324 | A12 | L3 | B9 |
| Comp 325 | A1 | L1 | B10 | Comp 326 | A2 | L1 | B10 | Comp 327 | A3 | L1 | B10 |
| Comp 328 | A4 | L1 | B10 | Comp 329 | A5 | L1 | B10 | Comp 330 | A6 | L1 | B10 |
| Comp 331 | A7 | L1 | B10 | Comp 332 | A8 | L1 | B10 | Comp 333 | A9 | L1 | B10 |
| Comp 334 | A10 | L1 | B10 | Comp 335 | A11 | L1 | B10 | Comp 336 | A12 | L1 | B10 |
| Comp 337 | A1 | L2 | B10 | Comp 338 | A2 | L2 | B10 | Comp 339 | A3 | L2 | B10 |
| Comp 340 | A4 | L2 | B10 | Comp 341 | A5 | L2 | B10 | Comp 342 | A6 | L2 | B10 |
| Comp 343 | A7 | L2 | B10 | Comp 344 | A8 | L2 | B10 | Comp 345 | A9 | L2 | B10 |
| Comp 346 | A10 | L2 | B10 | Comp 347 | A11 | L2 | B10 | Comp 348 | A12 | L2 | B10 |
| Comp 349 | A1 | L3 | B10 | Comp 350 | A2 | L3 | B10 | Comp 351 | A3 | L3 | B10 |
| Comp 352 | A4 | L3 | B10 | Comp 353 | A5 | L3 | B10 | Comp 354 | A6 | L3 | B10 |
| Comp 355 | A7 | L3 | B10 | Comp 356 | A8 | L3 | B10 | Comp 357 | A9 | L3 | B10 |
| Comp 358 | A10 | L3 | B10 | Comp 359 | A11 | L3 | B10 | Comp 360 | A12 | L3 | B10 |
| Comp 361 | A1 | L1 | B11 | Comp 362 | A2 | L1 | B11 | Comp 363 | A3 | L1 | B11 |
| Comp 364 | A4 | L1 | B11 | Comp 365 | A5 | L1 | B11 | Comp 366 | A6 | L1 | B11 |
| Comp 367 | A7 | L1 | B11 | Comp 368 | A8 | L1 | B11 | Comp 369 | A9 | L1 | B11 |
| Comp 370 | A10 | L1 | B11 | Comp 371 | A11 | L1 | B11 | Comp 372 | A12 | L1 | B11 |
| Comp 373 | A1 | L2 | B11 | Comp 374 | A2 | L2 | B11 | Comp 375 | A3 | L2 | B11 |
| Comp 376 | A4 | L2 | B11 | Comp 377 | A5 | L2 | B11 | Comp 378 | A6 | L2 | B11 |
| Comp 379 | A7 | L2 | B11 | Comp 380 | A8 | L2 | B11 | Comp 381 | A9 | L2 | B11 |
| Comp 382 | A10 | L2 | B11 | Comp 383 | A11 | L2 | B11 | Comp 384 | A12 | L2 | B11 |
| Comp 385 | A1 | L3 | B11 | Comp 386 | A2 | L3 | B11 | Comp 387 | A3 | L3 | B11 |
| Comp 388 | A4 | L3 | B11 | Comp 389 | A5 | L3 | B11 | Comp 390 | A6 | L3 | B11 |
| Comp 391 | A7 | L3 | B11 | Comp 392 | A8 | L3 | B11 | Comp 393 | A9 | L3 | B11 |
| Comp 394 | A10 | L3 | B11 | Comp 395 | A11 | L3 | B11 | Comp 396 | A12 | L3 | B11 |
| Comp 397 | A1 | L1 | B12 | Comp 398 | A2 | L1 | B12 | Comp 399 | A3 | L1 | B12 |
| Comp 400 | A4 | L1 | B12 | Comp 401 | A5 | L1 | B12 | Comp 402 | A6 | L1 | B12 |
| Comp 403 | A7 | L1 | B12 | Comp 404 | A8 | L1 | B12 | Comp 405 | A9 | L1 | B12 |
| Comp 406 | A10 | L1 | B12 | Comp 407 | A11 | L1 | B12 | Comp 408 | A12 | L1 | B12 |
| Comp 409 | A1 | L2 | B12 | Comp 410 | A2 | L2 | B12 | Comp 411 | A3 | L2 | B12 |
| Comp 412 | A4 | L2 | B12 | Comp 413 | A5 | L2 | B12 | Comp 414 | A6 | L2 | B12 |
| Comp 415 | A7 | L2 | B12 | Comp 416 | A8 | L2 | B12 | Comp 417 | A9 | L2 | B12 |
| Comp 418 | A10 | L2 | B12 | Comp 419 | A11 | L2 | B12 | Comp 420 | A12 | L2 | B12 |
| Comp 421 | A1 | L3 | B12 | Comp 422 | A2 | L3 | B12 | Comp 423 | A3 | L3 | B12 |
| Comp 424 | A4 | L3 | B12 | Comp 425 | A5 | L3 | B12 | Comp 426 | A6 | L3 | B12 |
| Comp 427 | A7 | L3 | B12 | Comp 428 | A8 | L3 | B12 | Comp 429 | A9 | L3 | B12 |
| Comp 430 | A10 | L3 | B12 | Comp 431 | A11 | L3 | B12 | Comp 432 | A12 | L3 | B12 |
| Comp 433 | A1 | L1 | B13 | Comp 434 | A2 | L1 | B13 | Comp 435 | A3 | L1 | B13 |
| Comp 436 | A4 | L1 | B13 | Comp 437 | A5 | L1 | B13 | Comp 438 | A6 | L1 | B13 |
| Comp 439 | A7 | L1 | B13 | Comp 440 | A8 | L1 | B13 | Comp 441 | A9 | L1 | B13 |
| Comp 442 | A10 | L1 | B13 | Comp 443 | A11 | L1 | B13 | Comp 444 | A12 | L1 | B13 |
| Comp 445 | A1 | L2 | B13 | Comp 446 | A2 | L2 | B13 | Comp 447 | A3 | L2 | B13 |
| Comp 448 | A4 | L2 | B13 | Comp 449 | A5 | L2 | B13 | Comp 450 | A6 | L2 | B13 |
| Comp 451 | A7 | L2 | B13 | Comp 452 | A8 | L2 | B13 | Comp 453 | A9 | L2 | B13 |
| Comp 454 | A10 | L2 | B13 | Comp 455 | A11 | L2 | B13 | Comp 456 | A12 | L2 | B13 |
| Comp 457 | A1 | L3 | B13 | Comp 458 | A2 | L3 | B13 | Comp 459 | A3 | L3 | B13 |
| Comp 460 | A4 | L3 | B13 | Comp 461 | A5 | L3 | B13 | Comp 462 | A6 | L3 | B13 |
| Comp 463 | A7 | L3 | B13 | Comp 464 | A8 | L3 | B13 | Comp 465 | A9 | L3 | B13 |
| Comp 466 | A10 | L3 | B13 | Comp 467 | A11 | L3 | B13 | Comp 468 | A12 | L3 | B13 |
| Comp 469 | A1 | L1 | B14 | Comp 470 | A2 | L1 | B14 | Comp 471 | A3 | L1 | B14 |
| Comp 472 | A4 | L1 | B14 | Comp 473 | A5 | L1 | B14 | Comp 474 | A6 | L1 | B14 |
| Comp 475 | A7 | L1 | B14 | Comp 476 | A8 | L1 | B14 | Comp 477 | A9 | L1 | B14 |
| Comp 478 | A10 | L1 | B14 | Comp 479 | A11 | L1 | B14 | Comp 480 | A12 | L1 | B14 |
| Comp 481 | A1 | L2 | B14 | Comp 482 | A2 | L2 | B14 | Comp 483 | A3 | L2 | B14 |
| Comp 484 | A4 | L2 | B14 | Comp 485 | A5 | L2 | B14 | Comp 486 | A6 | L2 | B14 |
| Comp 487 | A7 | L2 | B14 | Comp 488 | A8 | L2 | B14 | Comp 489 | A9 | L2 | B14 |
| Comp 490 | A10 | L2 | B14 | Comp 491 | A11 | L2 | B14 | Comp 492 | A12 | L2 | B14 |
| Comp 493 | A1 | L3 | B14 | Comp 494 | A2 | L3 | B14 | Comp 495 | A3 | L3 | B14 |
| Comp 496 | A4 | L3 | B14 | Comp 497 | A5 | L3 | B14 | Comp 498 | A6 | L3 | B14 |
| Comp 499 | A7 | L3 | B14 | Comp 500 | A8 | L3 | B14 | Comp 501 | A9 | L3 | B14 |
| Comp 502 | A10 | L3 | B14 | Comp 503 | A11 | L3 | B14 | Comp 504 | A12 | L3 | B14 |
| Comp 505 | A1 | L1 | B15 | Comp 506 | A2 | L1 | B15 | Comp 507 | A3 | L1 | B15 |
| Comp 508 | A4 | L1 | B15 | Comp 509 | A5 | L1 | B15 | Comp 510 | A6 | L1 | B15 |
| Comp 511 | A7 | L1 | B15 | Comp 512 | A8 | L1 | B15 | Comp 513 | A9 | L1 | B15 |
| Comp 514 | A10 | L1 | B15 | Comp 515 | A11 | L1 | B15 | Comp 516 | A12 | L1 | B15 |
| Comp 517 | A1 | L2 | B15 | Comp 518 | A2 | L2 | B15 | Comp 519 | A3 | L2 | B15 |
| Comp 520 | A4 | L2 | B15 | Comp 521 | A5 | L2 | B15 | Comp 522 | A6 | L2 | B15 |
| Comp 523 | A7 | L2 | B15 | Comp 524 | A8 | L2 | B15 | Comp 525 | A9 | L2 | B15 |
| Comp 526 | A10 | L2 | B15 | Comp 527 | A11 | L2 | B15 | Comp 528 | A12 | L2 | B15 |
| Comp 529 | A1 | L3 | B15 | Comp 530 | A2 | L3 | B15 | Comp 531 | A3 | L3 | B15 |
| Comp 532 | A4 | L3 | B15 | Comp 533 | A5 | L3 | B15 | Comp 534 | A6 | L3 | B15 |
| Comp 535 | A7 | L3 | B15 | Comp 536 | A8 | L3 | B15 | Comp 537 | A9 | L3 | B15 |

TABLE 1-continued

| ID | A | L | B | ID | A | L | B | ID | A | L | B |
|---|---|---|---|---|---|---|---|---|---|---|---|
| Comp 538 | A10 | L3 | B15 | Comp 539 | A11 | L3 | B15 | Comp 540 | A12 | L3 | B15 |
| Comp 541 | A1 | L1 | B16 | Comp 542 | A2 | L1 | B16 | Comp 543 | A3 | L1 | B16 |
| Comp 544 | A4 | L1 | B16 | Comp 545 | A5 | L1 | B16 | Comp 546 | A6 | L1 | B16 |
| Comp 547 | A7 | L1 | B16 | Comp 548 | A8 | L1 | B16 | Comp 549 | A9 | L1 | B16 |
| Comp 550 | A10 | L1 | B16 | Comp 551 | A11 | L1 | B16 | Comp 552 | A12 | L1 | B16 |
| Comp 553 | A1 | L2 | B16 | Comp 554 | A2 | L2 | B16 | Comp 555 | A3 | L2 | B16 |
| Comp 556 | A4 | L2 | B16 | Comp 557 | A5 | L2 | B16 | Comp 558 | A6 | L2 | B16 |
| Comp 559 | A7 | L2 | B16 | Comp 560 | A8 | L2 | B16 | Comp 561 | A9 | L2 | B16 |
| Comp 562 | A10 | L2 | B16 | Comp 563 | A11 | L2 | B16 | Comp 564 | A12 | L2 | B16 |
| Comp 565 | A1 | L3 | B16 | Comp 566 | A2 | L3 | B16 | Comp 567 | A3 | L3 | B16 |
| Comp 568 | A4 | L3 | B16 | Comp 569 | A5 | L3 | B16 | Comp 570 | A6 | L3 | B16 |
| Comp 571 | A7 | L3 | B16 | Comp 572 | A8 | L3 | B16 | Comp 573 | A9 | L3 | B16 |
| Comp 574 | A10 | L3 | B16 | Comp 575 | A11 | L3 | B16 | Comp 576 | A12 | L3 | B16 |
| Comp 577 | A10 | L1 | B17 | Comp 578 | A11 | L1 | B17 | Comp 579 | A12 | L1 | B17 |
| Comp 580 | A10 | L2 | B17 | Comp 581 | A11 | L2 | B17 | Comp 582 | A12 | L2 | B17 |
| Comp 583 | A10 | L3 | B17 | Comp 584 | A11 | L3 | B17 | Comp 585 | A12 | L3 | B17 |
| Comp 586 | A10 | L1 | B18 | Comp 587 | A11 | L1 | B18 | Comp 588 | A12 | L1 | B18 |
| Comp 589 | A10 | L2 | B18 | Comp 590 | A11 | L2 | B18 | Comp 591 | A12 | L2 | B18 |
| Comp 592 | A10 | L3 | B18 | Comp 593 | A11 | L3 | B18 | Comp 594 | A12 | L3 | B18 |
| Comp 595 | A10 | L1 | B19 | Comp 596 | A11 | L1 | B19 | Comp 597 | A12 | L1 | B19 |
| Comp 598 | A10 | L2 | B19 | Comp 599 | A11 | L2 | B19 | Comp 600 | A12 | L2 | B19 |
| Comp 601 | A10 | L3 | B19 | Comp 602 | A11 | L3 | B19 | Comp 603 | A12 | L3 | B19 |
| Comp 604 | A10 | L1 | B20 | Comp 605 | A11 | L1 | B20 | Comp 606 | A12 | L1 | B20 |
| Comp 607 | A10 | L2 | B20 | Comp 608 | A11 | L2 | B20 | Comp 609 | A12 | L2 | B20 |
| Comp 610 | A10 | L3 | B20 | Comp 611 | A11 | L3 | B20 | Comp 612 | A12 | L3 | B20 |
| Comp 613 | A10 | L1 | B21 | Comp 614 | A11 | L1 | B21 | Comp 615 | A12 | L1 | B21 |
| Comp 616 | A10 | L2 | B21 | Comp 617 | A11 | L2 | B21 | Comp 618 | A12 | L2 | B21 |
| Comp 619 | A10 | L3 | B21 | Comp 620 | A11 | L3 | B21 | Comp 621 | A12 | L3 | B21 |
| Comp 622 | A10 | L1 | B22 | Comp 623 | A11 | L1 | B22 | Comp 624 | A12 | L1 | B22 |
| Comp 625 | A10 | L2 | B22 | Comp 626 | A11 | L2 | B22 | Comp 627 | A12 | L2 | B22 |
| Comp 628 | A10 | L3 | B22 | Comp 629 | A11 | L3 | B22 | Comp 630 | A12 | L3 | B22 |
| Comp 631 | A10 | L1 | B23 | Comp 632 | A11 | L1 | B23 | Comp 633 | A12 | L1 | B23 |
| Comp 634 | A10 | L2 | B23 | Comp 635 | A11 | L2 | B23 | Comp 636 | A12 | L2 | B23 |
| Comp 637 | A10 | L3 | B23 | Comp 638 | A11 | L3 | B23 | Comp 639 | A12 | L3 | B23 |

In some embodiments, the compound is selected from the group listed in TABLE 2.

TABLE 2

| ID | Structure | ID | Structure | ID | Structure |
|---|---|---|---|---|---|
| Comp 1 | A1-L1-B1 | Comp 2 | A2-L1-B1 | Comp 4 | A4-L1-B1 |
| Comp 13 | A1-L2-B1 | Comp 14 | A2-L2-B1 | Comp 16 | A4-L2-B1 |
| Comp 181 | A1-L1-B6 | Comp 182 | A2-L1-B6 | Comp 184 | A4-L1-B6 |
| Comp 193 | A1-L2-B6 | Comp 194 | A2-L2-B6 | Comp 196 | A4-L2-B6 |
| Comp 217 | A1-L1-B7 | Comp 218 | A2-L1-B7 | Comp 220 | A4-L1-B7 |
| Comp 229 | A1-L2-B7 | Comp 230 | A2-L2-B7 | Comp 232 | A4-L2-B7 |
| Comp 253 | A1-L1-B8 | Comp 254 | A2-L1-B8 | Comp 256 | A4-L1-B8 |
| Comp 265 | A1-L2-B8 | Comp 266 | A2-L2-B8 | Comp 268 | A4-L2-B8 |
| Comp 541 | A1-L1-B16 | Comp 542 | A2-L1-B16 | Comp 544 | A4-L1-B16 |
| Comp 553 | A1-L2-B16 | Comp 554 | A2-L2-B16 | Comp 556 | A4-L2-B16 |

In some embodiments, B is formula III:

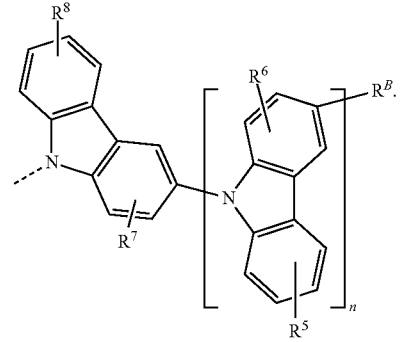

(III)

In embodiments where B is formula III, the compound has the formula I-A:

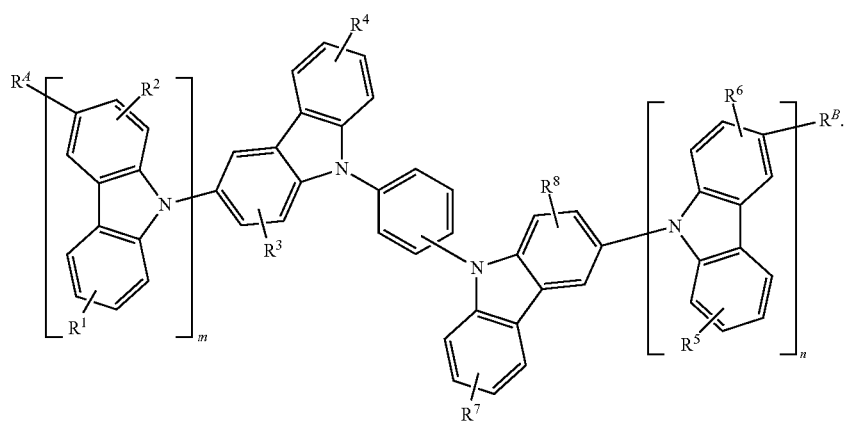

(I-A)

In the compound of formula I-A, $R^1$, $R^4$, $R^5$, and $R^8$ each independently represent mono, di, tri, tetra substitutions, or no substitution; $R^2$, $R^3$, $R^6$, and $R^7$ each independently represent mono, di, tri substitutions, or no substitution; $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof; $R^A$ and $R^B$ are each independently selected from the group consisting of hydrogen, deuterium, aryl, and combinations thereof; m is an integer selected from 1 to 10; n is an integer selected from 0 to 9; and m is greater than n.

In some embodiments, B is formula IV:

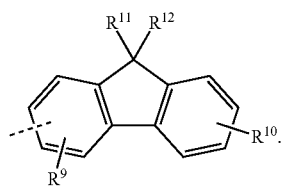

(IV)

In embodiments where B is formula IV, the compound has the formula I-B:

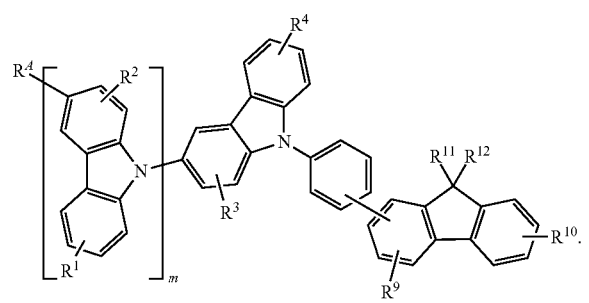

(I-B)

In the compound of formula I-B, $R^1$, $R^4$, and $R^{10}$ each independently represent mono, di, tri, tetra substitutions, or no substitution; $R^2$, $R^3$, and $R^9$ each independently represent mono, di, tri substitutions, or no substitution; $R^1$, $R^2$, $R^3$, and $R^4$ are each independently selected from the group consisting of hydrogen, deuterium, alkyl, cycloalkyl, silyl, aryl, and combinations thereof; $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; $R^A$ is selected from the group consisting of hydrogen, deuterium, aryl, and combinations thereof; $R^{11}$ and $R^{12}$ are optionally joined to form a ring; and m is an integer selected from 1 to 10.

In some embodiments, $R^1$, $R^2$, $R^3$, $R^4$, $R^5$, $R^6$, $R^7$, $R^8$, $R^9$, and $R^{10}$ are each independently selected from the group consisting of hydrogen, deuterium, aryl, and combinations thereof. In some embodiments, $R^1$, $R^2$, $R^3$, $R^4$, $R^5$, $R^6$, $R^7$, $R^8$, $R^9$, and $R^{10}$ are each independently selected from the group consisting of hydrogen, deuterium, phenyl, and combinations thereof. In some embodiments, $R^1$, $R^2$, $R^3$, $R^4$, $R^5$, $R^6$, $R^7$, $R^8$, $R^9$, and $R^{10}$ are hydrogen.

In some embodiments, $R^A$ and $R^B$ are hydrogen.

In some embodiments, $R^{11}$ and $R^{12}$ are alkyl.

In some embodiments, m is 1, and n is 0. In some embodiments, m is 2, and n is 0 or 1.

In some embodiments, a device is provided. The device comprises an anode, a cathode, and an organic layer, disposed between the anode and the cathode, comprising a compound having the formula:

A-L-B           (I).

In the compound of formula I, A is

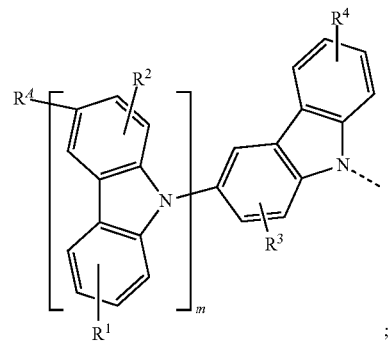

(II)

B is selected from the group consisting of

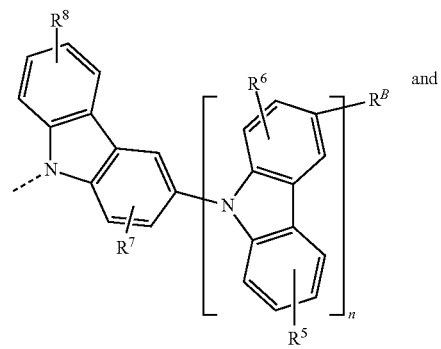

(III) and

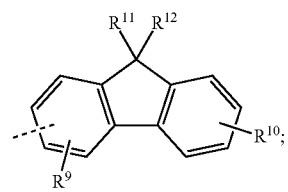

(IV)

L is a phenyl, which is optionally substituted with 1, 2, 3, or 4 deuterium; $R^1$, $R^4$, $R^5$, $R^8$, and $R^{10}$ each independently represent mono, di, tri, tetra substitutions, or no substitution; $R^2$, $R^3$, $R^6$, $R^7$, and $R^9$ each independently represent mono, di, tri substitutions, or no substitution; $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof; $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; $R^A$ and $R^B$ are each independently selected from the group consisting of hydrogen, deuterium, aryl, and combinations thereof; $R^{11}$ and $R^{12}$ are optionally joined to form a ring; m is an integer selected from 1 to 10; n is an integer selected from 0 to 9; and if B is formula (III), then m is greater than n.

In some embodiments, A is in the 1-position and B is in the 4-position of the phenyl ring. In some embodiments, A is in the 1-position and B is in the 3-position of the phenyl ring.

In some embodiments, the compound of formula (I) is selected from the group consisting of Comp 1

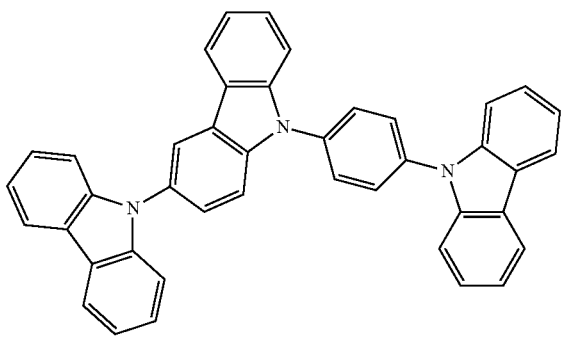

, Comp 13

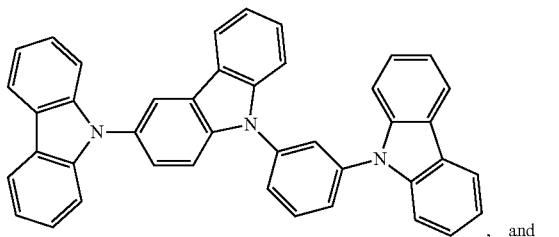

, and Comp 193

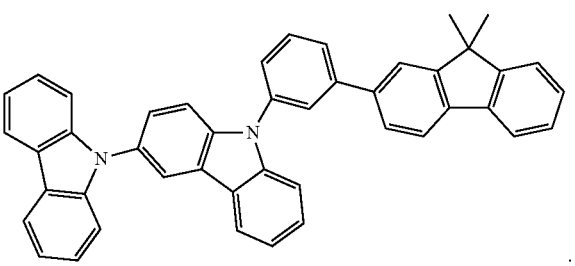

In some embodiments, the device comprises an anode, a cathode, and an organic layer, disposed between the anode and the cathode, comprising a compound having the formula: the compound has the formula I-A:

$R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof; $R^A$ and $R^B$ are each independently selected from the group consisting of hydrogen, deuterium, aryl, and combinations thereof; m is an integer selected from 1 to 10; n is an integer selected from 0 to 9; and m is greater than n.

In some embodiments, the device comprises an anode, a cathode, and an organic layer, disposed between the anode and the cathode, comprising a compound having the formula: the compound has the formula I-B:

(I-B)

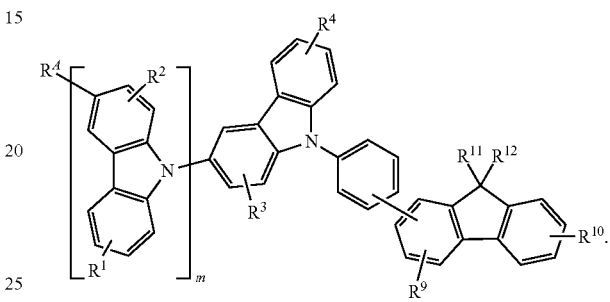

In the compound of formula I-B, $R^1$, $R^4$, and $R^{10}$ each independently represent mono, di, tri, tetra substitutions, or no substitution; $R^2$, $R^3$, and $R^9$ each independently represent mono, di, tri substitutions, or no substitution; $R^1$, $R^2$, $R^3$, and $R^4$ are each independently selected from the group consisting of hydrogen, deuterium, alkyl, cycloalkyl, silyl, aryl, and combinations thereof; $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; $R^A$ is selected from the group consisting of hydrogen, deuterium, aryl, and combinations thereof; $R^{11}$ and $R^{12}$ are optionally joined to form a ring; and m is an integer selected from 1 to 10.

(I-A)

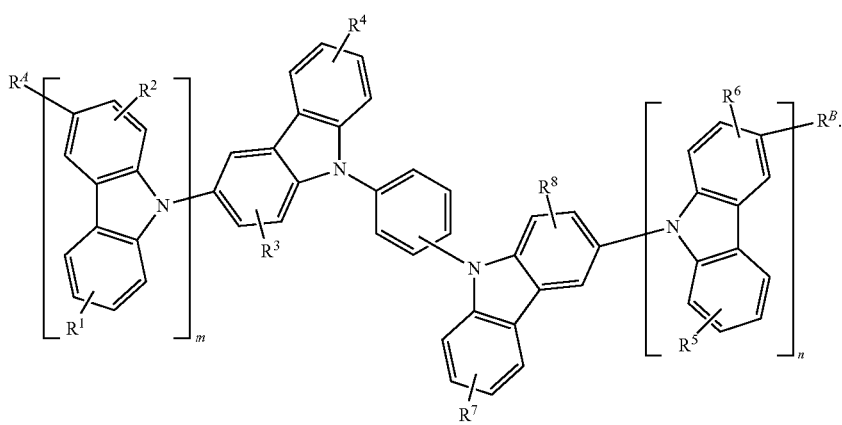

In the compound of formula I-A, $R^1$, $R^4$, $R^5$, and $R^8$ each independently represent mono, di, tri, tetra substitutions, or no substitution; $R^2$, $R^3$, $R^6$, and $R^7$ each independently represent mono, di, tri substitutions, or no substitution; $R^1$, In some embodiments, the organic layer of the device is an emissive layer and the compound of formula I is a host.

In some embodiments, the organic layer of the device further comprises a phosphorescent emissive dopant. In some embodiments, the phosphorescent emissive dopant is a transition metal complex having at least one ligand or part of the ligand if the ligand is more than bidentate selected from the group consisting of:
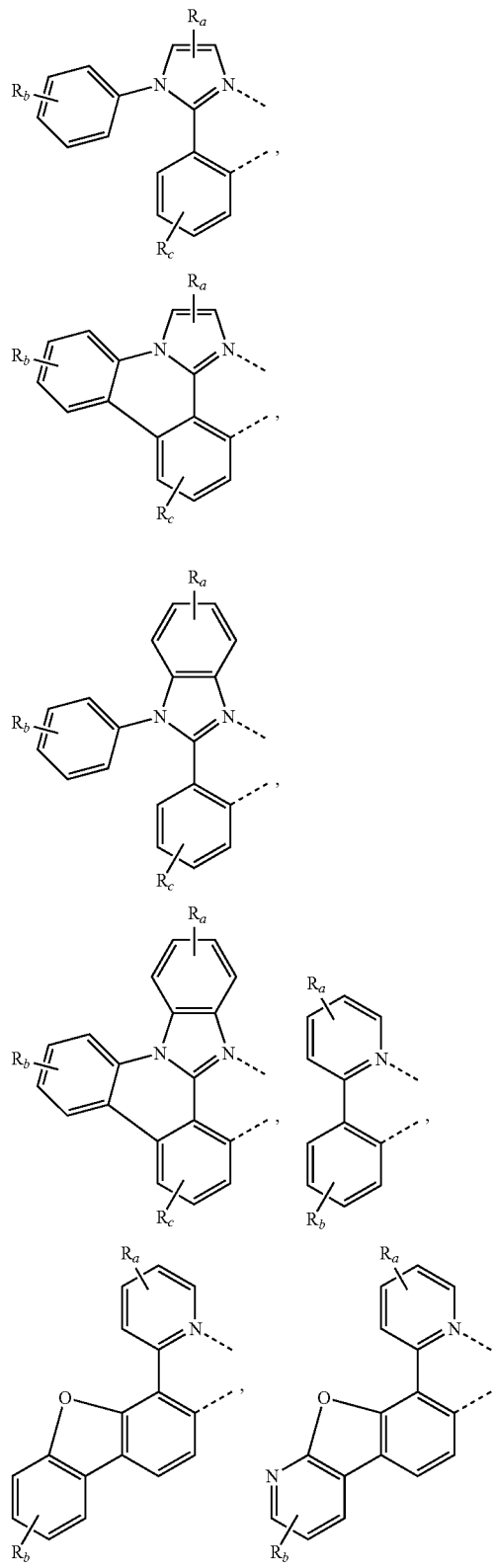
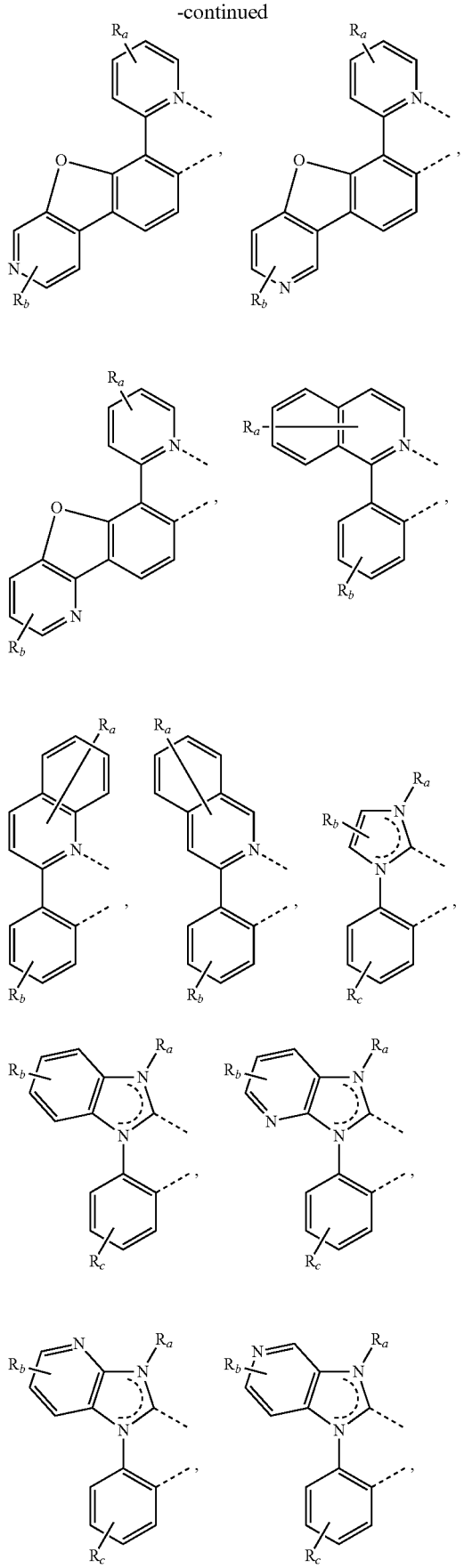

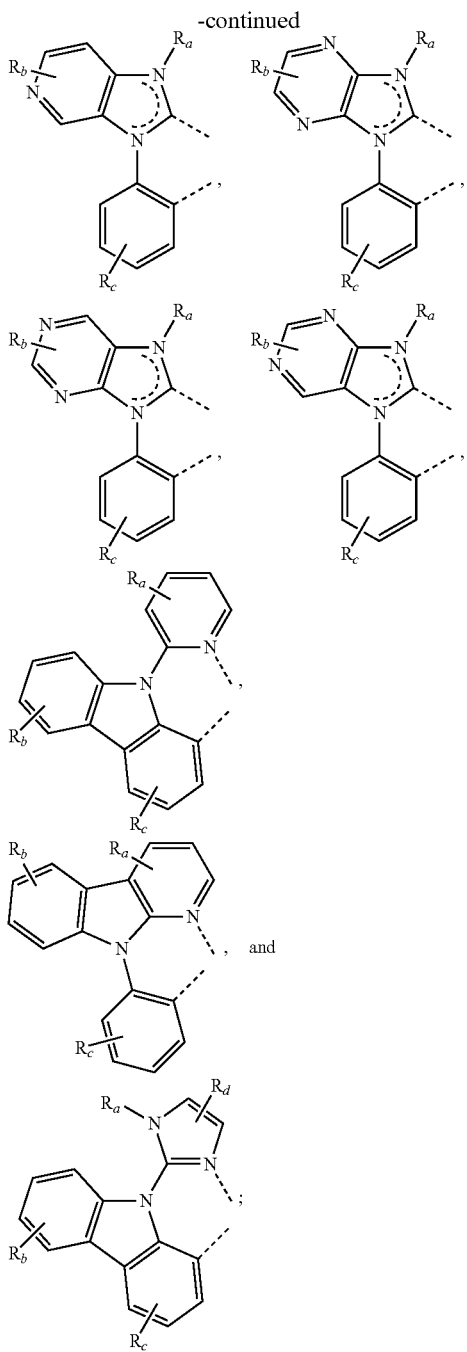

wherein $R_a$, $R_b$, $R_c$, and $R_d$ may represent mono, di, tri, or tetra substitution, or no substitution; and wherein $R_a$, $R_b$, $R_c$, and $R_d$ are independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand.

In some embodiments, the organic layer of the device is a blocking layer and the compound is a blocking material in the organic layer.

In some embodiments, the device is a consumer product. In some embodiments, the device is an organic light-emitting device. In some embodiments, the device comprises a lighting panel.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and cross-linkable compounds.

Examples of aromatic amine derivatives used in HIL or HTL include, but are not limited to the following general structures:

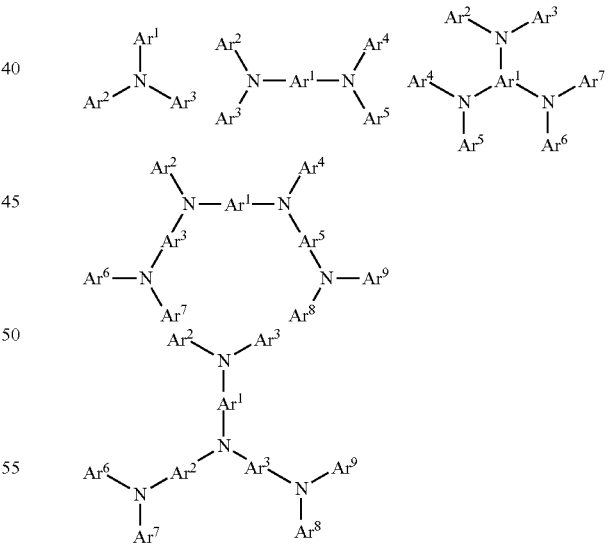

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, $Ar^1$ to $Ar^9$ is independently selected from the group consisting of:

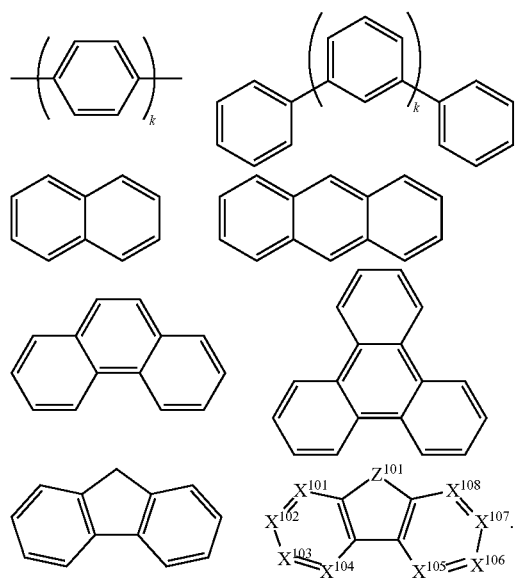

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

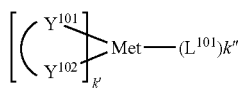

Met is a metal; $(Y^{101}-Y^{102})$ is a bidentate ligand, $Y^{101}$ and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, $(Y^{101}-Y^{102})$ is a 2-phenylpyridine derivative.

In some embodiments, $(Y^{101}-Y^{102})$ is a carbene ligand.

In some embodiments, Met is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

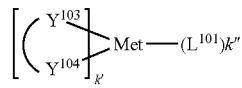

Met is a metal; $(Y^{103}-Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, the metal complexes are:

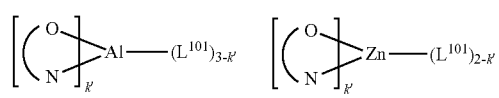

(O—N) is a bidentate ligand, having metal coordinated to atoms O and N.

In some embodiments, Met is selected from Ir and Pt.

In a further aspect, $(Y^{103}-Y^{104})$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, the host compound contains at least one of the following groups in the molecule:

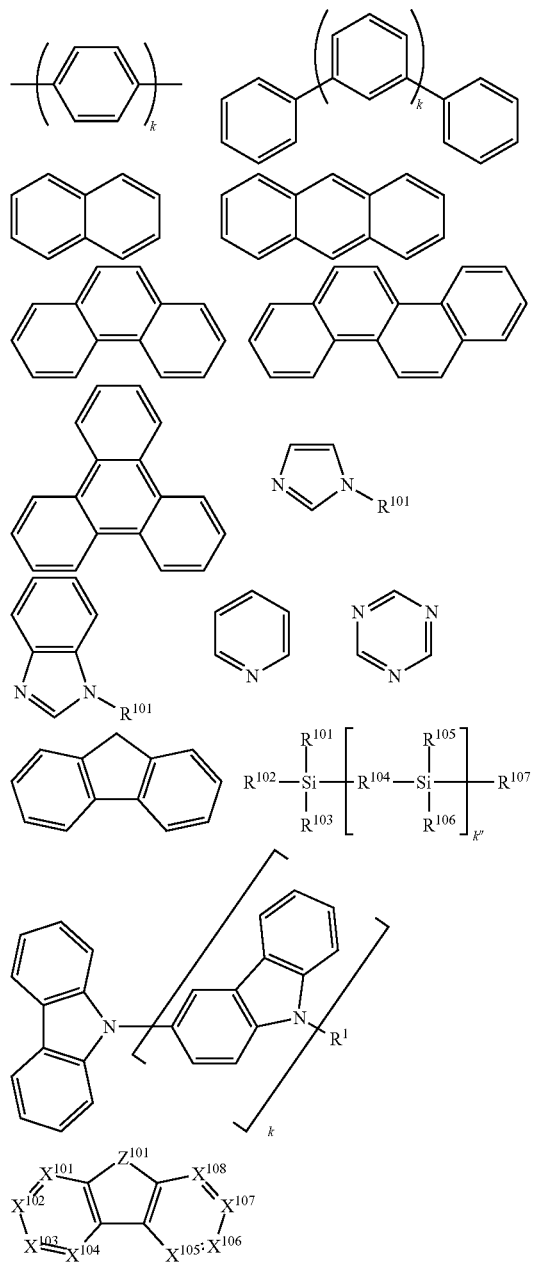

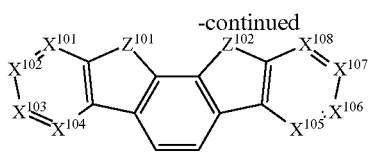

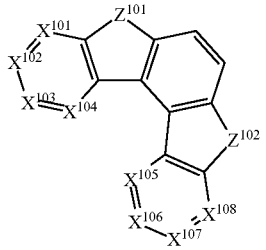

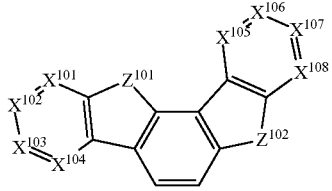

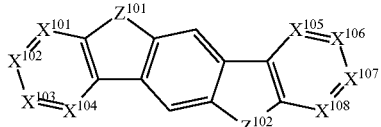

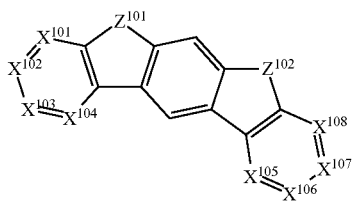

$R^{101}$ to $R^{107}$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In some embodiments, compound used in HBL contains the same molecule or the same functional groups used as host described above.

In some embodiments, compound used in HBL contains at least one of the following groups in the molecule:

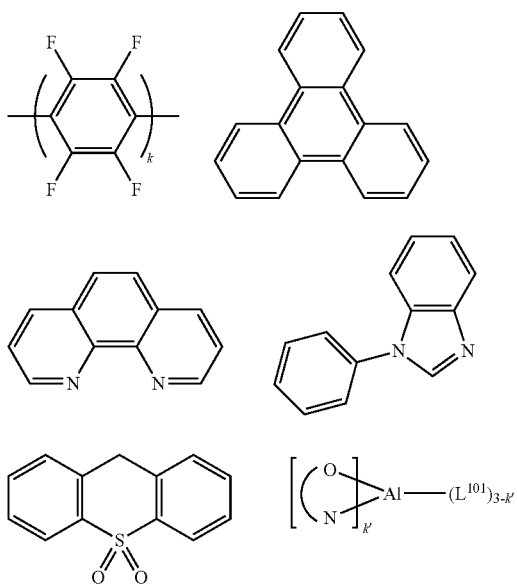

k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL contains at least one of the following groups in the molecule:

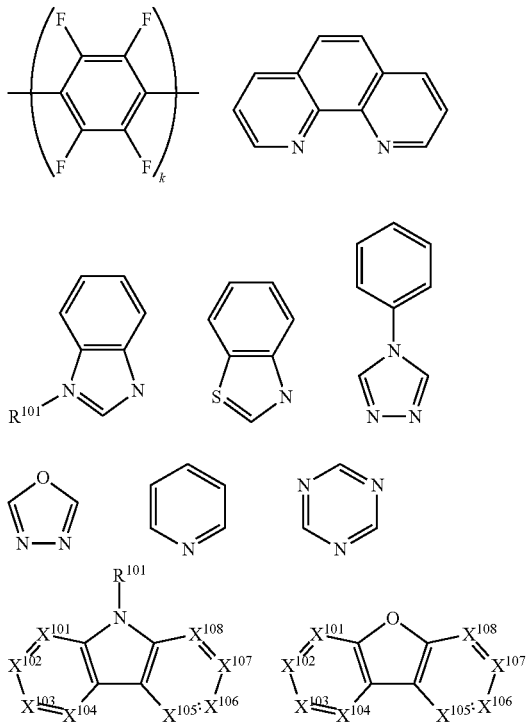

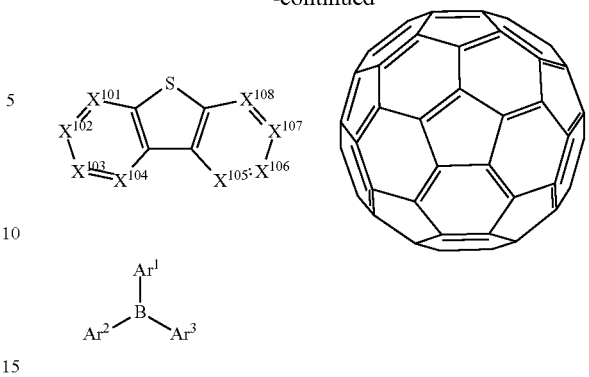

$R^{101}$ is selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In some embodiments, the metal complexes used in ETL contains, but are not limited to the following general formula:

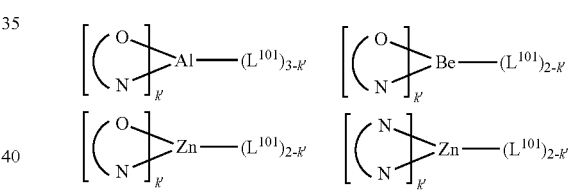

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in TABLE 3 below. TABLE 3 lists non-limiting classes of materials, non-limiting examples of compounds for each class, and references that disclose the materials.

TABLE 3

| MATERIAL | EXAMPLES OF MATERIAL | PUBLICATIONS |
| --- | --- | --- |
| Hole injection materials | | |
| Phthalocyanine and porphyrin compounds | | Appl. Phys. Lett. 69, 2160 (1996) |
| Starburst triarylamines | | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polythiophene) | | Synth. Met. 87, 171 (1997) WO2007002683 |
| Phosphonic acid and silane SAMs | | US20030162053 |

TABLE 3-continued

| MATERIAL | EXAMPLES OF MATERIAL | PUBLICATIONS |
| --- | --- | --- |
| Triarylamine or polythiophene polymers with conductivity dopants | | EP1725079A1 |
| Organic compounds with conductive inorganic compounds, such as molybdenum and tungsten oxides | + MoO$_x$ | US20050123751<br>SID Symposium Digest, 37, 923 (2006)<br>WO2009018009 |

TABLE 3-continued
| MATERIAL | EXAMPLES OF MATERIAL | PUBLICATIONS |
|---|---|---|
| n-type semi-conducting organic complexes | 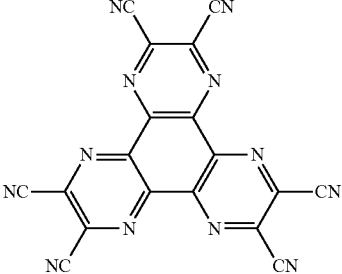 [SMILES: N#Cc1nc2c3nc(C#N)c(C#N)nc3c3nc(C#N)c(C#N)nc3c2nc1C#N] | US20020158242 |
| Metal organometallic complexes | 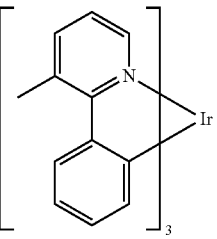 | US20060240279 |
| Cross-linkable compounds | 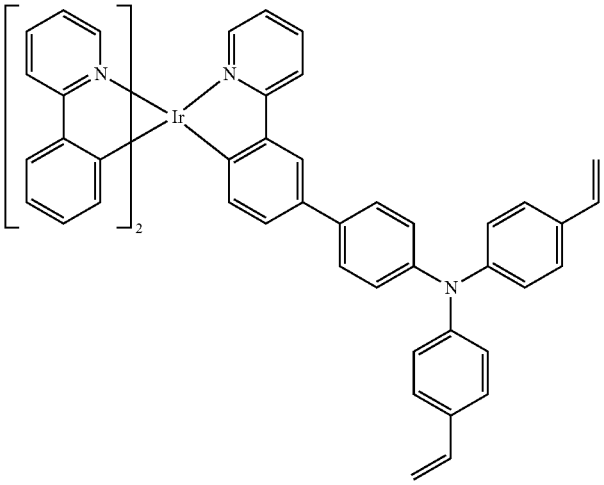 | US20080220265 |
| Polythiophene based polymers and copolymers | 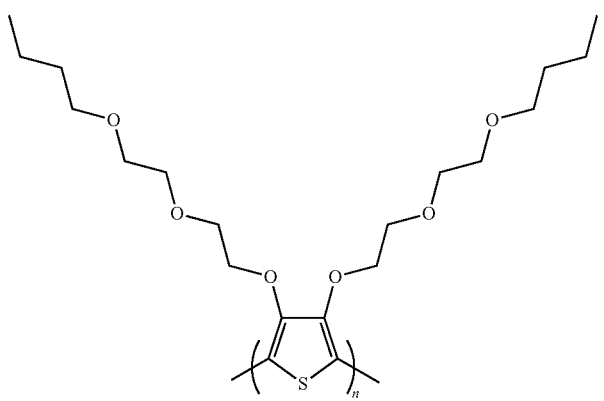 | WO 2011075644<br>EP2350216 |

TABLE 3-continued
| MATERIAL | EXAMPLES OF MATERIAL | PUBLICATIONS |
|---|---|---|
| Hole transporting materials | | |
| Triarylamines (e.g., TPD, α-NPD) | 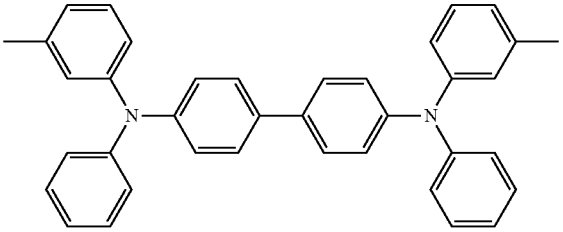 | Appl. Phys. Lett. 51, 913 (1987) |
| | 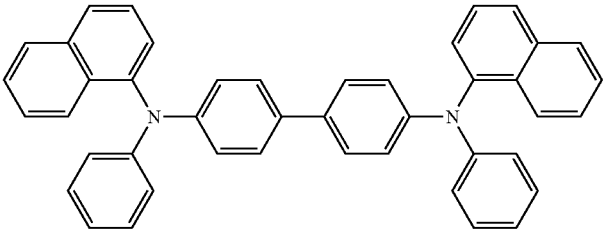 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 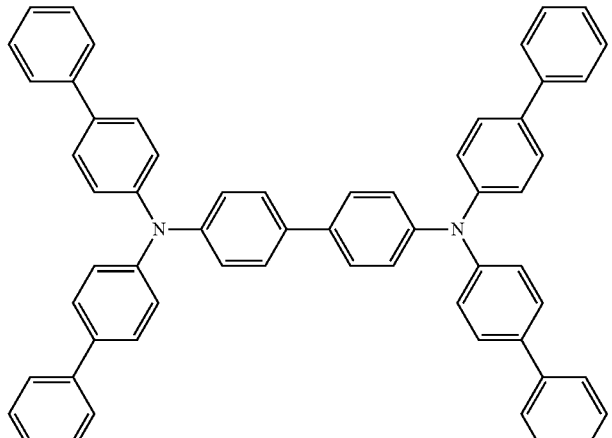 | EP650955 |
| | 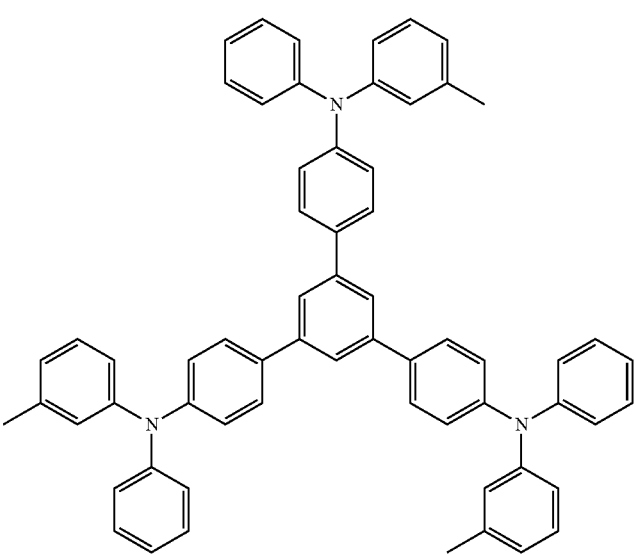 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 3-continued
| MATERIAL | EXAMPLES OF MATERIAL | PUBLICATIONS |
| --- | --- | --- |
|  | 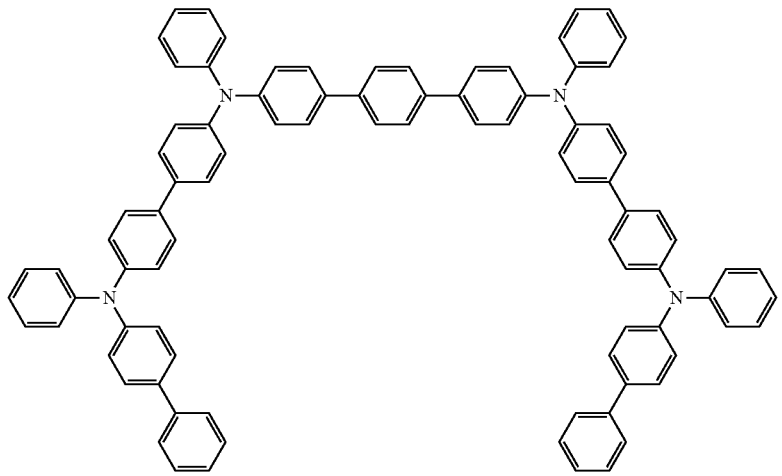 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
|  | 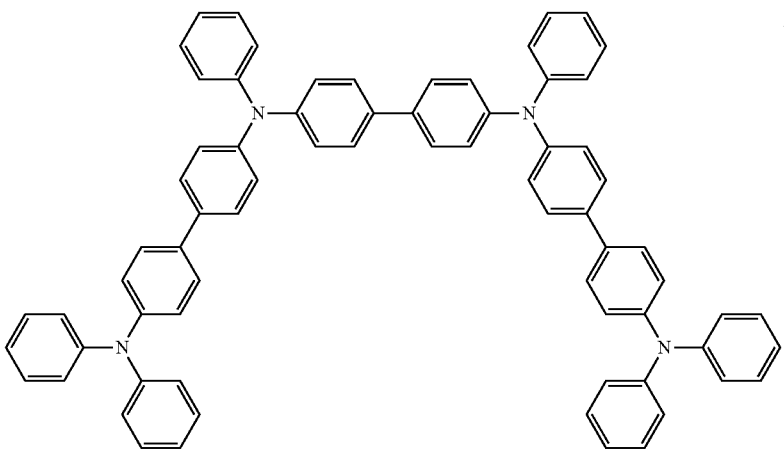 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofuorene core | 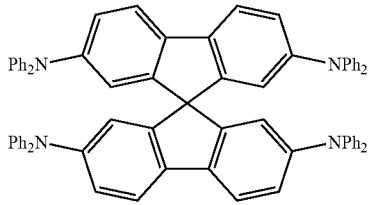 | Synth. Met. 91, 209 (1997) |
| Arylamine carbazole compounds | 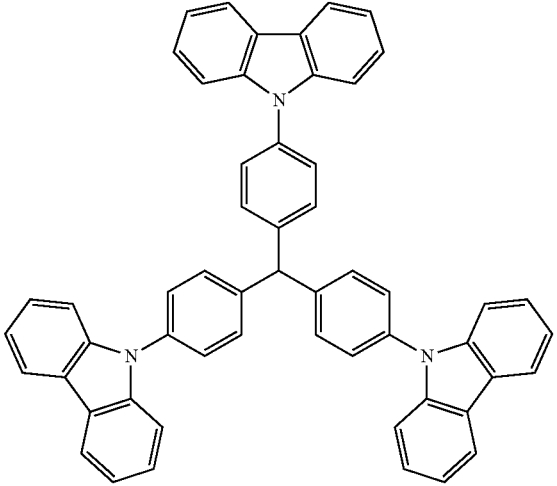 [SMILES: c1ccc2c(c1)c1ccccc1n2-c1ccc(C(c2ccc(-n3c4ccccc4c4ccccc43)cc2)c2ccc(-n3c4ccccc4c4ccccc43)cc2)cc1] | Adv. Mater. 6, 677 (1994), US20080124572 |

TABLE 3-continued

| MATERIAL | EXAMPLES OF MATERIAL | PUBLICATIONS |
|---|---|---|
| Triarylamine with (di)benzothiophene/ (di)benzofuran | | US20070278938, US20080106190 US20110163302 |
| Indolocarbazoles | | Synth. Met. 111, 421 (2000) |
| Isoindole compounds | | Chem. Mater. 15, 3148 (2003) |
| Metal carbene complexes | | US20080018221 |

TABLE 3-continued
| MATERIAL | EXAMPLES OF MATERIAL | PUBLICATIONS |
|---|---|---|
| Phosphorescent OLED host materials | | |
| Red hosts | | |
| Arylcarbazoles | 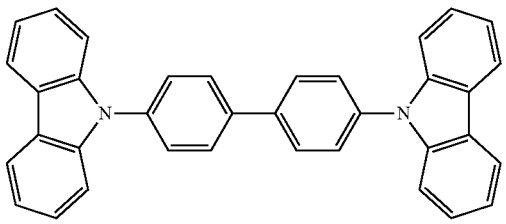 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxy-quinolates (e.g., Alq$_3$, BAlq) | 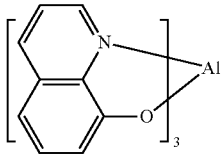 | Nature 395, 151 (1998) |
| | 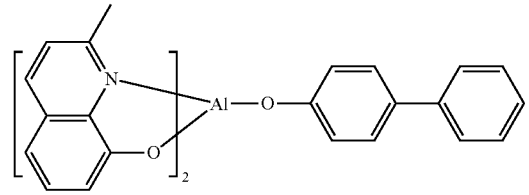 | US20060202194 |
| | 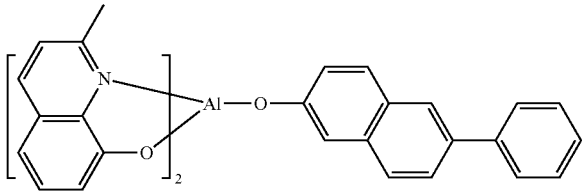 | WO2005014551 |
| | 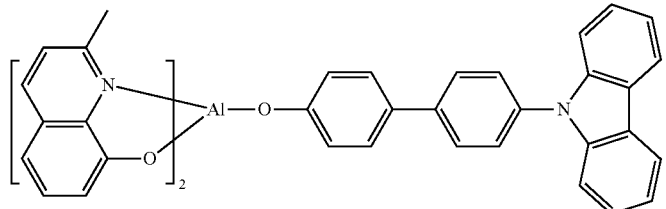 | WO2006072002 |
| Metal phenoxybenzothiazole compounds | 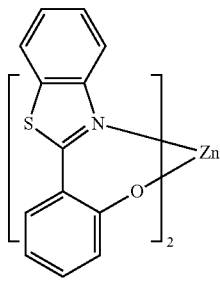 | Appl. Phys. Lett. 90, 123509 (2007) |
| Conjugated oligomers and polymers (e.g., polyfluorene) | 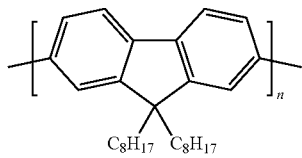 | Org. Electron. 1, 15 (2000) |

TABLE 3-continued
| MATERIAL | EXAMPLES OF MATERIAL | PUBLICATIONS |
|---|---|---|
| Aromatic fused rings | 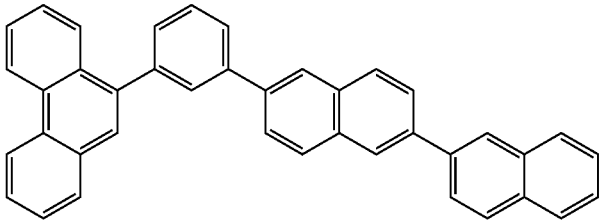 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 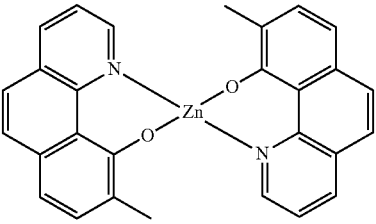 | WO2010056066 |
| Chrysene based compounds | 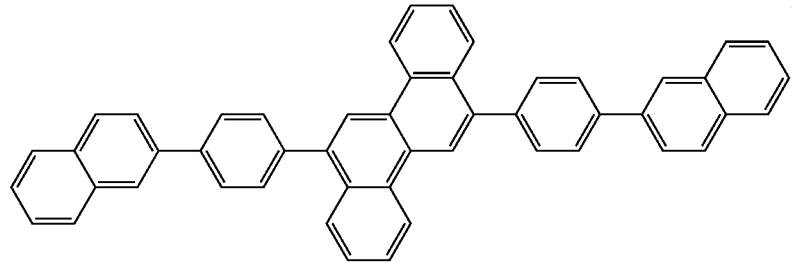 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
Green hosts
| | | |
|---|---|---|
| Arylcarbazoles | 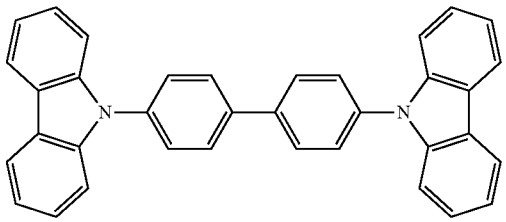 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 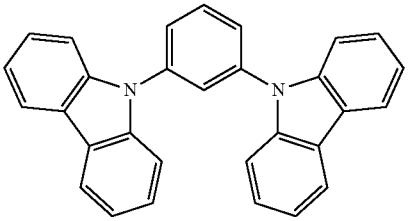 [SMILES: c1cc(-n2c3ccccc3c3ccccc32)cc(-n2c3ccccc3c3ccccc32)c1] | US20030175553 |
| | 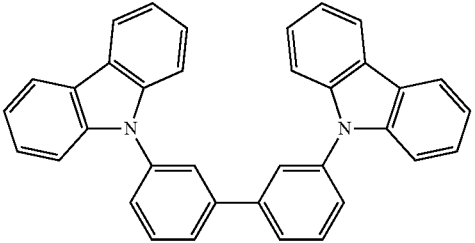 [SMILES: c1cc(-c2cccc(-n3c4ccccc4c4ccccc43)c2)cc(-n2c3ccccc3c3ccccc32)c1] | WO2001039234 |

TABLE 3-continued
| MATERIAL | EXAMPLES OF MATERIAL | PUBLICATIONS |
|---|---|---|
| Aryltriphenylene compounds | 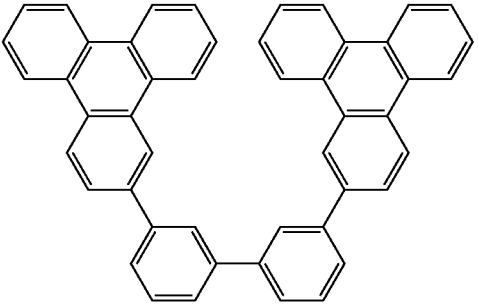 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 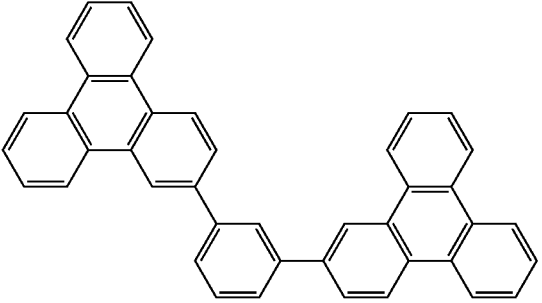 [SMILES: c1cc(-c2ccc3c4ccccc4c4ccccc4c3c2)cc(-c2ccc3c4ccccc4c4ccccc4c3c2)c1] | US20060280965 |
| | 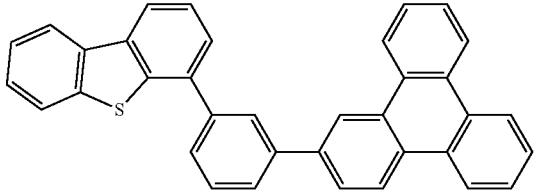 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 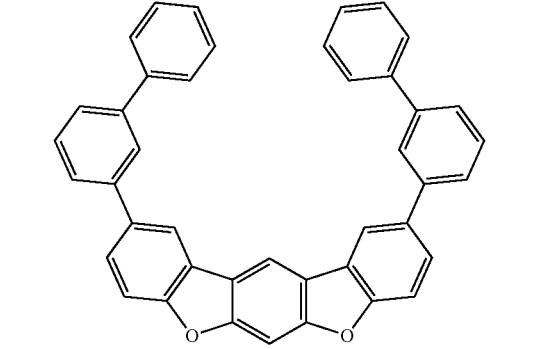 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 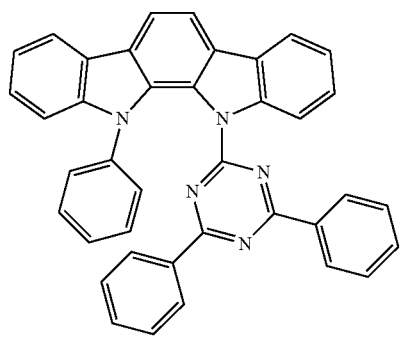 [SMILES: c1ccc(-c2nc(-c3ccccc3)nc(-n3c4ccccc4c4ccc5c6ccccc6n(-c6ccccc6)c5c43)n2)cc1] | WO2008056746 |

TABLE 3-continued
| MATERIAL | EXAMPLES OF MATERIAL | PUBLICATIONS |
|---|---|---|
| | 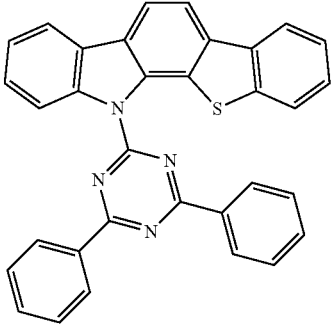 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 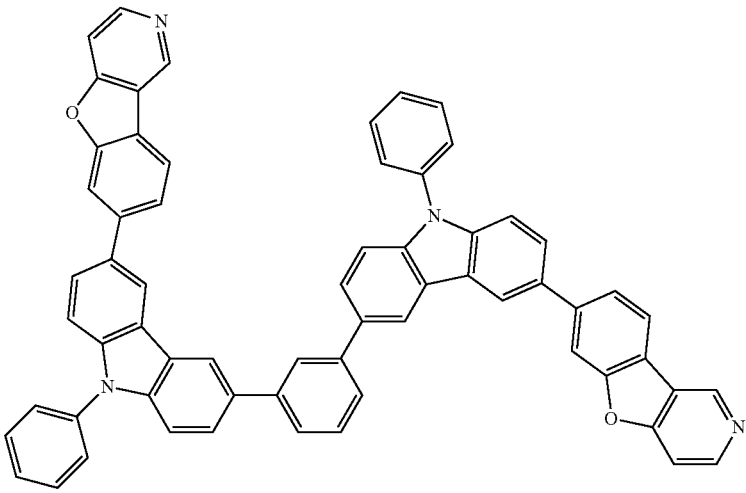 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 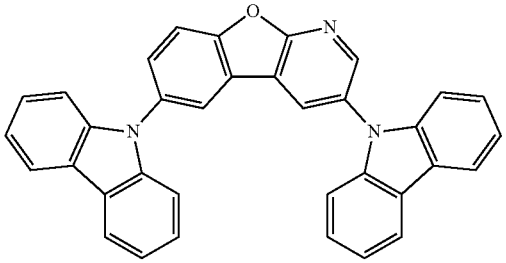 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 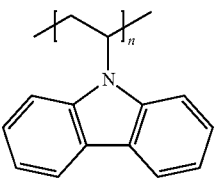 | Appl. Phys. Lett. 77 2280 (2000) |
| Spirofluorene compounds | 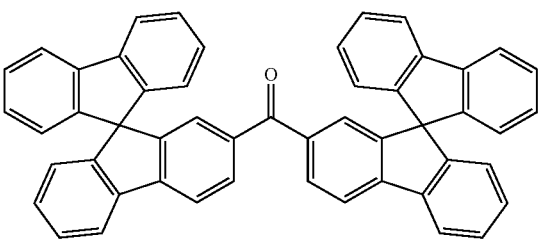 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 3-continued

| MATERIAL | EXAMPLES OF MATERIAL | PUBLICATIONS |
|---|---|---|
| Metal phenoxy-benzooxazole compounds | | WO2005089025 |
| | | WO2006132173 |
| | | JP200511610 |
| Spirofluorene-carbazole compounds | | JP2007254297 |
| | | JP2007254297 |

TABLE 3-continued

| MATERIAL | EXAMPLES OF MATERIAL | PUBLICATIONS |
|---|---|---|
| Indolocarbazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |

TABLE 3-continued

| MATERIAL | EXAMPLES OF MATERIAL | PUBLICATIONS |
| --- | --- | --- |
| Metal phenoxypyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
|  | | US20070190359 |
| Dibenzothiophene/ Dibenzofuran- carbazole compounds | | WO2006114966, US20090167162 |
|  | | US20090167162 |

TABLE 3-continued
| MATERIAL | EXAMPLES OF MATERIAL | PUBLICATIONS |
|---|---|---|
| | 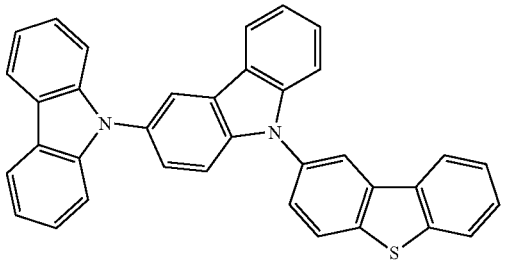 [SMILES: c1ccc2c(c1)sc1ccc(-n3c4ccccc4c4cc(-n5c6ccccc6c6ccccc65)ccc43)cc12] | WO2009086028 |
| | 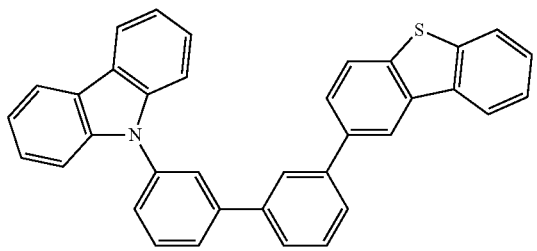 [SMILES: c1cc(-c2cccc(-n3c4ccccc4c4ccccc43)c2)cc(-c2ccc3sc4ccccc4c3c2)c1] | US20090030202, US20090017330 |
| | 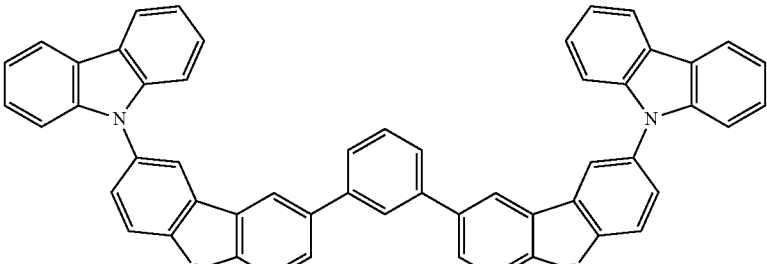 | US20106684966 |
| Silicon aryl compounds | 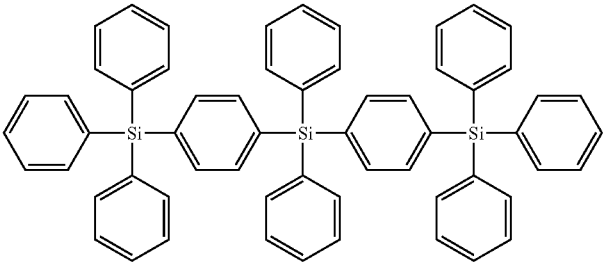 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 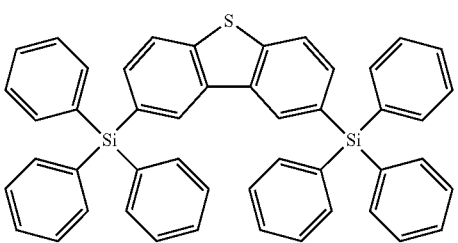 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 3-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| Carbazole linked by non-conjugated groups | | US20040115476 |
| Aza-carbazoles | | US20060121308 |
| High triplet metal organometallic complex | | U.S. Pat. No. 7,154,114 |

TABLE 3-continued

| MATERIAL | EXAMPLES OF MATERIAL | PUBLICATIONS |
| --- | --- | --- |
| | Phosphorescent dopants | |
| | Red dopants | |
| Heavy metal porphyrins (e.g., PtOEP) | | Nature 395, 151 (1998) |
| Iridium(III) organometallic complexes | | Appl. Phys. Lett. 78, 1622 (2001) |
| | | US2006835469 |
| | | US2006835469 |
| | | US20060202194 |

TABLE 3-continued

| MATERIAL | EXAMPLES OF MATERIAL | PUBLICATIONS |
| --- | --- | --- |
| | | US20060202194 |
| | | US20070087321 |
| | | US20080261076<br>US20100090591 |
| | | US20070087321 |
| | | Adv. Mater. 19, 739 (2007) |

TABLE 3-continued
| MATERIAL | EXAMPLES OF MATERIAL | PUBLICATIONS |
|---|---|---|
| | 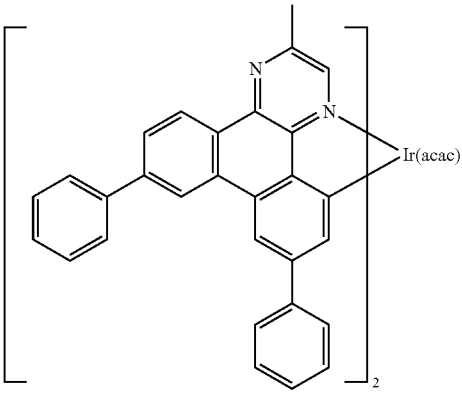 | WO2009100991 |
| | 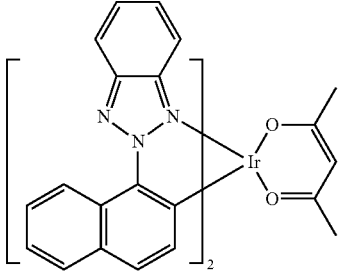 | WO2008101842 |
| | 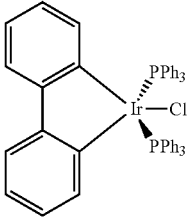 | U.S. Pat. No. 7,232,618 |
| Platinum(II) organometallic complexes | 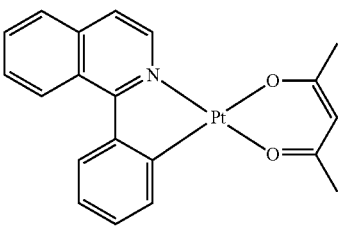 | WO2003040257 |
| | 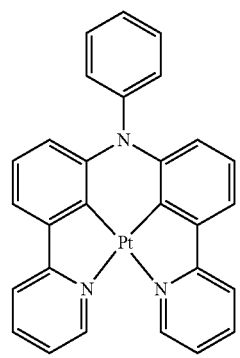 | US20070103060 |

TABLE 3-continued

| MATERIAL | EXAMPLES OF MATERIAL | PUBLICATIONS |
| --- | --- | --- |
| Osmium(III) complexes | | Chem. Mater. 17, 3532 (2005) |
| Ruthenium(II) complexes | | Adv. Mater. 17, 1059 (2005) |
| Rhenium (I), (II), and (III) complexes | | US20050244673 |

Green dopants

| | | |
| --- | --- | --- |
| Iridium(III) organometallic complexes | and its derivatives | Inorg. Chem. 40, 1704 (2001) |
| | | US20020034656 |

TABLE 3-continued
| MATERIAL | EXAMPLES OF MATERIAL | PUBLICATIONS |
|---|---|---|
| | 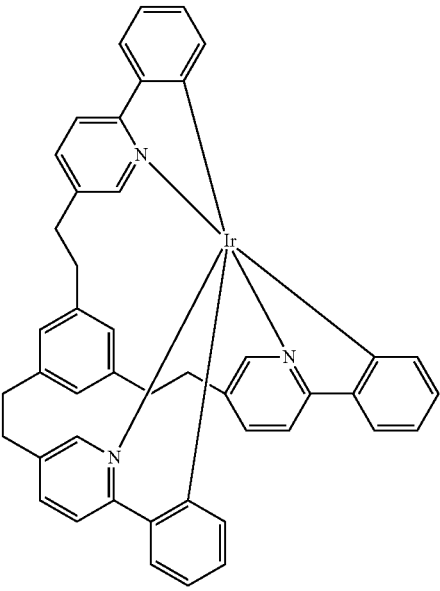 | U.S. Pat. No. 7,332,232 |
| | 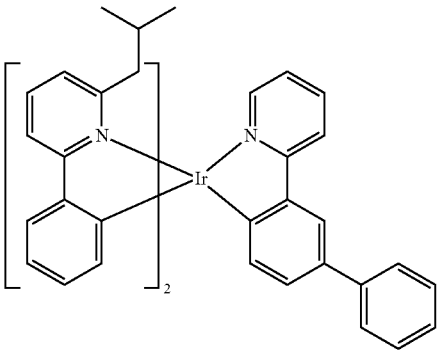 | US20090108737 |
| | 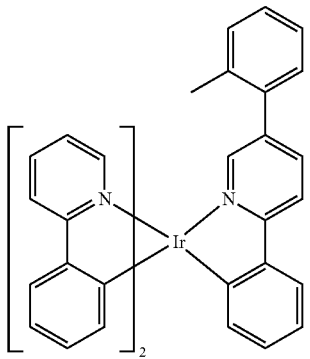 | WO2010028151 |

TABLE 3-continued

| MATERIAL | EXAMPLES OF MATERIAL | PUBLICATIONS |
|---|---|---|
| | | EP1841834B |
| | | US20060127696 |
| | | US20090039776 |
| | | U.S. Pat. No. 6,921,915 |
| | | US20100244004 |

| MATERIAL | EXAMPLES OF MATERIAL | PUBLICATIONS |
|---|---|---|
| | 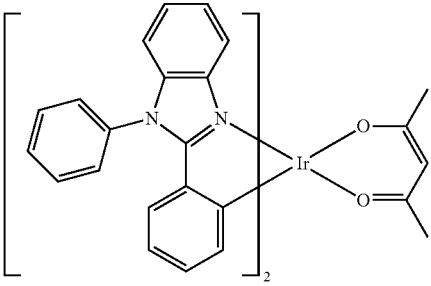 | U.S. Pat. No. 6,687,266 |
| | 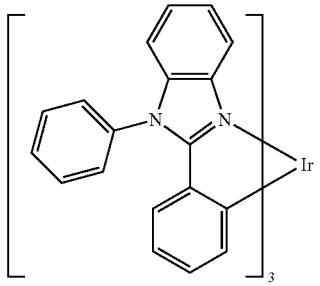 | Chem. Mater. 16, 2480 (2004) |
| | 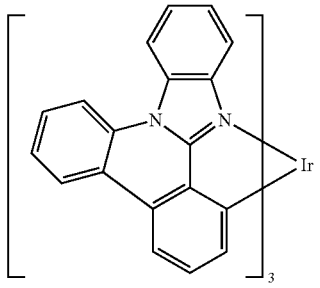 | US20070190359 |
| | 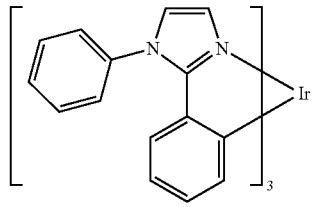 | US 20060008670 JP2007123392 |
| | 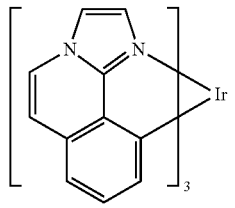 | WO2010086089, WO2011044988 |
| | 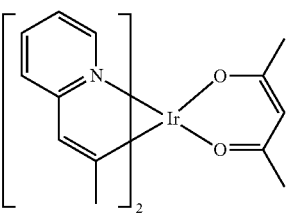 | Adv. Mater. 16, 2003 (2004) |

TABLE 3-continued
| MATERIAL | EXAMPLES OF MATERIAL | PUBLICATIONS |
|---|---|---|
| | 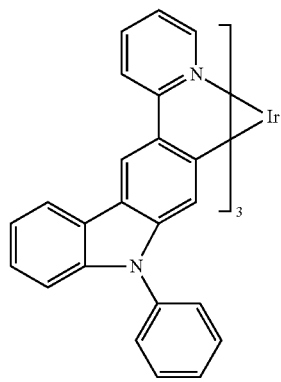 | Angew. Chem. Int. Ed. 2006, 45, 7800 |
| | 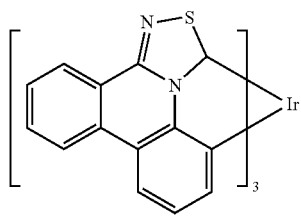 | WO2009050290 |
| | 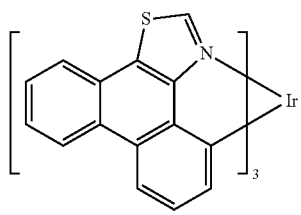 | US20090165846 |
| | 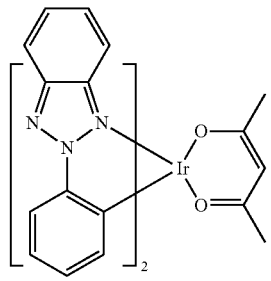 | US20080015355 |
| | 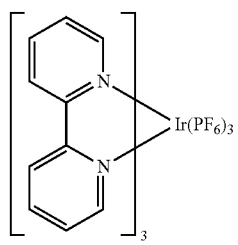 | US20010015432 |
| | 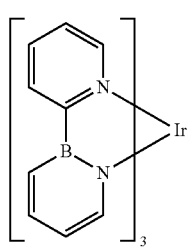 | US20100295032 |

TABLE 3-continued

| MATERIAL | EXAMPLES OF MATERIAL | PUBLICATIONS |
| --- | --- | --- |
| Monomer for polymeric metal organometallic compounds | | U.S. Pat. No. 7,250,226, U.S. Pat. No. 7,396,598 |
| Pt(II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |

TABLE 3-continued
| MATERIAL | EXAMPLES OF MATERIAL | PUBLICATIONS |
|---|---|---|
| | 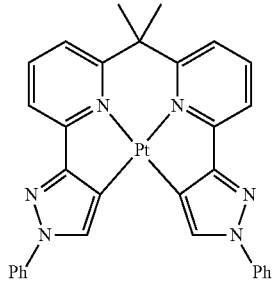 | US20060263635 |
| | 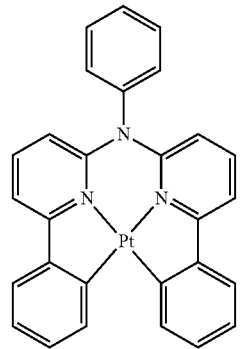 | US20060182992<br>US20070103060 |
| Cu complexes | 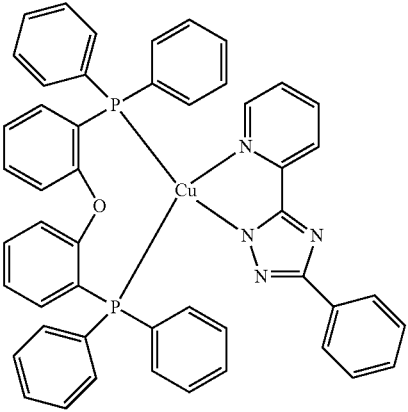 | WO2009000673 |
| | 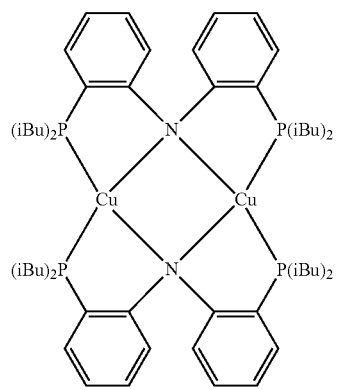 | US20070111026 |

TABLE 3-continued
| MATERIAL | EXAMPLES OF MATERIAL | PUBLICATIONS |
|---|---|---|
| Gold complexes | 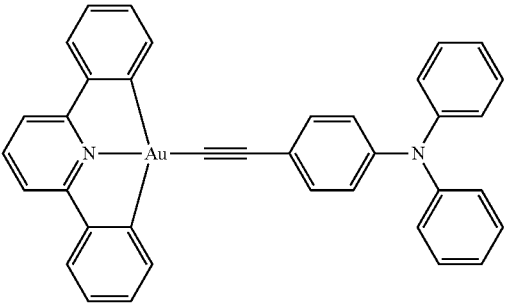 | Chem. Commun. 2906 (2005) |
| Rhenium(III) complexes | 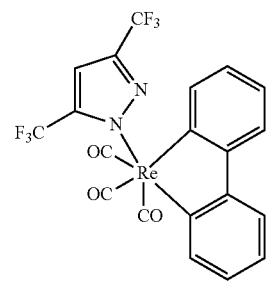 | Inorg. Chem. 42, 1248 (2003) |
| Osmium(II) complexes | 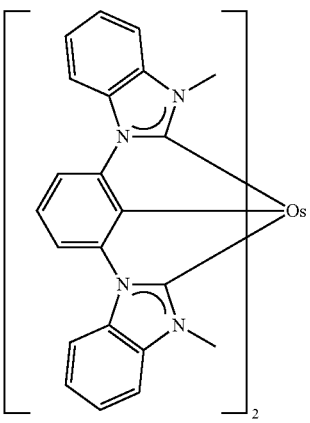 | U.S. Pat. No. 7,279,704 |
| Deuterated organometallic complexes | 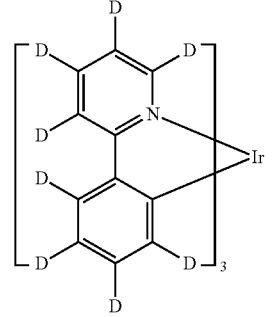 | US20030138657 |

TABLE 3-continued

| MATERIAL | EXAMPLES OF MATERIAL | PUBLICATIONS |
|---|---|---|
| Organometallic complexes with two or more metal centers | | US20030152802 |
| | | U.S. Pat. No. 7,090,928 |
| Blue dopants | | |
| Iridium(III) organometallic complexes | | WO2002002714 |
| | | WO2006009024 |
| | | US20060251923<br>US20110057559<br>US20110204333 |

TABLE 3-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | WO2011051404 |
| | | U.S. Pat. No. 7,445,855 |
| | | US20070190359, US20080297033 US20100148663 |

US 9,455,412 B2
109 110
TABLE 3-continued
| MATERIAL | EXAMPLES OF MATERIAL | PUBLICATIONS |
|---|---|---|
| | 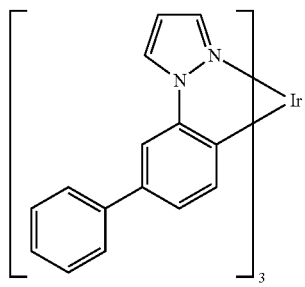 | U.S. Pat. No. 7,338,722 |
| | 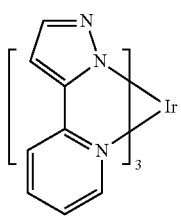 | US20020134984 |
| | 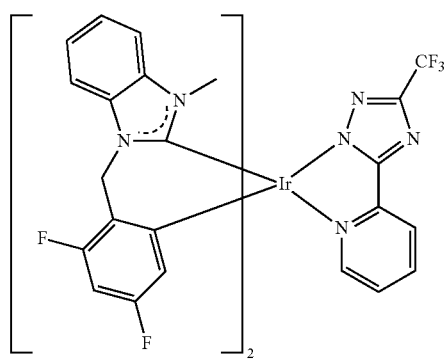 | Angew. Chem. Int. Ed. 47, 4542 (2008) |
| | 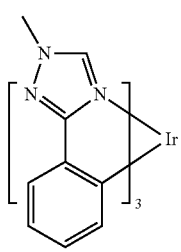 | Chem. Mater. 18, 5119 (2006) |
| | 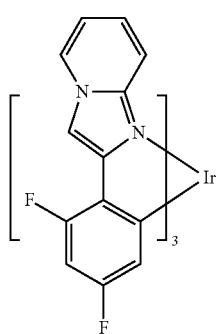 | Inorg. Chem. 46, 4308 (2007) |

TABLE 3-continued

| MATERIAL | EXAMPLES OF MATERIAL | PUBLICATIONS |
| --- | --- | --- |
| | | WO2005123873 |
| | | WO2005123873 |
| | | WO2007004380 |
| | | WO2006082742 |
| Osmium(II) complexes | | U.S. Pat. No. 7,279,704 |

TABLE 3-continued

| MATERIAL | EXAMPLES OF MATERIAL | PUBLICATIONS |
|---|---|---|
| | | Organometallics 23, 3745 (2004) |
| Gold complexes | | Appl. Phys. Lett. 74, 1361 (1999) |
| Platinum(II) complexes | | WO2006098120, WO2006103874 |
| Pt tetradentate complexes with at least one metal-carbene bond | | U.S. Pat. No. 7,655,323 |
| Exciton/hole blocking layer materials | | |
| Bathocuprine compounds (e.g., BCP, BPhen) | | Appl. Phys. Lett. 75, 4 (1999) |
| | | Appl. Phys. Lett. 79, 449 (2001) |
| Metal 8-hydroxy-quinolates (e.g., BAlq) | | Appl. Phys. Lett. 81, 162 (2002) |

TABLE 3-continued
| MATERIAL | EXAMPLES OF MATERIAL | PUBLICATIONS |
|---|---|---|
| 5-member ring electron deficient heterocycles such as triazole, oxadiazole, imidazole, benzoimidazole | 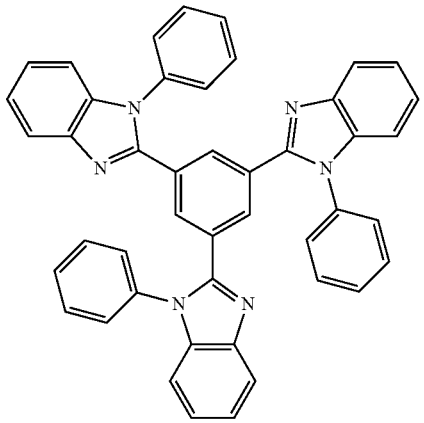 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 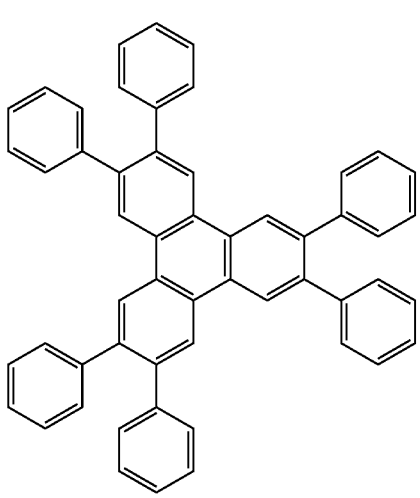 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 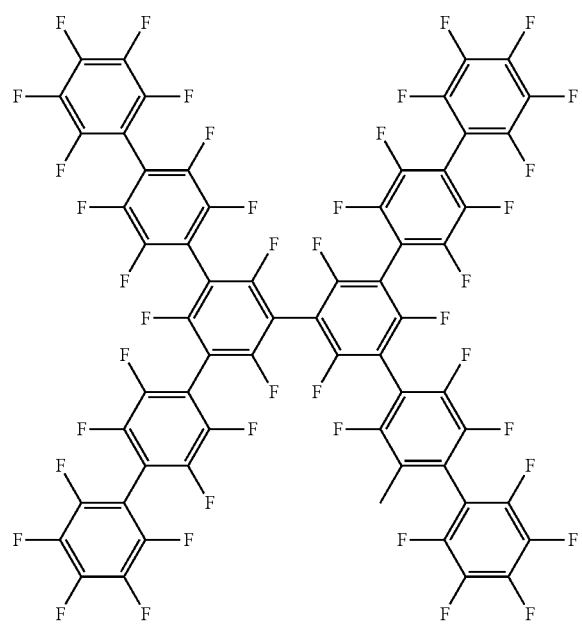 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |

TABLE 3-continued
| MATERIAL | EXAMPLES OF MATERIAL | PUBLICATIONS |
|---|---|---|
| Phenothiazine-S-oxide | 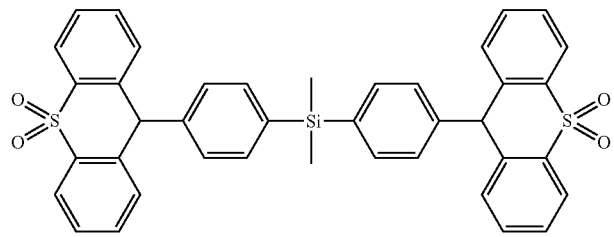 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzo-heterocycles | 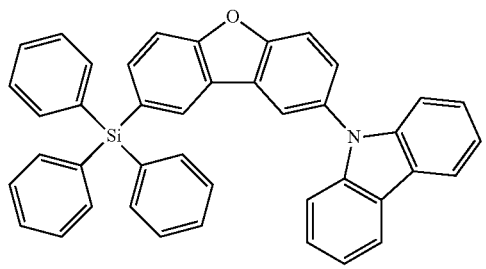 [SMILES: c1ccc([Si](c2ccccc2)(c2ccccc2)c2ccc3oc4ccc(-n5c6ccccc6c6ccccc65)cc4c3c2)cc1] | WO2010079051 |
| Aza-carbazoles | 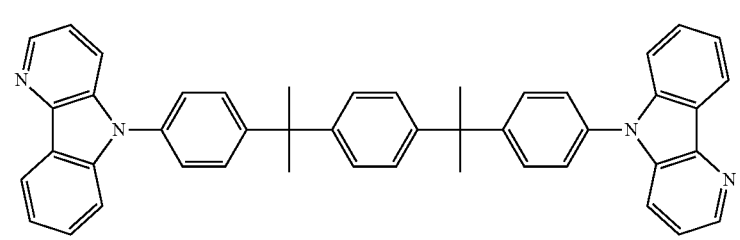 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 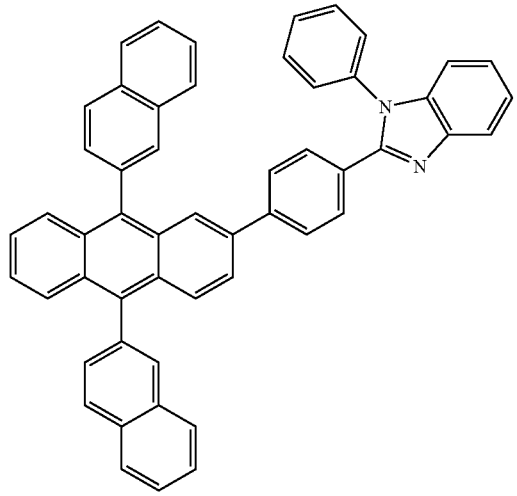 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 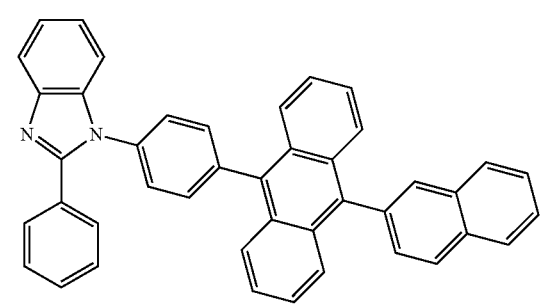 [SMILES: c1ccc(-c2nc3ccccc3n2-c2ccc(-c3c4ccccc4c(-c4ccc5ccccc5c4)c4ccccc34)cc2)cc1] | US20090179554 |

TABLE 3-continued

| MATERIAL | EXAMPLES OF MATERIAL | PUBLICATIONS |
| --- | --- | --- |
| Aza triphenylene derivatives | | US20090115316 |
| Anthracene-benzothiazole compounds | | Appl. Phys. Lett. 89, 063504 (2006) |
| Metal 8-hydroxyquinolates (e.g., $Alq_3$, $Zrq_4$) | | Appl. Phys. Lett. 51, 913 (1987)<br>U.S. Pat. No. 7,230,107 |
| Meta hydroxybenzoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |

TABLE 3-continued
| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | 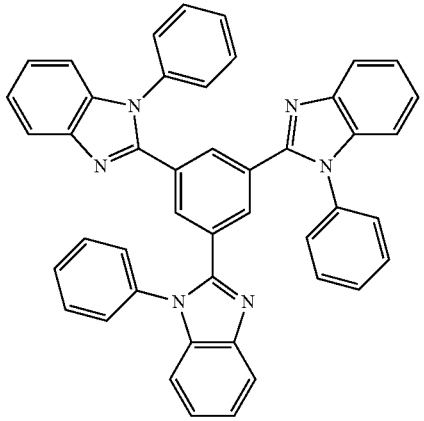 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 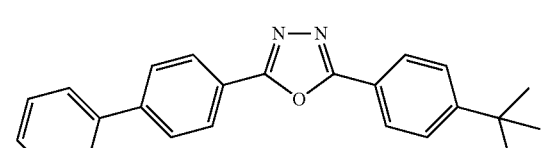 | Appl. Phys. Lett. 55, 1489 (1989) |
| | 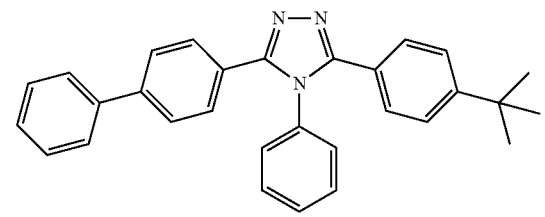 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 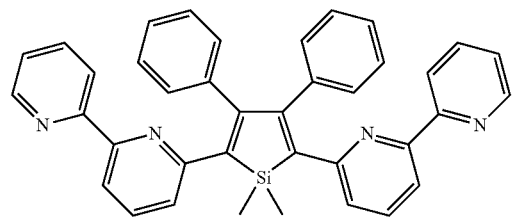 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 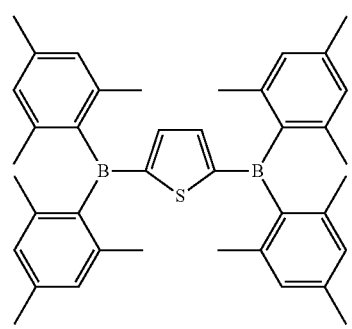 [SMILES: Cc1cc(C)c(B(c2ccc(B(c3c(C)cc(C)cc3C)c3c(C)cc(C)cc3C)s2)c2c(C)cc(C)cc2C)c(C)c1] | J. Am. Chem. Soc. 120, 9714 (1998) |

TABLE 3-continued

| MATERIAL | EXAMPLES OF MATERIAL | PUBLICATIONS |
|---|---|---|
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

EXPERIMENTAL

Chemical abbreviations used throughout this document are as follows: SPhos is dicyclohexyl(2',6'-dimethoxy-[1,1'-biphenyl]-2-yl)phosphine, $Pd_2(dba)_3$ is tri(dibenzylideneacetone)dipalladium(0), and tert-BuONa is sodium tert-butoxide.

Synthesis of Compound 1

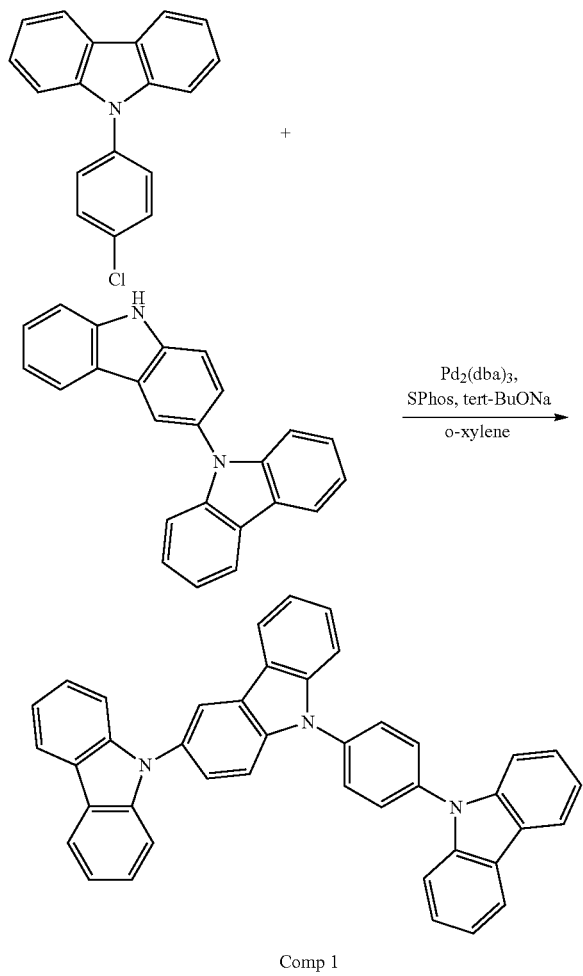

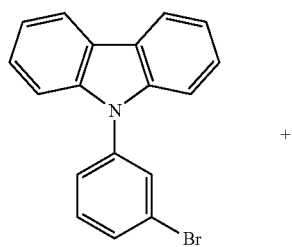

A solution of 9-(4-chlorophenyl)-9H-carbazole (2.6 g, 9.36 mmol), 9H-3,9'-bicarbazole (3.17 g, 9.55 mmol), $Pd_2(dba)_3$ (0.26 g, 0.28 mmol), SPhos (0.46 g, 1.12 mmol), and tert-BuONa (1.80 g, 17.72 mmol) in xylene (230 ml) was refluxed under nitrogen overnight. After cooling to room temperature, the solids were filtered off and the solvent was evaporated. The residue was purified by column chromatography on silica gel with heptane/$CH_2Cl_2$ (4/1 to 3/1, v/v) as eluent to yield Compound 1 (Comp 1) (2.6 g, 48%) as a white solid.

Synthesis of Compound 13

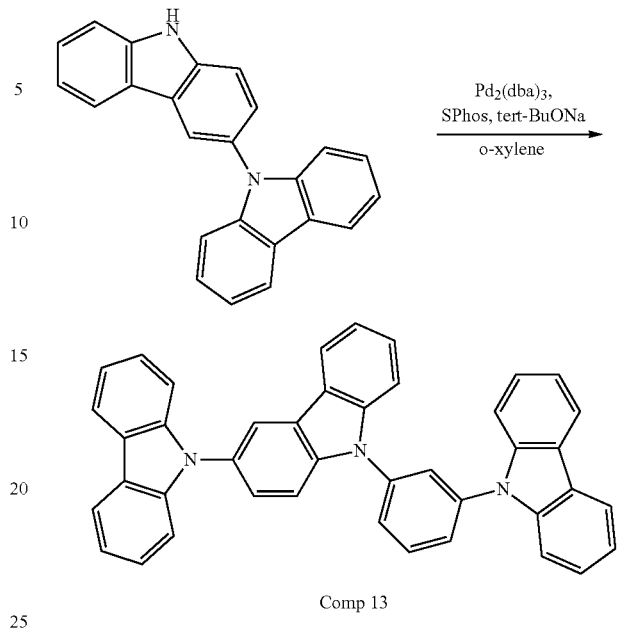

A solution of 9-(3-bromophenyl)-9H-carbazole (2.75 g, 8.54 mmol), 9H-3,9'-bicarbazole (3.18 g, 9.56 mmol), $Pd_2(dba)_3$ (0.23 g, 0.26 mmol), SPhos (0.21 g, 0.51 mmol) and tert-BuONa (1.89 g, 19.63 mmol) in o-xylene (100 ml) was refluxed under nitrogen overnight. After cooling to room temperature, the solids were filtered off and the solvent was evaporated. The residue was purified by column chromatography on silica gel with heptane/$CH_2Cl_2$ (85/15, v/v) as eluent to yield Compound 13 (Comp 13) (4.80 g, 98%) as a white solid.

Synthesis of Compound 193

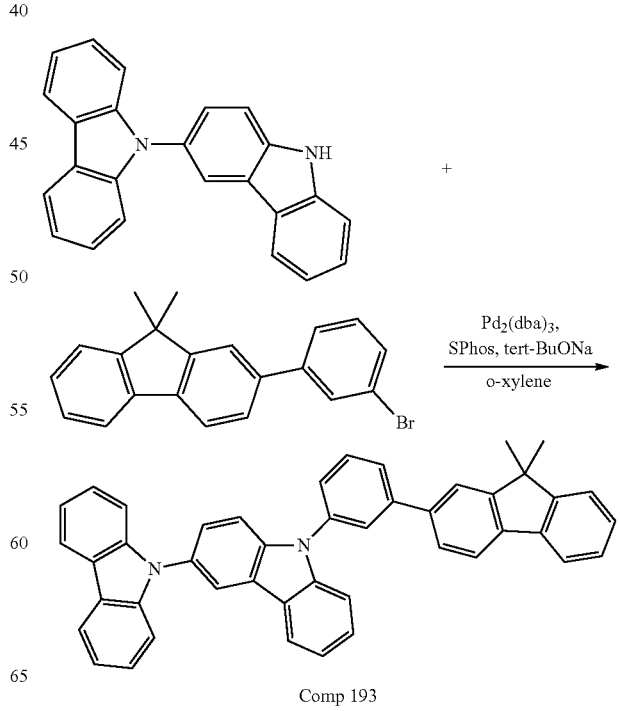

A solution of 9H-3,9'-bicarbazole (3.00 g, 9.03 mmol), 2-(3-bromophenyl)-9,9-dimethyl-9H-fluorene (2.87 g, 8.20 mmol), Pd$_2$(dba)$_3$ (0.15 g, 0.16 mmol), SPhos (0.14 g, 0.33 mmol), and tert-BuONa (2.37 g, 24.61 mmol) in o-xylene (50 ml) was refluxed under nitrogen overnight. After cooling to room temperature, it was filtered through a short plug of Celite® (Sigma-Aldrich, St. Louis, Mo.), and the solvent was evaporated. The residue was purified by column chromatography on silica gel with heptane/CH$_2$Cl$_2$ (9/1 to 85/15, v/v) as eluent to yield Compound 193 (Comp 193) (3.85 g, 78%) as a white solid.

Synthesis of CC-2

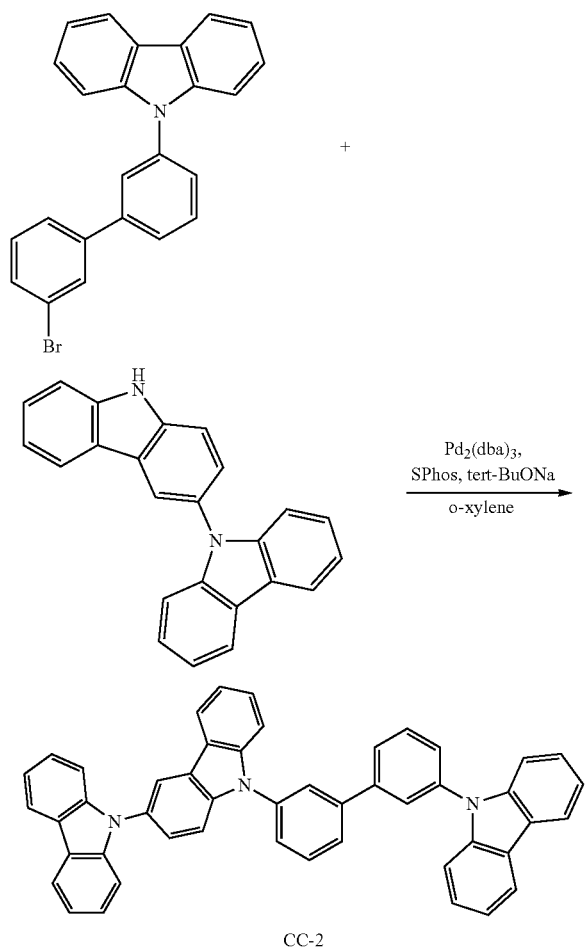

CC-2

A solution of 9-(3'-bromo-[1,1'-biphenyl]-3-yl)-9H-carbazole (3.0 g, 7.53 mmol), 9H-3,9'-bicarbazole (2.80 g, 8.44 mmol), Pd$_2$(dba)$_3$ (0.21 g, 0.23 mmol), SPhos (0.37 g, 0.90 mmol), and tert-BuONa (1.45 g, 15.06 mmol) in o-xylene (300 ml) was refluxed under nitrogen overnight. After cooling to room temperature, the solids were filtered off and the solvent was evaporated. The residue was purified by column chromatography on silica gel with heptane/toluene (65/35 to 60/40, v/v) as eluent to yield CC-2 (3.89 g, 79%) as a white solid.

Synthesis of CC-3

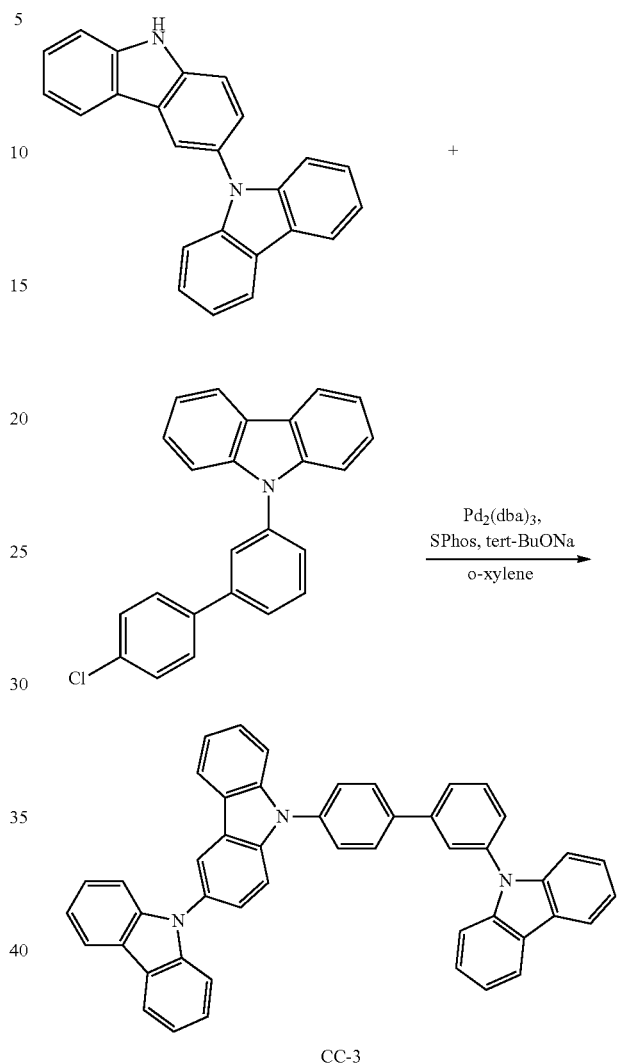

CC-3

A solution of 9H-3,9'-bicarbazole (3.0 g, 9.03 mmol), 9-(4'-chloro-[1,1'-biphenyl]-3-yl)-9H-carbazole (2.90 g, 8.20 mmol), Pd$_2$(dba)$_3$ (0.150 g, 0.16 mmol), SPhos (0.13 g, 0.33 mmol), and tert-BuONa (2.37 g, 24.61 mmol) in o-xylene (100 ml) was refluxed under nitrogen overnight. The solid was collected by filtration, washed with toluene, redissolved in boiling toluene, and filtered through a short plug of silica gel. The crude product was recrystallized from toluene to yield CC-3 (4.60 g, 86%) as a white solid.

Computation

Compounds were subjected to computational investigation using the Gaussian G09, Revision C.01 at the B3LYP/6-31g(d) functional and basis set to evaluate the bond energy of the selected C—N bonds. The computational results for the C—N bonds designated with an arrow in Comp 1 and CC-1 were presented in TABLE 4.

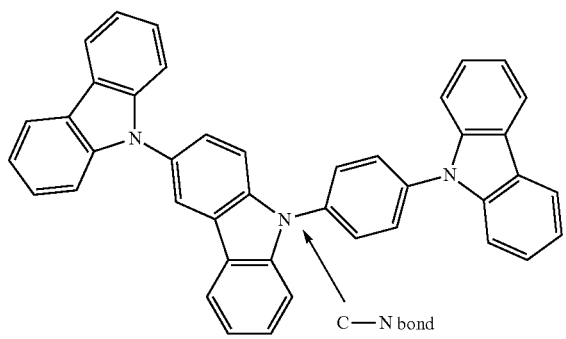

Comp 1

C—N bond

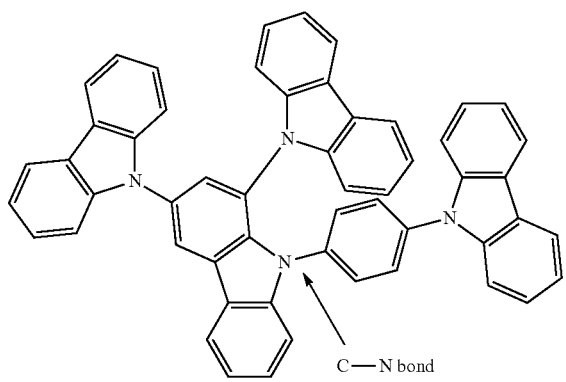

CC-1

C—N bond

TABLE 4

| Compound | C—N bond energy, kcal/mol |
|---|---|
| CC-1 | 81 |
| Comp 1 | 85 |

It was found that the designated C—N bond energy of Comp 1 is significantly greater than that of CC-1. The decrease of bond energy in CC-1 might be attributable to the increased steric hindrance due to the additional carbazole substitution. A greater bond energy in the inventive compounds implies that these compounds less likely to dissociate, i.e., more stable compounds.

Device Examples

All devices were fabricated by high vacuum (~$10^{-7}$ Torr) thermal evaporation. The anode electrode was 120 nm of indium tin oxide (ITO). The cathode electrode consisted of 1 nm of LiF followed by 100 nm of Al. All devices were encapsulated with a glass lid sealed with an epoxy resin in a nitrogen glove box (<1 ppm of $H_2O$ and $O_2$) immediately after fabrication, and a moisture getter was incorporated inside the package.

All device examples had organic stacks consisting of, sequentially, from the ITO surface, 10 nm of Compound A as the hole injection layer (HIL), 30 nm of 4,4'-bis[N-(1-naphthyl)-N-phenylaminolbiphenyl (NPD) as the hole-transport layer (HTL), and 30 nm of inventive hosts (Comp 1, Comp 13, or Comp 193) or comparative hosts (CC-2, CC-3, CC-4, or CC-5) doped with 10 wt % of Compound A as the emissive layer (EML). On top of the EML, 5 nm of Compound BL was deposited as the hole blocking layer (HBL), followed by 45 nm of tris(8-hydroxyquinolinato) aluminum ($Alq_3$) as the electron-transport layer (ETL).

The chemical structures of the compounds used in the devices are as follows:

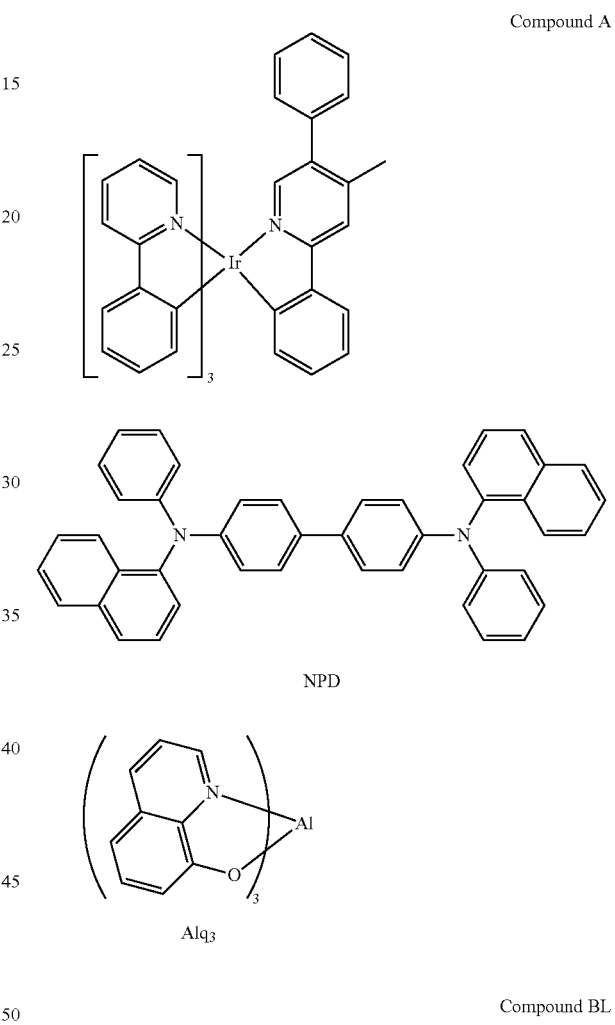

Compound A

NPD $Alq_3$

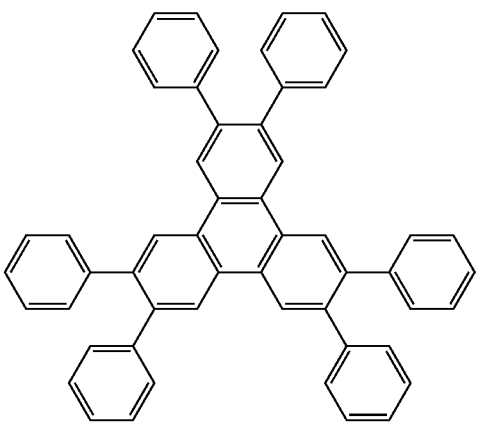

Compound BL

CC-2

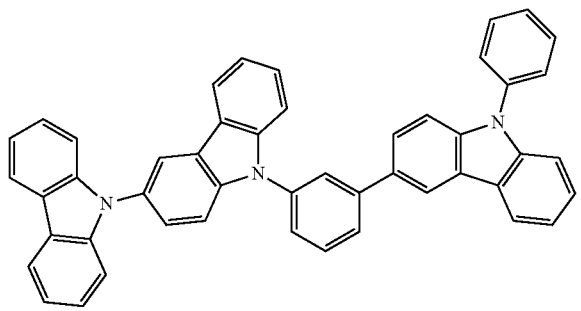

CC-3

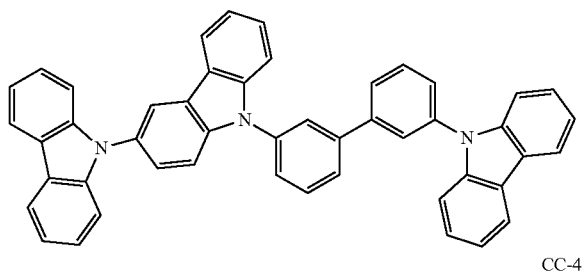

CC-4

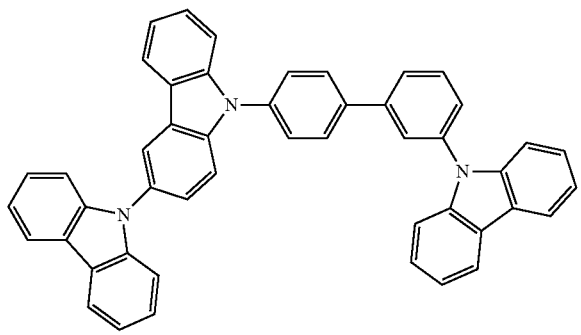

CC-5

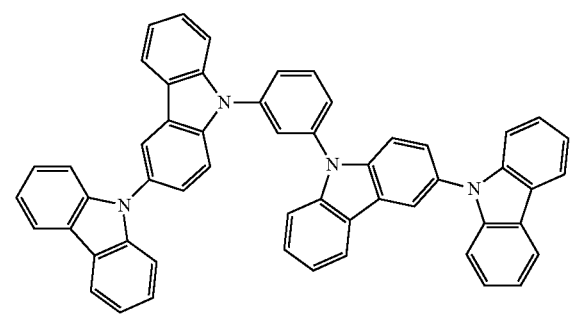

TABLE 5 provides a summary of the relative device data, providing emission color, external quantum efficiency (EQE), and driving voltage (V) where EQE and V were recorded at 10 mA/cm². All device data are normalized on those of comparative Device C-1.

TABLE 5

| Device | Host | Color | EQE, % @ 10 mA/cm² | V @ 10 mA/cm² |
|---|---|---|---|---|
| Device C-1 | CC-2 | GREEN | 100 | 100 |
| Device C-2 | CC-3 | GREEN | 92 | 101 |
| Device C-3 | CC-4 | GREEN | 87 | 114 |

TABLE 5-continued

| Device | Host | Color | EQE, % @ 10 mA/cm² | V @ 10 mA/cm² |
|---|---|---|---|---|
| Device C-4 | CC-5 | GREEN | 85 | 119 |
| Device 1 | Comp 1 | GREEN | 121 | 83 |
| Device 2 | Comp 13 | GREEN | 115 | 89 |

All devices emit green color. Compared to the comparative Devices C-1, C-2, C-3, and C-4 using CC-2, CC-3, CC-4, and CC-5, respectively, as the hosts, Devices 1 and 2 which have inventive Comp 1 and Comp 13, respectively, as hosts, show improved efficiency albeit at a lower driving voltage. This enhanced device performance might be attributable to improved charge balance, owing to the unique chemical structures of the invented compounds, which are unexpected.

Device C-4, which used the symmetric host CC-5, showed an EQE of 85 compared to Devices 1 and 2, which used the asymmetric hosts Comp 1 and Comp 13, respectively, and showed EQEs of 121 and 115, respectively. Therefore, devices containing the two asymmetric hosts showed improved efficiency over a comparative device using a symmetric host.

Additionally, devices CC-3 and CC-4, which used a biphenyl linkage showed EQEs of 92 and 87, respectively, which was much lower than the efficiency of Devices 1 and 2 which contained hosts with phenyl linkages.

Comp 193 was also evaluated in OLEDs and the relative device performance data, which were normalized on those of Device C-1, were presented in TABLE 6.

TABLE 6

| Device | Host | Color | EQE, % @ 10 mA/cm² | V @ 10 mA/cm² |
|---|---|---|---|---|
| Device 3 | Comp 193 | GREEN | 107 | 90 |

It was found that Comp 193 performs excellently as a host in OLEDs. Compared to the comparative Devices C-1, C-2, C-3, and C-4 using CC-2, CC-3, CC-4, and CC-5, respectively, as the hosts, Device 3 which has inventive Comp 193 as host, showed improved efficiency albeit at a lower driving voltage.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A compound having the formula:

A-L-B       (I);

wherein A is

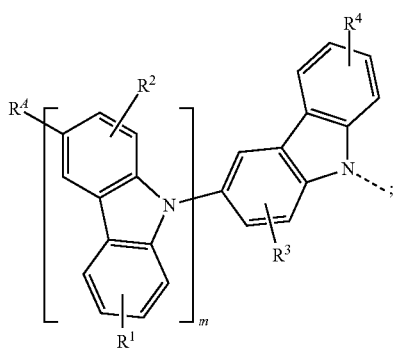

(II)

wherein B is selected from the group consisting of

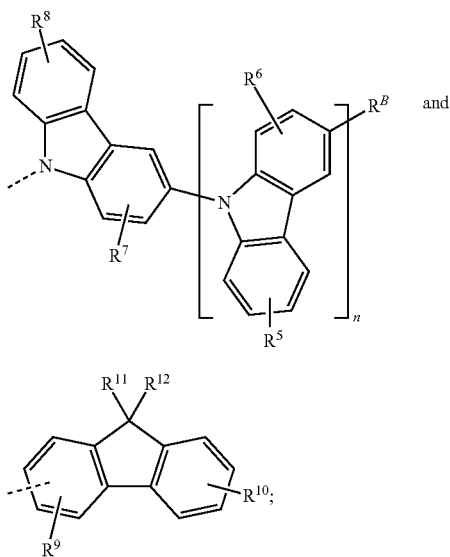

wherein L is a phenyl, which is optionally substituted with 1, 2, 3, or 4 deuterium;
wherein $R^1$, $R^4$, $R^5$, $R^8$, and $R^{10}$ each independently represent mono, di, tri, tetra substitutions, or no substitution;
wherein $R^2$, $R^3$, $R^6$, $R^7$, and $R^9$ each independently represent mono, di, tri substitutions, or no substitution;
wherein $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof;
wherein $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;
wherein $R^A$ and $R^B$ are each independently selected from the group consisting of hydrogen, deuterium, aryl, and combinations thereof;
wherein $R^{11}$ and $R^{12}$ are optionally joined to form a ring;
wherein m is an integer selected from 1 to 10;
wherein n is an integer selected from 0 to 9; and
wherein if B is formula (III), then m is an integer selected from 2 to 10, and m is greater than n; or m is 1, n is 0, and at least one of $R^A$, $R^1$, $R^2$, $R^3$, and $R^4$ is phenyl.

2. The compound of claim 1, wherein $R^1$, $R^2$, $R^3$, $R^4$, $R^5$, $R^6$, $R^7$, $R^8$, $R^9$, and $R^{10}$ are each independently selected from the group consisting of hydrogen, deuterium, aryl, and combinations thereof.

3. The compound of claim 1, wherein $R^1$, $R^2$, $R^3$, $R^4$, $R^5$, $R^6$, $R^7$, $R^8$, $R^9$, and $R^{10}$ are each independently selected from the group consisting of hydrogen, deuterium, phenyl, and combinations thereof.

4. The compound of claim 1, wherein $R^A$ and $R^B$ are hydrogen.

5. The compound of claim 1, wherein $R^1$, $R^2$, $R^3$, $R^4$, $R^5$, $R^6$, $R^7$, $R^8$, $R^9$, and $R^{10}$ are hydrogen.

6. The compound of claim 1, wherein B is formula (IV) and $R^{11}$ and $R^{12}$ are alkyl.

7. The compound of claim 1, wherein B is formula (III), m is 1, n is 0, and at least one of $R^A$, $R^1$, $R^2$, $R^3$, and $R^4$ is phenyl.

8. The compound of claim 1, wherein B is formula (III), m is 2, and n is 0 or 1.

9. The compound of claim 1, wherein B is:

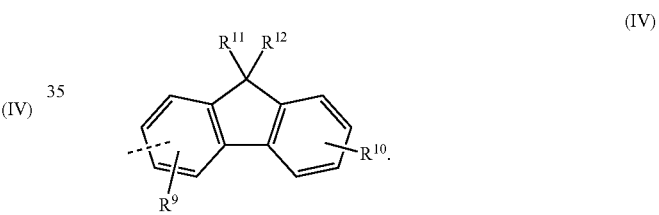

(IV)

10. The compound of claim 1, wherein A is in the 1-position and B is in the 4-position of the phenyl ring.

11. The compound of claim 1, wherein A is in the 1-position and B is in the 3-position of the phenyl ring.

12. The compound of claim 1, wherein A is selected from the group consisting of:

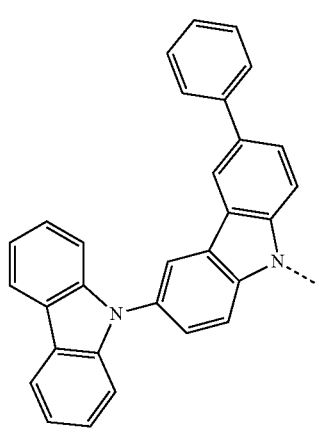

A2

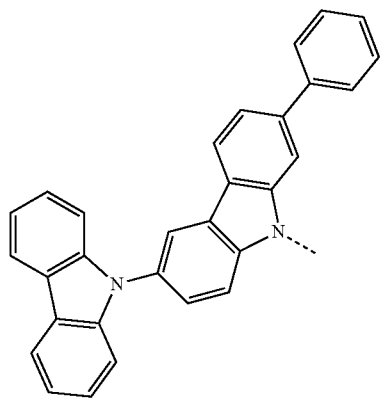
A3
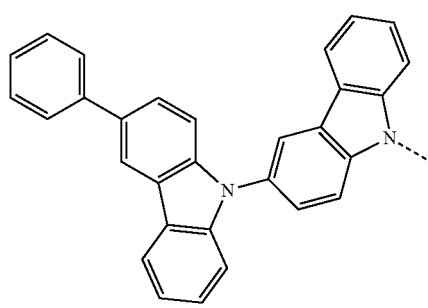
A4
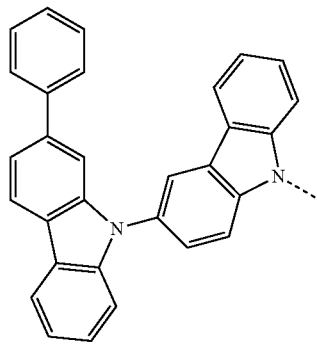
A5
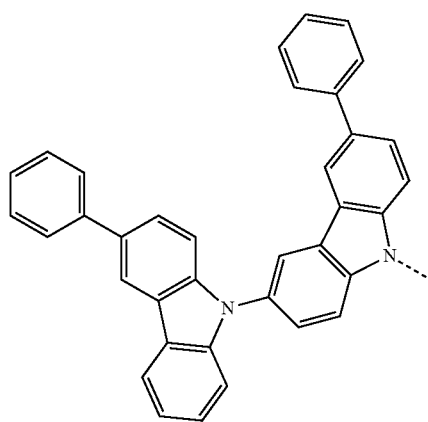
A6
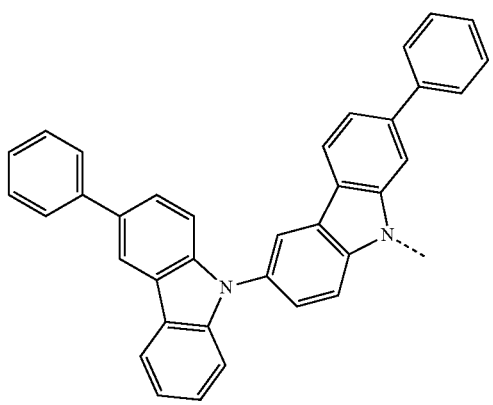
A7
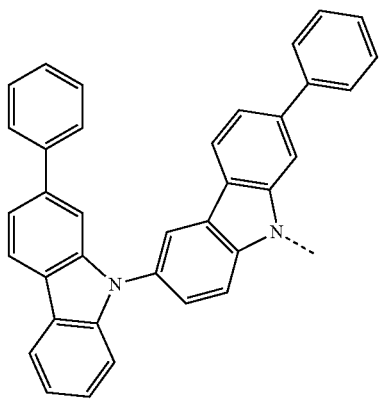
A8
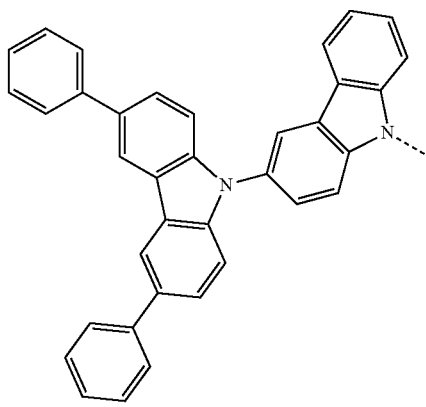
A9
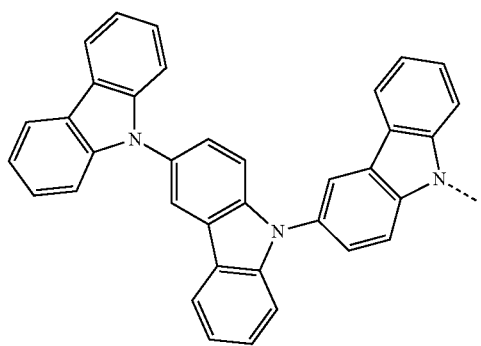
A10

-continued
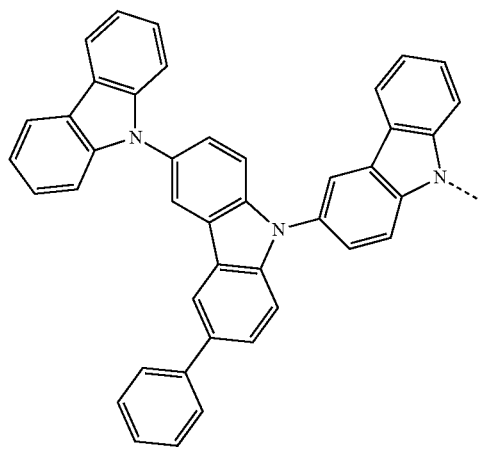
A11
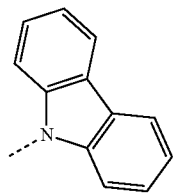
B1
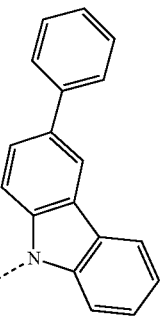
B2
and
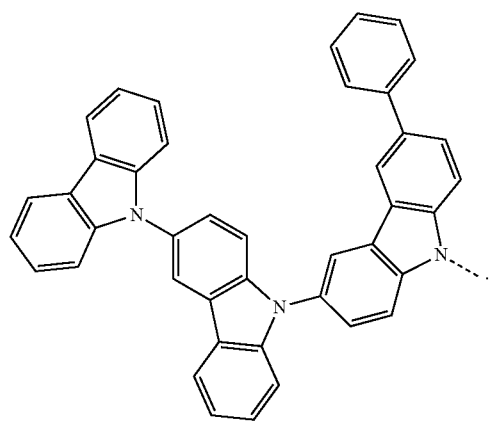
A12
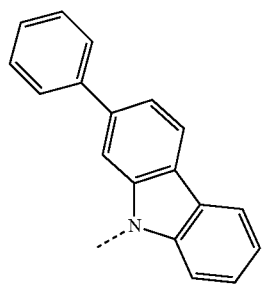
B3
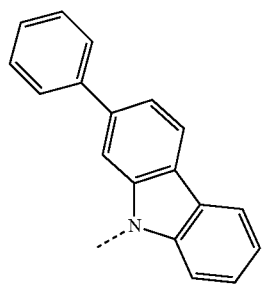
B4
13. The compound of claim 12, wherein L is selected from the group consisting of
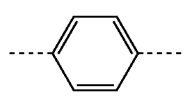
L1
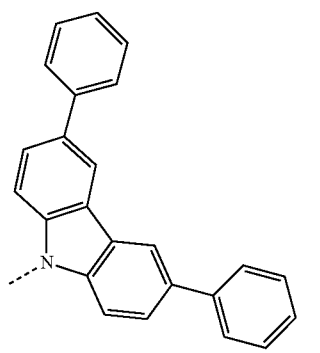
B5
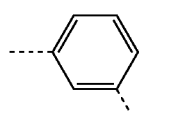
L2
and
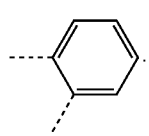
L3
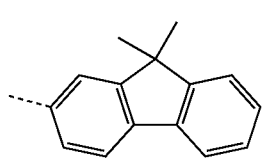
B6
14. The compound of claim 13, wherein B is selected from the group consisting of -continued
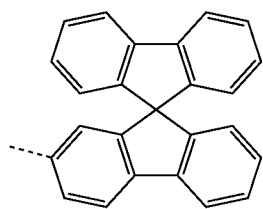
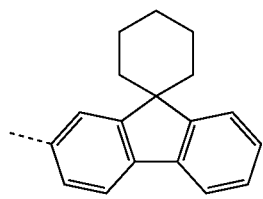
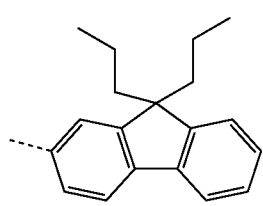
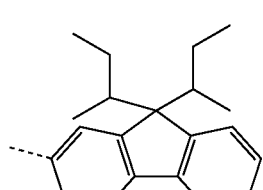
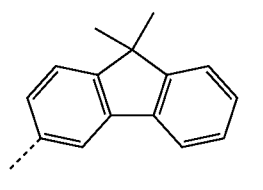
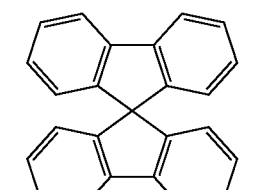
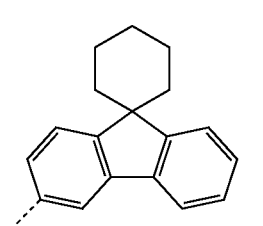
-continued
B7
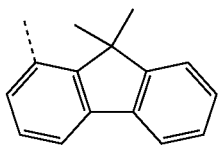
B8
B9
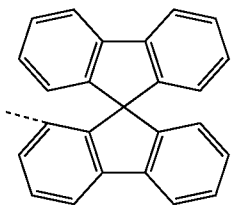
B10
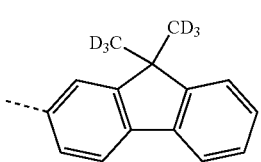
B11
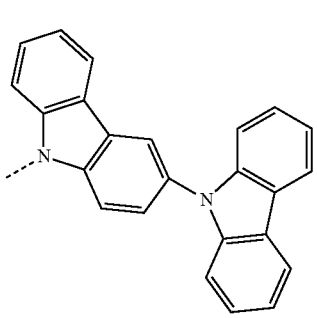
B12
B13
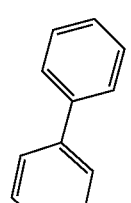
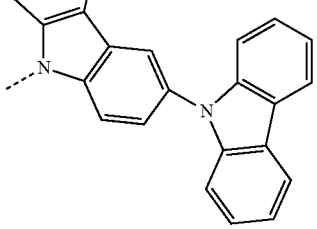
B14
B15
B16
B17
B18

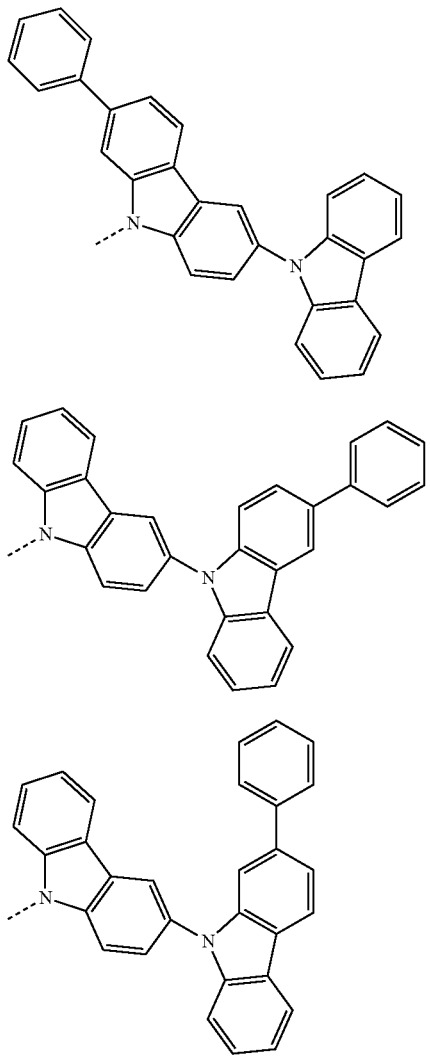

B19

B20

B21

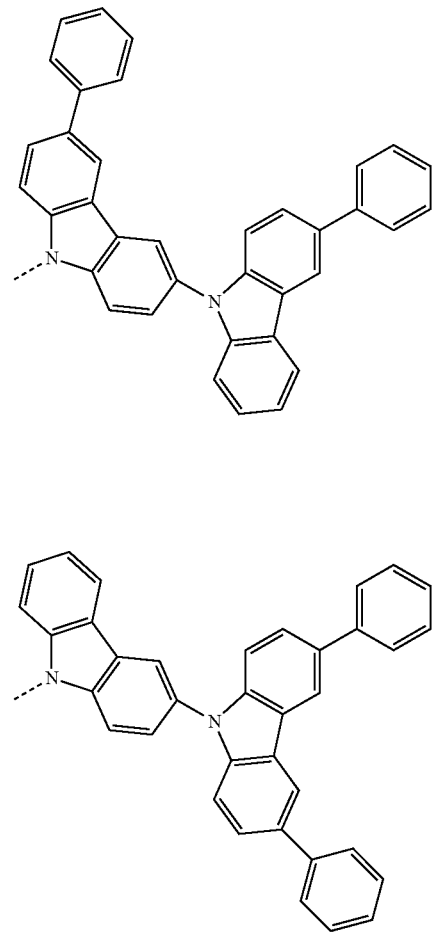

B22 and

B23

15. The compound of claim 14, wherein the compound is selected from the group consisting of:

| ID | A | L | B | ID | A | L | B | ID | A | L | B |
|---|---|---|---|---|---|---|---|---|---|---|---|
| | | | | Comp 2 | A2 | L1 | B1 | Comp 3 | A3 | L1 | B1 |
| Comp 4 | A4 | L1 | B1 | Comp 5 | A5 | L1 | B1 | Comp 6 | A6 | L1 | B1 |
| Comp 7 | A7 | L1 | B1 | Comp 8 | A8 | L1 | B1 | Comp 9 | A9 | L1 | B1 |
| Comp 10 | A10 | L1 | B1 | Comp 11 | A11 | L1 | B1 | Comp 12 | A12 | L1 | B1 |
| | | | | Comp 14 | A2 | L2 | B1 | Comp 15 | A3 | L2 | B1 |
| Comp 16 | A4 | L2 | B1 | Comp 17 | A5 | L2 | B1 | Comp 18 | A6 | L2 | B1 |
| Comp 19 | A7 | L2 | B1 | Comp 20 | A8 | L2 | B1 | Comp 21 | A9 | L2 | B1 |
| Comp 22 | A10 | L2 | B1 | Comp 23 | A11 | L2 | B1 | Comp 24 | A12 | L2 | B1 |
| | | | | Comp 26 | A2 | L3 | B1 | Comp 27 | A3 | L3 | B1 |
| Comp 28 | A4 | L3 | B1 | Comp 29 | A5 | L3 | B1 | Comp 30 | A6 | L3 | B1 |
| Comp 31 | A7 | L3 | B1 | Comp 32 | A8 | L3 | B1 | Comp 33 | A9 | L3 | B1 |
| Comp 34 | A10 | L3 | B1 | Comp 35 | A11 | L3 | B1 | Comp 36 | A12 | L3 | B1 |
| | | | | Comp 38 | A2 | L1 | B2 | Comp 39 | A3 | L1 | B2 |
| Comp 40 | A4 | L1 | B2 | Comp 41 | A5 | L1 | B2 | Comp 42 | A6 | L1 | B2 |
| Comp 43 | A7 | L1 | B2 | Comp 44 | A8 | L1 | B2 | Comp 45 | A9 | L1 | B2 |
| Comp 46 | A10 | L1 | B2 | Comp 47 | A11 | L1 | B2 | Comp 48 | A12 | L1 | B2 |
| | | | | Comp 50 | A2 | L2 | B2 | Comp 51 | A3 | L2 | B2 |
| Comp 52 | A4 | L2 | B2 | Comp 53 | A5 | L2 | B2 | Comp 54 | A6 | L2 | B2 |
| Comp 55 | A7 | L2 | B2 | Comp 56 | A8 | L2 | B2 | Comp 57 | A9 | L2 | B2 |
| Comp 58 | A10 | L2 | B2 | Comp 59 | A11 | L2 | B2 | Comp 60 | A12 | L2 | B2 |
| | | | | Comp 62 | A2 | L3 | B2 | Comp 63 | A3 | L3 | B2 |
| Comp 64 | A4 | L3 | B2 | Comp 65 | A5 | L3 | B2 | Comp 66 | A6 | L3 | B2 |
| Comp 67 | A7 | L3 | B2 | Comp 68 | A8 | L3 | B2 | Comp 69 | A9 | L3 | B2 |

-continued

| ID | A | L | B | ID | A | L | B | ID | A | L | B |
|---|---|---|---|---|---|---|---|---|---|---|---|
| Comp 70 | A10 | L3 | B2 | Comp 71 | A11 | L3 | B2 | Comp 72 | A12 | L3 | B2 |
| | | | | Comp 74 | A2 | L1 | B3 | Comp 75 | A3 | L1 | B3 |
| Comp 76 | A4 | L1 | B3 | Comp 77 | A5 | L1 | B3 | Comp 78 | A6 | L1 | B3 |
| Comp 79 | A7 | L1 | B3 | Comp 80 | A8 | L1 | B3 | Comp 81 | A9 | L1 | B3 |
| Comp 82 | A10 | L1 | B3 | Comp 83 | A11 | L1 | B3 | Comp 84 | A12 | L1 | B3 |
| | | | | Comp 86 | A2 | L2 | B3 | Comp 87 | A3 | L2 | B3 |
| Comp 88 | A4 | L2 | B3 | Comp 89 | A5 | L2 | B3 | Comp 90 | A6 | L2 | B3 |
| Comp 91 | A7 | L2 | B3 | Comp 92 | A8 | L2 | B3 | Comp 93 | A9 | L2 | B3 |
| Comp 94 | A10 | L2 | B3 | Comp 95 | A11 | L2 | B3 | Comp 96 | A12 | L2 | B3 |
| | | | | Comp 98 | A2 | L3 | B3 | Comp 99 | A3 | L3 | B3 |
| Comp 100 | A4 | L3 | B3 | Comp 101 | A5 | L3 | B3 | Comp 102 | A6 | L3 | B3 |
| Comp 103 | A7 | L3 | B3 | Comp 104 | A8 | L3 | B3 | Comp 105 | A9 | L3 | B3 |
| Comp 106 | A10 | L3 | B3 | Comp 107 | A11 | L3 | B3 | Comp 108 | A12 | L3 | B3 |
| | | | | Comp 110 | A2 | L1 | B4 | Comp 111 | A3 | L1 | B4 |
| Comp 112 | A4 | L1 | B4 | Comp 113 | A5 | L1 | B4 | Comp 114 | A6 | L1 | B4 |
| Comp 115 | A7 | L1 | B4 | Comp 116 | A8 | L1 | B4 | Comp 117 | A9 | L1 | B4 |
| Comp 118 | A10 | L1 | B4 | Comp 119 | A11 | L1 | B4 | Comp 120 | A12 | L1 | B4 |
| | | | | Comp 122 | A2 | L2 | B4 | Comp 123 | A3 | L2 | B4 |
| Comp 124 | A4 | L2 | B4 | Comp 125 | A5 | L2 | B4 | Comp 126 | A6 | L2 | B4 |
| Comp 127 | A7 | L2 | B4 | Comp 128 | A8 | L2 | B4 | Comp 129 | A9 | L2 | B4 |
| Comp 130 | A10 | L2 | B4 | Comp 131 | A11 | L2 | B4 | Comp 132 | A12 | L2 | B4 |
| | | | | Comp 134 | A2 | L3 | B4 | Comp 135 | A3 | L3 | B4 |
| Comp 136 | A4 | L3 | B4 | Comp 137 | A5 | L3 | B4 | Comp 138 | A6 | L3 | B4 |
| Comp 139 | A7 | L3 | B4 | Comp 140 | A8 | L3 | B4 | Comp 141 | A9 | L3 | B4 |
| Comp 142 | A10 | L3 | B4 | Comp 143 | A11 | L3 | B4 | Comp 144 | A12 | L3 | B4 |
| | | | | Comp 146 | A2 | L1 | B5 | Comp 147 | A3 | L1 | B5 |
| Comp 148 | A4 | L1 | B5 | Comp 149 | A5 | L1 | B5 | Comp 150 | A6 | L1 | B5 |
| Comp 151 | A7 | L1 | B5 | Comp 152 | A8 | L1 | B5 | Comp 153 | A9 | L1 | B5 |
| Comp 154 | A10 | L1 | B5 | Comp 155 | A11 | L1 | B5 | Comp 156 | A12 | L1 | B5 |
| | | | | Comp 158 | A2 | L2 | B5 | Comp 159 | A3 | L2 | B5 |
| Comp 160 | A4 | L2 | B5 | Comp 161 | A5 | L2 | B5 | Comp 162 | A6 | L2 | B5 |
| Comp 163 | A7 | L2 | B5 | Comp 164 | A8 | L2 | B5 | Comp 165 | A9 | L2 | B5 |
| Comp 166 | A10 | L2 | B5 | Comp 167 | A11 | L2 | B5 | Comp 168 | A12 | L2 | B5 |
| | | | | Comp 170 | A2 | L3 | B5 | Comp 171 | A3 | L3 | B5 |
| Comp 172 | A4 | L3 | B5 | Comp 173 | A5 | L3 | B5 | Comp 174 | A6 | L3 | B5 |
| Comp 175 | A7 | L3 | B5 | Comp 176 | A8 | L3 | B5 | Comp 177 | A9 | L3 | B5 |
| Comp 178 | A10 | L3 | B5 | Comp 179 | A11 | L3 | B5 | Comp 180 | A12 | L3 | B5 |
| Comp 181 | A1 | L1 | B6 | Comp 182 | A2 | L1 | B6 | Comp 183 | A3 | L1 | B6 |
| Comp 184 | A4 | L1 | B6 | Comp 185 | A5 | L1 | B6 | Comp 186 | A6 | L1 | B6 |
| Comp 187 | A7 | L1 | B6 | Comp 188 | A8 | L1 | B6 | Comp 189 | A9 | L1 | B6 |
| Comp 190 | A10 | L1 | B6 | Comp 191 | A11 | L1 | B6 | Comp 192 | A12 | L1 | B6 |
| Comp 193 | A1 | L2 | B6 | Comp 194 | A2 | L2 | B6 | Comp 195 | A3 | L2 | B6 |
| Comp 196 | A4 | L2 | B6 | Comp 197 | A5 | L2 | B6 | Comp 198 | A6 | L2 | B6 |
| Comp 199 | A7 | L2 | B6 | Comp 200 | A8 | L2 | B6 | Comp 201 | A9 | L2 | B6 |
| Comp 202 | A10 | L2 | B6 | Comp 203 | A11 | L2 | B6 | Comp 204 | A12 | L2 | B6 |
| Comp 205 | A1 | L3 | B6 | Comp 206 | A2 | L3 | B6 | Comp 207 | A3 | L3 | B6 |
| Comp 208 | A4 | L3 | B6 | Comp 209 | A5 | L3 | B6 | Comp 210 | A6 | L3 | B6 |
| Comp 211 | A7 | L3 | B6 | Comp 212 | A8 | L3 | B6 | Comp 213 | A9 | L3 | B6 |
| Comp 214 | A10 | L3 | B6 | Comp 215 | A11 | L3 | B6 | Comp 216 | A12 | L3 | B6 |
| Comp 217 | A1 | L1 | B7 | Comp 218 | A2 | L1 | B7 | Comp 219 | A3 | L1 | B7 |
| Comp 220 | A4 | L1 | B7 | Comp 221 | A5 | L1 | B7 | Comp 222 | A6 | L1 | B7 |
| Comp 223 | A7 | L1 | B7 | Comp 224 | A8 | L1 | B7 | Comp 225 | A9 | L1 | B7 |
| Comp 226 | A10 | L1 | B7 | Comp 227 | A11 | L1 | B7 | Comp 228 | A12 | L1 | B7 |
| Comp 229 | A1 | L2 | B7 | Comp 230 | A2 | L2 | B7 | Comp 231 | A3 | L2 | B7 |
| Comp 232 | A4 | L2 | B7 | Comp 233 | A5 | L2 | B7 | Comp 234 | A6 | L2 | B7 |
| Comp 235 | A7 | L2 | B7 | Comp 236 | A8 | L2 | B7 | Comp 237 | A9 | L2 | B7 |
| Comp 238 | A10 | L2 | B7 | Comp 239 | A11 | L2 | B7 | Comp 240 | A12 | L2 | B7 |
| Comp 241 | A1 | L3 | B7 | Comp 242 | A2 | L3 | B7 | Comp 243 | A3 | L3 | B7 |
| Comp 244 | A4 | L3 | B7 | Comp 245 | A5 | L3 | B7 | Comp 246 | A6 | L3 | B7 |
| Comp 247 | A7 | L3 | B7 | Comp 248 | A8 | L3 | B7 | Comp 249 | A9 | L3 | B7 |
| Comp 250 | A10 | L3 | B7 | Comp 251 | A11 | L3 | B7 | Comp 252 | A12 | L3 | B7 |
| Comp 253 | A1 | L1 | B8 | Comp 254 | A2 | L1 | B8 | Comp 255 | A3 | L1 | B8 |
| Comp 256 | A4 | L1 | B8 | Comp 257 | A5 | L1 | B8 | Comp 258 | A6 | L1 | B8 |
| Comp 259 | A7 | L1 | B8 | Comp 260 | A8 | L1 | B8 | Comp 261 | A9 | L1 | B8 |
| Comp 262 | A10 | L1 | B8 | Comp 263 | A11 | L1 | B8 | Comp 264 | A12 | L1 | B8 |
| Comp 265 | A1 | L2 | B8 | Comp 266 | A2 | L2 | B8 | Comp 267 | A3 | L2 | B8 |
| Comp 268 | A4 | L2 | B8 | Comp 269 | A5 | L2 | B8 | Comp 270 | A6 | L2 | B8 |
| Comp 271 | A7 | L2 | B8 | Comp 272 | A8 | L2 | B8 | Comp 273 | A9 | L2 | B8 |
| Comp 274 | A10 | L2 | B8 | Comp 275 | A11 | L2 | B8 | Comp 276 | A12 | L2 | B8 |
| Comp 277 | A1 | L3 | B8 | Comp 278 | A2 | L3 | B8 | Comp 279 | A3 | L3 | B8 |
| Comp 280 | A4 | L3 | B8 | Comp 281 | A5 | L3 | B8 | Comp 282 | A6 | L3 | B8 |
| Comp 283 | A7 | L3 | B8 | Comp 284 | A8 | L3 | B8 | Comp 285 | A9 | L3 | B8 |
| Comp 286 | A10 | L3 | B8 | Comp 287 | A11 | L3 | B8 | Comp 288 | A12 | L3 | B8 |
| Comp 289 | A1 | L1 | B9 | Comp 290 | A2 | L1 | B9 | Comp 291 | A3 | L1 | B9 |

-continued

| ID | A | L | B | ID | A | L | B | ID | A | L | B |
|---|---|---|---|---|---|---|---|---|---|---|---|
| Comp 292 | A4 | L1 | B9 | Comp 293 | A5 | L1 | B9 | Comp 294 | A6 | L1 | B9 |
| Comp 295 | A7 | L1 | B9 | Comp 296 | A8 | L1 | B9 | Comp 297 | A9 | L1 | B9 |
| Comp 298 | A10 | L1 | B9 | Comp 299 | A11 | L1 | B9 | Comp 300 | A12 | L1 | B9 |
| Comp 301 | A1 | L2 | B9 | Comp 302 | A2 | L2 | B9 | Comp 303 | A3 | L2 | B9 |
| Comp 304 | A4 | L2 | B9 | Comp 305 | A5 | L2 | B9 | Comp 306 | A6 | L2 | B9 |
| Comp 307 | A7 | L2 | B9 | Comp 308 | A8 | L2 | B9 | Comp 309 | A9 | L2 | B9 |
| Comp 310 | A10 | L2 | B9 | Comp 311 | A11 | L2 | B9 | Comp 312 | A12 | L2 | B9 |
| Comp 313 | A1 | L3 | B9 | Comp 314 | A2 | L3 | B9 | Comp 315 | A3 | L3 | B9 |
| Comp 316 | A4 | L3 | B9 | Comp 317 | A5 | L3 | B9 | Comp 318 | A6 | L3 | B9 |
| Comp 319 | A7 | L3 | B9 | Comp 320 | A8 | L3 | B9 | Comp 321 | A9 | L3 | B9 |
| Comp 322 | A10 | L3 | B9 | Comp 323 | A11 | L3 | B9 | Comp 324 | A12 | L3 | B9 |
| Comp 325 | A1 | L1 | B10 | Comp 326 | A2 | L1 | B10 | Comp 327 | A3 | L1 | B10 |
| Comp 328 | A4 | L1 | B10 | Comp 329 | A5 | L1 | B10 | Comp 330 | A6 | L1 | B10 |
| Comp 331 | A7 | L1 | B10 | Comp 332 | A8 | L1 | B10 | Comp 333 | A9 | L1 | B10 |
| Comp 334 | A10 | L1 | B10 | Comp 335 | A11 | L1 | B10 | Comp 336 | A12 | L1 | B10 |
| Comp 337 | A1 | L2 | B10 | Comp 338 | A2 | L2 | B10 | Comp 339 | A3 | L2 | B10 |
| Comp 340 | A4 | L2 | B10 | Comp 341 | A5 | L2 | B10 | Comp 342 | A6 | L2 | B10 |
| Comp 343 | A7 | L2 | B10 | Comp 344 | A8 | L2 | B10 | Comp 345 | A9 | L2 | B10 |
| Comp 346 | A10 | L2 | B10 | Comp 347 | A11 | L2 | B10 | Comp 348 | A12 | L2 | B10 |
| Comp 349 | A1 | L3 | B10 | Comp 350 | A2 | L3 | B10 | Comp 351 | A3 | L3 | B10 |
| Comp 352 | A4 | L3 | B10 | Comp 353 | A5 | L3 | B10 | Comp 354 | A6 | L3 | B10 |
| Comp 355 | A7 | L3 | B10 | Comp 356 | A8 | L3 | B10 | Comp 357 | A9 | L3 | B10 |
| Comp 358 | A10 | L3 | B10 | Comp 359 | A11 | L3 | B10 | Comp 360 | A12 | L3 | B10 |
| Comp 361 | A1 | L1 | B11 | Comp 362 | A2 | L1 | B11 | Comp 363 | A3 | L1 | B11 |
| Comp 364 | A4 | L1 | B11 | Comp 365 | A5 | L1 | B11 | Comp 366 | A6 | L1 | B11 |
| Comp 367 | A7 | L1 | B11 | Comp 368 | A8 | L1 | B11 | Comp 369 | A9 | L1 | B11 |
| Comp 370 | A10 | L1 | B11 | Comp 371 | A11 | L1 | B11 | Comp 372 | A12 | L1 | B11 |
| Comp 373 | A1 | L2 | B11 | Comp 374 | A2 | L2 | B11 | Comp 375 | A3 | L2 | B11 |
| Comp 376 | A4 | L2 | B11 | Comp 377 | A5 | L2 | B11 | Comp 378 | A6 | L2 | B11 |
| Comp 379 | A7 | L2 | B11 | Comp 380 | A8 | L2 | B11 | Comp 381 | A9 | L2 | B11 |
| Comp 382 | A10 | L2 | B11 | Comp 383 | A11 | L2 | B11 | Comp 384 | A12 | L2 | B11 |
| Comp 385 | A1 | L3 | B11 | Comp 386 | A2 | L3 | B11 | Comp 387 | A3 | L3 | B11 |
| Comp 388 | A4 | L3 | B11 | Comp 389 | A5 | L3 | B11 | Comp 390 | A6 | L3 | B11 |
| Comp 391 | A7 | L3 | B11 | Comp 392 | A8 | L3 | B11 | Comp 393 | A9 | L3 | B11 |
| Comp 394 | A10 | L3 | B11 | Comp 395 | A11 | L3 | B11 | Comp 396 | A12 | L3 | B11 |
| Comp 397 | A1 | L1 | B12 | Comp 398 | A2 | L1 | B12 | Comp 399 | A3 | L1 | B12 |
| Comp 400 | A4 | L1 | B12 | Comp 401 | A5 | L1 | B12 | Comp 402 | A6 | L1 | B12 |
| Comp 403 | A7 | L1 | B12 | Comp 404 | A8 | L1 | B12 | Comp 405 | A9 | L1 | B12 |
| Comp 406 | A10 | L1 | B12 | Comp 407 | A11 | L1 | B12 | Comp 408 | A12 | L1 | B12 |
| Comp 409 | A1 | L2 | B12 | Comp 410 | A2 | L2 | B12 | Comp 411 | A3 | L2 | B12 |
| Comp 412 | A4 | L2 | B12 | Comp 413 | A5 | L2 | B12 | Comp 414 | A6 | L2 | B12 |
| Comp 415 | A7 | L2 | B12 | Comp 416 | A8 | L2 | B12 | Comp 417 | A9 | L2 | B12 |
| Comp 418 | A10 | L2 | B12 | Comp 419 | A11 | L2 | B12 | Comp 420 | A12 | L2 | B12 |
| Comp 421 | A1 | L3 | B12 | Comp 422 | A2 | L3 | B12 | Comp 423 | A3 | L3 | B12 |
| Comp 424 | A4 | L3 | B12 | Comp 425 | A5 | L3 | B12 | Comp 426 | A6 | L3 | B12 |
| Comp 427 | A7 | L3 | B12 | Comp 428 | A8 | L3 | B12 | Comp 429 | A9 | L3 | B12 |
| Comp 430 | A10 | L3 | B12 | Comp 431 | A11 | L3 | B12 | Comp 432 | A12 | L3 | B12 |
| Comp 433 | A1 | L1 | B13 | Comp 434 | A2 | L1 | B13 | Comp 435 | A3 | L1 | B13 |
| Comp 436 | A4 | L1 | B13 | Comp 437 | A5 | L1 | B13 | Comp 438 | A6 | L1 | B13 |
| Comp 439 | A7 | L1 | B13 | Comp 440 | A8 | L1 | B13 | Comp 441 | A9 | L1 | B13 |
| Comp 442 | A10 | L1 | B13 | Comp 443 | A11 | L1 | B13 | Comp 444 | A12 | L1 | B13 |
| Comp 445 | A1 | L2 | B13 | Comp 446 | A2 | L2 | B13 | Comp 447 | A3 | L2 | B13 |
| Comp 448 | A4 | L2 | B13 | Comp 449 | A5 | L2 | B13 | Comp 450 | A6 | L2 | B13 |
| Comp 451 | A7 | L2 | B13 | Comp 452 | A8 | L2 | B13 | Comp 453 | A9 | L2 | B13 |
| Comp 454 | A10 | L2 | B13 | Comp 455 | A11 | L2 | B13 | Comp 456 | A12 | L2 | B13 |
| Comp 457 | A1 | L3 | B13 | Comp 458 | A2 | L3 | B13 | Comp 459 | A3 | L3 | B13 |
| Comp 460 | A4 | L3 | B13 | Comp 461 | A5 | L3 | B13 | Comp 462 | A6 | L3 | B13 |
| Comp 463 | A7 | L3 | B13 | Comp 464 | A8 | L3 | B13 | Comp 465 | A9 | L3 | B13 |
| Comp 466 | A10 | L3 | B13 | Comp 467 | A11 | L3 | B13 | Comp 468 | A12 | L3 | B13 |
| Comp 469 | A1 | L1 | B14 | Comp 470 | A2 | L1 | B14 | Comp 471 | A3 | L1 | B14 |
| Comp 472 | A4 | L1 | B14 | Comp 473 | A5 | L1 | B14 | Comp 474 | A6 | L1 | B14 |
| Comp 475 | A7 | L1 | B14 | Comp 476 | A8 | L1 | B14 | Comp 477 | A9 | L1 | B14 |
| Comp 478 | A10 | L1 | B14 | Comp 479 | A11 | L1 | B14 | Comp 480 | A12 | L1 | B14 |
| Comp 481 | A1 | L2 | B14 | Comp 482 | A2 | L2 | B14 | Comp 483 | A3 | L2 | B14 |
| Comp 484 | A4 | L2 | B14 | Comp 485 | A5 | L2 | B14 | Comp 486 | A6 | L2 | B14 |
| Comp 487 | A7 | L2 | B14 | Comp 488 | A8 | L2 | B14 | Comp 489 | A9 | L2 | B14 |
| Comp 490 | A10 | L2 | B14 | Comp 491 | A11 | L2 | B14 | Comp 492 | A12 | L2 | B14 |
| Comp 493 | A1 | L3 | B14 | Comp 494 | A2 | L3 | B14 | Comp 495 | A3 | L3 | B14 |
| Comp 496 | A4 | L3 | B14 | Comp 497 | A5 | L3 | B14 | Comp 498 | A6 | L3 | B14 |
| Comp 499 | A7 | L3 | B14 | Comp 500 | A8 | L3 | B14 | Comp 501 | A9 | L3 | B14 |
| Comp 502 | A10 | L3 | B14 | Comp 503 | A11 | L3 | B14 | Comp 504 | A12 | L3 | B14 |
| Comp 505 | A1 | L1 | B15 | Comp 506 | A2 | L1 | B15 | Comp 507 | A3 | L1 | B15 |
| Comp 508 | A4 | L1 | B15 | Comp 509 | A5 | L1 | B15 | Comp 510 | A6 | L1 | B15 |

-continued

| ID | A | L | B | ID | A | L | B | ID | A | L | B |
|---|---|---|---|---|---|---|---|---|---|---|---|
| Comp 511 | A7 | L1 | B15 | Comp 512 | A8 | L1 | B15 | Comp 513 | A9 | L1 | B15 |
| Comp 514 | A10 | L1 | B15 | Comp 515 | A11 | L1 | B15 | Comp 516 | A12 | L1 | B15 |
| Comp 517 | A1 | L2 | B15 | Comp 518 | A2 | L2 | B15 | Comp 519 | A3 | L2 | B15 |
| Comp 520 | A4 | L2 | B15 | Comp 521 | A5 | L2 | B15 | Comp 522 | A6 | L2 | B15 |
| Comp 523 | A7 | L2 | B15 | Comp 524 | A8 | L2 | B15 | Comp 525 | A9 | L2 | B15 |
| Comp 526 | A10 | L2 | B15 | Comp 527 | A11 | L2 | B15 | Comp 528 | A12 | L2 | B15 |
| Comp 529 | A1 | L3 | B15 | Comp 530 | A2 | L3 | B15 | Comp 531 | A3 | L3 | B15 |
| Comp 532 | A4 | L3 | B15 | Comp 533 | A5 | L3 | B15 | Comp 534 | A6 | L3 | B15 |
| Comp 535 | A7 | L3 | B15 | Comp 536 | A8 | L3 | B15 | Comp 537 | A9 | L3 | B15 |
| Comp 538 | A10 | L3 | B15 | Comp 539 | A11 | L3 | B15 | Comp 540 | A12 | L3 | B15 |
| Comp 541 | A1 | L1 | B16 | Comp 542 | A2 | L1 | B16 | Comp 543 | A3 | L1 | B16 |
| Comp 544 | A4 | L1 | B16 | Comp 545 | A5 | L1 | B16 | Comp 546 | A6 | L1 | B16 |
| Comp 547 | A7 | L1 | B16 | Comp 548 | A8 | L1 | B16 | Comp 549 | A9 | L1 | B16 |
| Comp 550 | A10 | L1 | B16 | Comp 551 | A11 | L1 | B16 | Comp 552 | A12 | L1 | B16 |
| Comp 553 | A1 | L2 | B16 | Comp 554 | A2 | L2 | B16 | Comp 555 | A3 | L2 | B16 |
| Comp 556 | A4 | L2 | B16 | Comp 557 | A5 | L2 | B16 | Comp 558 | A6 | L2 | B16 |
| Comp 559 | A7 | L2 | B16 | Comp 560 | A8 | L2 | B16 | Comp 561 | A9 | L2 | B16 |
| Comp 562 | A10 | L2 | B16 | Comp 563 | A11 | L2 | B16 | Comp 564 | A12 | L2 | B16 |
| Comp 565 | A1 | L3 | B16 | Comp 566 | A2 | L3 | B16 | Comp 567 | A3 | L3 | B16 |
| Comp 568 | A4 | L3 | B16 | Comp 569 | A5 | L3 | B16 | Comp 570 | A6 | L3 | B16 |
| Comp 571 | A7 | L3 | B16 | Comp 572 | A8 | L3 | B16 | Comp 573 | A9 | L3 | B16 |
| Comp 574 | A10 | L3 | B16 | Comp 575 | A11 | L3 | B16 | Comp 576 | A12 | L3 | B16 |
| Comp 577 | A10 | L1 | B17 | Comp 578 | A11 | L1 | B17 | Comp 579 | A12 | L1 | B17 |
| Comp 580 | A10 | L2 | B17 | Comp 581 | A11 | L2 | B17 | Comp 582 | A12 | L2 | B17 |
| Comp 583 | A10 | L3 | B17 | Comp 584 | A11 | L3 | B17 | Comp 585 | A12 | L3 | B17 |
| Comp 586 | A10 | L1 | B18 | Comp 587 | A11 | L1 | B18 | Comp 588 | A12 | L1 | B18 |
| Comp 589 | A10 | L2 | B18 | Comp 590 | A11 | L2 | B18 | Comp 591 | A12 | L2 | B18 |
| Comp 592 | A10 | L3 | B18 | Comp 593 | A11 | L3 | B18 | Comp 594 | A12 | L3 | B18 |
| Comp 595 | A10 | L1 | B19 | Comp 596 | A11 | L1 | B19 | Comp 597 | A12 | L1 | B19 |
| Comp 598 | A10 | L2 | B19 | Comp 599 | A11 | L2 | B19 | Comp 600 | A12 | L2 | B19 |
| Comp 601 | A10 | L3 | B19 | Comp 602 | A11 | L3 | B19 | Comp 603 | A12 | L3 | B19 |
| Comp 604 | A10 | L1 | B20 | Comp 605 | A11 | L1 | B20 | Comp 606 | A12 | L1 | B20 |
| Comp 607 | A10 | L2 | B20 | Comp 608 | A11 | L2 | B20 | Comp 609 | A12 | L2 | B20 |
| Comp 610 | A10 | L3 | B20 | Comp 611 | A11 | L3 | B20 | Comp 612 | A12 | L3 | B20 |
| Comp 613 | A10 | L1 | B21 | Comp 614 | A11 | L1 | B21 | Comp 615 | A12 | L1 | B21 |
| Comp 616 | A10 | L2 | B21 | Comp 617 | A11 | L2 | B21 | Comp 618 | A12 | L2 | B21 |
| Comp 619 | A10 | L3 | B21 | Comp 620 | A11 | L3 | B21 | Comp 621 | A12 | L3 | B21 |
| Comp 622 | A10 | L1 | B22 | Comp 623 | A11 | L1 | B22 | Comp 624 | A12 | L1 | B22 |
| Comp 625 | A10 | L2 | B22 | Comp 626 | A11 | L2 | B22 | Comp 627 | A12 | L2 | B22 |
| Comp 628 | A10 | L3 | B22 | Comp 629 | A11 | L3 | B22 | Comp 630 | A12 | L3 | B22 |
| Comp 631 | A10 | L1 | B23 | Comp 632 | A11 | L1 | B23 | Comp 633 | A12 | L1 | B23 |
| Comp 634 | A10 | L2 | B23 | Comp 635 | A11 | L2 | B23 | Comp 636 | A12 | L2 | B23 |
| Comp 637 | A10 | L3 | B23 | Comp 638 | A11 | L3 | B23 and | Comp 639 | A12 | L3 | B23. |

16. The compound of claim 15, wherein the compound is selected from the group consisting of:

| ID | Structure | ID | Structure | ID | Structure |
|---|---|---|---|---|---|
|  |  | Comp 2 | A2-L1-B1 | Comp 4 | A4-L1-B1 |
|  |  | Comp 14 | A2-L2-B1 | Comp 16 | A4-L2-B1 |
| Comp 181 | A1-L1-B6 | Comp 182 | A2-L1-B6 | Comp 184 | A4-L1-B6 |
| Comp 193 | A1-L2-B6 | Comp 194 | A2-L2-B6 | Comp 196 | A4-L2-B6 |
| Comp 217 | A1-L1-B7 | Comp 218 | A2-L1-B7 | Comp 220 | A4-L1-B7 |
| Comp 229 | A1-L2-B7 | Comp 230 | A2-L2-B7 | Comp 232 | A4-L2-B7 |
| Comp 253 | A1-L1-B8 | Comp 254 | A2-L1-B8 | Comp 256 | A4-L1-B8 |
| Comp 265 | A1-L2-B8 | Comp 266 | A2-L2-B8 | Comp 268 | A4-L2-B8 |
| Comp 541 | A1-L1-B16 | Comp 542 | A2-L1-B16 | Comp 544 | A4-L1-B16 |
| Comp 553 | A1-L2-B16 | Comp 554 | A2-L2-B16 and | Comp 556 | A4-L2-B16. |

17. A device comprising:
an anode;
a cathode; and
an organic layer, disposed between the anode and the cathode, comprising a compound having the formula:

A-L-B  (I);

wherein A is

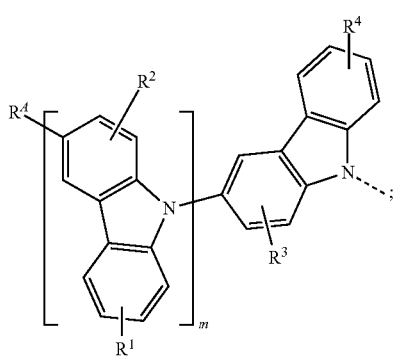
(II)

wherein B is selected from the group consisting of

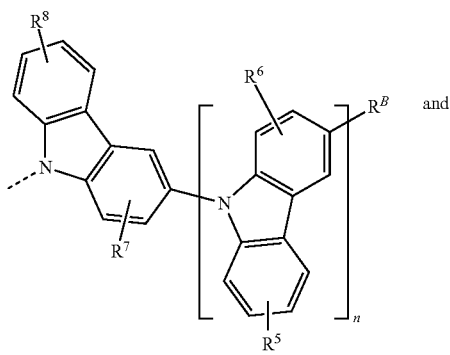
(III)
and

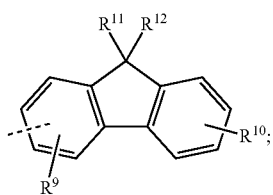
(IV)

wherein L is a phenyl, which is optionally substituted with 1, 2, 3, or 4 deuterium;

wherein $R^1$, $R^4$, $R^5$, $R^8$, and $R^{10}$ each independently represent mono, di, tri, tetra substitutions, or no substitution;

wherein $R^2$, $R^3$, $R^6$, $R^7$, and $R^9$ each independently represent mono, di, tri substitutions, or no substitution;

wherein $R^1$, $R^2$, $R^3$, $R^4$, $R^5$, $R^6$, $R^7$, and $R^8$ are each independently selected from the group consisting of hydrogen, deuterium, alkyl, cycloalkyl, silyl, aryl, and combinations thereof;

wherein $R^9$, $R^{10}$, $R^{11}$, and $R^{12}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein $R^A$ and $R^B$ are each independently selected from the group consisting of hydrogen, deuterium, aryl, and combinations thereof;

wherein $R^{11}$ and $R^{12}$ are optionally joined to form a ring;

wherein m is an integer selected from 1 to 10;

wherein n is an integer selected from 0 to 9; and wherein if B is formula (III), then m is an integer selected from 2 to 10, and m is greater than n; or m is 1, n is 0, and at least one of $R^A$, $R^1$, $R^2$, $R^3$, and $R^4$ is phenyl.

18. A formulation comprising the compound of claim 1.

UNITED STATES PATENT AND TRADEMARK OFFICE
CERTIFICATE OF CORRECTION

PATENT NO. : 9,455,412 B2  
APPLICATION NO. : 14/138948  
DATED : September 27, 2016  
INVENTOR(S) : Lichang Zeng et al.

Page 1 of 1

It is certified that error appears in the above-identified patent and that said Letters Patent is hereby corrected as shown below:

In the Specification  
In Column 1, Line 48, please delete "fall" and insert -- full --  
In Column 13, Line 64, please delete "(IL)" and insert -- (III) --

Signed and Sealed this  
Ninth Day of May, 2017

Michelle K. Lee  
*Director of the United States Patent and Trademark Office*